(12) United States Patent
Moriwaki

(10) Patent No.: US 9,461,265 B2
(45) Date of Patent: Oct. 4, 2016

(54) DISPLAY DEVICE SUBSTRATE, DISPLAY DEVICE SUBSTRATE MANUFACTURING METHOD, DISPLAY DEVICE, LIQUID CRYSTAL DISPLAY DEVICE, LIQUID CRYSTAL DISPLAY DEVICE MANUFACTURING METHOD AND ORGANIC ELECTROLUMINESCENT DISPLAY DEVICE

(71) Applicant: SHARP KABUSHIKI KAISHA, Osaka (JP)

(72) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/716,907

(22) Filed: May 20, 2015

(65) Prior Publication Data

US 2015/0340418 A1    Nov. 26, 2015

Related U.S. Application Data

(63) Continuation of application No. 14/100,220, filed on Dec. 9, 2013, now Pat. No. 9,041,888, which is a continuation of application No. 13/120,835, filed as application No. PCT/JP2009/060709 on Jun. 11, 2009, now Pat. No. 8,629,960.

(30) Foreign Application Priority Data

Oct. 2, 2008 (JP) ................................ 2008-257681

(51) Int. Cl.
*G02F 1/1333* (2006.01)
*H01L 51/52* (2006.01)
(Continued)

(52) U.S. Cl.
CPC ..... *H01L 51/5203* (2013.01); *G02F 1/133345* (2013.01); *G02F 1/136227* (2013.01);
(Continued)

(58) Field of Classification Search
CPC ................. G02F 1/133345; G02F 1/136227
USPC .................................................. 349/138, 122
See application file for complete search history.

(56) References Cited

U.S. PATENT DOCUMENTS 5,362,597 A   11/1994  Sano
5,585,951 A   12/1996  Noda et al.
(Continued)

FOREIGN PATENT DOCUMENTS

JP    5-165214      7/1993
JP    2001-318622   11/2001
(Continued)

OTHER PUBLICATIONS

U.S. Appl. No. 14/100,220, filed Dec. 9, 2013; Moriwaki.
(Continued)

*Primary Examiner* — Lucy Chien
(74) *Attorney, Agent, or Firm* — Nixon & Vanderhye P.C.

(57) ABSTRACT

The present invention provides a display device substrate, a display device substrate manufacturing method, a display device, a liquid crystal display device, a liquid crystal display device manufacturing method and an organic electroluminescent display device that allow suppressing faults derived from occurrence of gas and/or bubbles in a pixel region. The present invention is a display device substrate that comprises: a photosensitive resin film; and a pixel electrode, in this order, from a side of an insulating substrate. The display device substrate has a gas-barrier insulating film, at a layer higher than the photosensitive resin film, for preventing advance of a gas generated from the photosensitive resin film, or has a gas-barrier insulating film, between the photosensitive resin film and the pixel electrode, for preventing advance of gas generated from the photosensitive resin film.

20 Claims, 33 Drawing Sheets

(51) Int. Cl.
*H01L 51/50* (2006.01)
*H01L 27/32* (2006.01)
*G02F 1/1362* (2006.01)

(52) U.S. Cl.
CPC ....... *H01L27/3246* (2013.01); *H01L 27/3258* (2013.01); *H01L 27/3276* (2013.01); *H01L 51/5012* (2013.01); *H01L 51/5206* (2013.01); *H01L 51/5246* (2013.01); *G02F 2201/50* (2013.01); *H01L 51/524* (2013.01); *H01L 51/5237* (2013.01); *H01L 51/5256* (2013.01); *H01L 2251/301* (2013.01)

(56) References Cited

U.S. PATENT DOCUMENTS

| | | | |
|---|---|---|---|
| 8,629,960 | B2 | 1/2014 | Moriwaki |
| 2001/0005607 | A1 | 6/2001 | Hasegawa |
| 2001/0022643 | A1 | 9/2001 | Kim et al. |
| 2001/0033347 | A1 | 10/2001 | Kitahora et al. |
| 2002/0036462 | A1 | 3/2002 | Hirano |
| 2003/0043336 | A1 | 3/2003 | Hanaoka |
| 2003/0189210 | A1 | 10/2003 | Yamazaki et al. |
| 2004/0031962 | A1 | 2/2004 | Hasegawa |
| 2004/0232418 | A1 | 11/2004 | Koyama |
| 2005/0146670 | A1 | 7/2005 | Helgee et al. |
| 2006/0244881 | A1 | 11/2006 | Hanaoka |
| 2008/0036367 | A1 | 2/2008 | Eida et al. |
| 2008/0061300 | A1 | 3/2008 | Chaug et al. |
| 2008/0197348 | A1 | 8/2008 | Matsubara et al. |
| 2010/0035504 | A1 | 2/2010 | Sasaki |

FOREIGN PATENT DOCUMENTS

| | | |
|---|---|---|
| JP | 2001-356711 | 12/2001 |
| JP | 2003-149647 | 5/2003 |
| JP | 2004-327262 | 11/2004 |
| JP | 2004-347822 | 12/2004 |
| JP | 2005-158292 | 6/2005 |
| JP | 2005-173106 | 6/2005 |

OTHER PUBLICATIONS

U.S. Appl. No. 13/120,835, filed Mar. 24, 2011; Moriwaki.
International Search Report for PCT/JP2009/060709, mailed Jul. 21, 2009.

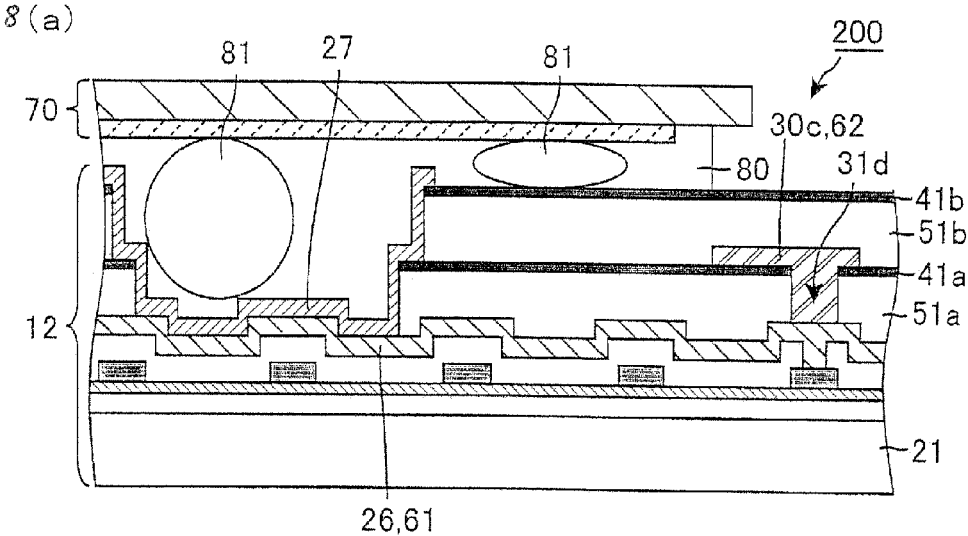
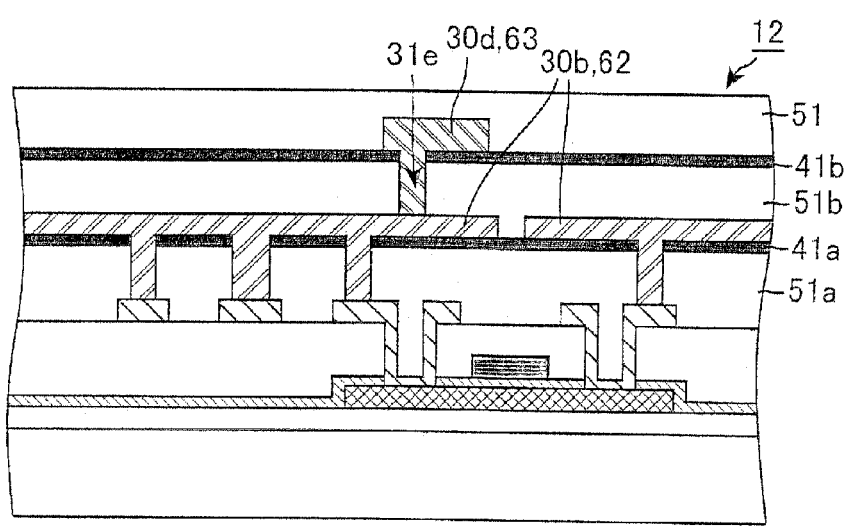

DISPLAY DEVICE SUBSTRATE, DISPLAY DEVICE SUBSTRATE MANUFACTURING METHOD, DISPLAY DEVICE, LIQUID CRYSTAL DISPLAY DEVICE, LIQUID CRYSTAL DISPLAY DEVICE MANUFACTURING METHOD AND ORGANIC ELECTROLUMINESCENT DISPLAY DEVICE

This application is a continuation of U.S. patent application Ser. No. 14/100,220 filed Dec. 9, 2013, which is a continuation of U.S. patent application Ser. No. 13/120,835 filed Mar. 24, 2011 (now U.S. Pat. No. 8,629,960), which is the U.S. national phase of International Application No. PCT/JP2009/060709, filed 11 Jun. 2009, which designated the U.S. and claims priority to Japanese Patent Application No. 2008-257681, filed 2 Oct. 2008, the entire contents of all of which are hereby all incorporated herein by reference.

TECHNICAL FIELD

The present invention relates to a display device substrate, a display device substrate manufacturing method, a display device, a liquid crystal display device, a liquid crystal display device manufacturing method and an organic electroluminescent display device. More specifically, the present invention relates to a display device substrate, a display device substrate manufacturing method, a display device, a liquid crystal display device, a liquid crystal display device manufacturing method and an organic electroluminescent display device that are suitable for a liquid crystal display device or an organic EL display wherein a photosensitive resin film is provided on a substrate.

BACKGROUND ART

Multi-domain vertical alignment (MVA) is a known mode among display modes in liquid crystal display devices. In MVA mode liquid crystal display devices, there is used a liquid crystal having negative dielectric constant anisotropy, sealed between a pair of substrates, a vertical alignment layer that causes liquid crystal molecules to be aligned substantially orthogonally with respect to the surface of the substrates, and an alignment regulating structure that regulates the alignment direction of the liquid crystal molecules. Examples of the alignment regulating structure include, for instance, linear protrusions comprising a dielectric, and electrode cutouts (slits). A wider viewing angle can be obtained in such MVA mode liquid crystal display devices by providing, in one pixel, a plurality of regions (domains) in which the liquid crystal molecules have mutually dissimilar alignment directions, by way of such an alignment regulating structure.

However, in MVA mode liquid crystal display devices, a drop in light transmittance during white display tends to be generated at the boundaries between domains, for instance at regions where linear protrusions or slits are provided in the pixels. The liquid crystal response time drops in a case where the arrangement spacing between alignment regulating structures is widened in order to suppress the above occurrence. Therefore, alignment films may be subjected to aligning treatments for imparting initial alignment to the liquid crystal, in terms of conferring fast response to the liquid crystal while curtailing a drop in light transmittance during white display. MVA mode liquid crystal display devices, however, are provided with an alignment regulating structure, and hence an aligning treatment by rubbing is ordinarily not carried out.

In this context, known effective technologies for achieving MVA mode liquid crystal display devices include polymer-sustained alignment (PSA). PSA is a method wherein a polymerizable component such as a monomer or oligomer is mixed into the liquid crystal, and the polymerizable component is polymerized in a state where the liquid crystal molecules are obliquely aligned through application of a voltage to the liquid crystal, as a result of which a polymer having a memory of the direction in which the liquid crystal falls becomes provided on a substrate (for instance, Patent document 1).

In organic EL displays, thus far, canister-sealed structures have been ordinarily employed wherein a drying agent is affixed to a carved glass, and the outer side of the outer periphery of an organic EL element is sealed, in a frame-like manner, by way of a sealing resin, in order to prevent deterioration of the organic EL element caused by external oxygen or moisture. Such a canister-sealed structure, however, makes it difficult to adopt top-emission structure in which light is extracted from the top face of the panel (increase in aperture ratio), and to realize thin-profile panels. Therefore, sealing structures that employ flat substrates (hereafter, flat sealing structures) have been developed in recent years. Specifically, technologies have been developed in which an organic EL element is sealed by affixing a flat substrate onto the organic EL element, by way of an adhesive that comprises a photosensitive resin.

In conventional display device substrates, in particular in TFT (thin film transistor) array substrates (hereafter also referred to as TFT substrates), a photosensitive resin film having a planarizing effect is formed, as an interlayer insulating film, from the viewpoint of suppressing disconnection in wiring. As such interlayer insulating films there has been disclosed, for instance, a radiation-sensitive resin composition that comprises a radiation-sensitive acid-generating compound and a resin that is soluble in an alkaline aqueous solution and that contains, in one molecular chain, a carboxyl group or an anhydride and an epoxy group (for instance, Patent document 2).

Patent document 1: JP 2003-149647 A
Patent document 2: JP 5-165214 A

In conventional PSA mode liquid crystal display devices (liquid crystal display devices manufactured using PSA technologies), and in organic EL displays having flat-plate substrates, however, gas and/or bubbles may occur in a pixel region after a step of polymerizing a monomer dispersed at the pixel region through UV irradiation, or after a step of curing an adhesive comprising a photosensitive resin through UV irradiation, whereby a defective device could have been produced. FIG. 35 is a plan-view schematic diagram illustrating a conventional PSA mode liquid crystal display panel. In an impact test of a PSA mode liquid crystal display panel after an UV irradiation step, bubbles 139 could be jetted into a cell in a pixel region P, as illustrated in FIG. 35, on account of the impact. In the impact test, a pachinko ball was dropped onto a panel from a height of 30 cm, at high temperature (80° C.).

DISCLOSURE OF THE INVENTION

In the light of the above, it is an object of the present invention to provide a display device substrate, a display device substrate manufacturing method, a display device, a liquid crystal display device, a liquid crystal display device manufacturing method and an organic electroluminescent display device that allow suppressing faults derived from the occurrence of gas and/or bubbles in a pixel region.

The inventors conducted various studies on display device substrates that should allow suppressing faults derived from the formation of gas and/or bubbles in a pixel region, and came to focus on photosensitive resins that are used as planarizing films in TFT substrates. The inventors found that, conventionally, gas 138 is generated from a photosensitive resin film 152, as illustrated in FIG. 36, on account of UV irradiation (blanked arrows in FIG. 36), and that the gas 138 gives rise to bubbles in a liquid crystal layer 110, in particular when the panel is subjected to shocks, such as mechanical impacts, at high temperature. Conceivable causes for the above include the following. Firstly, the photosensitive resin film ordinarily comprises a naphthoquinone diazide photosensitizer for photosensitization, and an epoxy component. The foregoing are believed to release small amounts of nitrogen gas and water vapor resulting from hydrolysis, during a first exposure step, a second exposure step and a baking step in first exposure, development, second exposure and baking processes. As a result, small amounts of unreacted substances that remain in the photosensitive resin film are thought to react due to UV light and heat, giving rise to gases, upon UV irradiation in a process of polymerizing a monomer dispersion liquid crystal (liquid crystal material in which a polymerizable component is dispersed) or in a process of curing an adhesive comprising a photosensitive resin. Conceivable examples of such an occurrence may include, for instance, a process wherein nitrogen gas is generated through reaction between unreacted diazo groups of a radiation-sensitive acid-generating compound (compound having a property whereby the solubility of the compound in alkalis increases when the compound is subjected to radiation) used as a photosensitizer, and when a reaction acid product (acid generated through exposure to radiation) re-esterifies (hydrolyzes), and the resulting $H_2O$ becomes water vapor at high temperature. As a result, such gases may become injected into a liquid crystal layer or an organic layer due to stress derived from impacts or the like. Upon further study, the inventors found that providing a gas-barrier insulating film (insulating film that prevents advance of gas generated from a photosensitive resin film) at a layer higher than the photosensitive resin film, or between the photosensitive resin film and a pixel electrode, has the effect of preventing intrusion of gas into a liquid crystal layer or an organic layer, even if gas is generated from the photosensitive resin film upon UV irradiation in a process of polymerizing a monomer dispersion liquid crystal or in a process of curing an adhesive that comprises a photosensitive resin. The inventors arrived at the present invention upon conceiving that the above-described problems can be admirably solved on the basis of the above finding.

Specifically, the present invention is a display device substrate (hereafter also referred to as "first display device substrate of the present invention"), that comprises:
 a photosensitive resin film; and
 a pixel electrode, in this order, from a side of an insulating substrate,
 wherein the display device substrate has a gas-barrier insulating film at a layer higher than the photosensitive resin film for preventing advance of gas generated from the photosensitive resin film. Faults caused by generation of gas and/or formation of bubbles in a pixel region can be suppressed as a result in a display device provided with the first display device substrate of the present invention. Also, wiring connection faults can be suppressed thanks to the provided photosensitive resin film.

So long as the above essential constituent elements are formed therein, the configuration of the first display device substrate of the present invention is not particularly limited, and may optionally comprise other constituent elements.

The present invention is also a display device substrate (hereafter also referred to as "second display device substrate of the present invention") that comprises:
 a photosensitive resin film; and
 a pixel electrode, in this order, from a side of an insulating substrate,
 wherein the display device substrate has a gas-barrier insulating film between the photosensitive resin film and the pixel electrode for preventing advance of gas generated from the photosensitive resin film. Faults caused by generation of gas and/or formation of bubbles in a pixel region can be suppressed as a result in a display device provided with the second display device substrate of the present invention. Also, the gas-barrier insulating film is disposed at a layer lower than the pixel electrode. This suppresses a drop in the voltage that is applied to a liquid crystal layer or an emissive layer. Since the gas-barrier insulating film is disposed at a layer lower than the pixel electrode, a structure wherein the gas-barrier insulating film is sandwiched between the pixel electrode and a wiring layer at a layer lower than the pixel electrode can be used as a pixel storage capacitor. Also, wiring connection faults can be suppressed thanks to the provided photosensitive resin film.

As used in the present description, the term "higher", "top", and "upper" denote a position farther from the insulating substrate, and the terms "lower", "below", and "under" denote a position closer to the insulating substrate. Accordingly, "higher layer" denotes a layer farther from the insulating substrate, and "lower layer" denotes a layer closer to the insulating substrate.

So long as the above essential constituent elements are formed therein, the configuration of the second display device substrate of the present invention is not particularly limited, and may optionally comprise other constituent elements.

Preferred embodiments of the first and second display device substrates of the present invention are explained in detail further on. The various below-described embodiments can be suitable combined with each other.

A voltage drop may occur on account of the capacitive component of the gas-barrier insulating film if the gas-barrier insulating film is disposed at a layer higher than the pixel electrode. Accordingly, the gas-barrier insulating film may overlap an outer edge portion of the pixel electrode, and has an opening on the pixel electrode (region corresponding to the pixel electrode). A top face (face on the side of a higher layer) and side face of the photosensitive resin film may have a region not covered by the pixel electrode, and the region is selectively covered by the gas-barrier insulating film. The display device substrate may have the pixel electrode in plurality, the plurality of pixel electrodes are provided spaced apart with gaps between each other, and the gas-barrier insulating film is selectively provided in the gaps between the plurality of pixel electrodes. As a result, these allows suppressing the occurrence of gas and/or bubbles in the pixel region, while suppressing a voltage drop. The above features can be used both in the first and second display device substrates of the present invention, and particularly preferably in the first display device substrate of the present invention.

The gas-barrier insulating film may comprise a thermosetting resin film. The gas-barrier insulating film is cured as a result through a thermal reaction, and hence generation of gas on account of UV light can be effectively suppressed in a UV irradiation step subsequent to formation of the gas-barrier insulating film.

The gas-barrier insulating film may comprise an inorganic insulating film. As a result, generation of gas on account of UV light can be effectively suppressed in a UV irradiation step subsequent to formation of the gas-barrier insulating film.

The gas-barrier insulating film may comprise a silicon oxide film. This allows suppressing attenuation of light, particularly UV light, in the gas-barrier insulating film.

The display device substrate may have an organic-inorganic film stack in which the inorganic insulating film is stacked directly on the photosensitive resin film. The photosensitive resin film can be protected as a result by the inorganic insulating film, which has excellent mechanical strength. Therefore, arranging the organic-inorganic film stack at the terminal area allows suppressing detachment of, or damage to, the photosensitive resin film, even when rework is necessary in a process of connecting the display device substrate to another circuit board or element, for instance an FPC board. As a result, it becomes possible to suppress exposure of a wiring layer positioned at a layer lower than the photosensitive resin film, to prevent thereby corrosion of the wiring layer caused by moisture and the like. It becomes also possible to suppress occurrence of faulty contact between terminals and an external connection component, such as an FPC, caused by residues fallen out from the uncovered photosensitive resin film. That is, it becomes possible to enhance the reliability of the terminal area. The inorganic insulating film can be used as a stopper material for ashing of a resist mask. Therefore, the method used for forming contact holes in the organic-inorganic film stack can be a method comprising an ashing step, namely such as dry etching in which a resist mask isutilized, having high microfabrication precision. As a result, wiring positioned below the organic-inorganic film stack, particularly wiring such as routing wiring provided at the peripheral circuit region and that requires microfabrication, can be formed as fine lines with high precision. Also, the photosensitive resin film can be made less likely to be damaged by ashing. This allows suppressing the occurrence of connection faults between wiring lines disposed at layers higher and lower than the organic-inorganic film stack.

The photosensitive resin film may have an opening. Preferably, the opening of the photosensitive resin film is covered by wiring at a layer higher than the inorganic insulating film. That is, the display device substrate may have wiring provided at a layer higher than the inorganic insulating film, and the opening of the photosensitive resin film is preferably covered by the wiring (higher-layer wiring). As a result, the opening of the photosensitive resin film can be covered by the higher-layer wiring, and the region, in the photosensitive resin film, not covered by the higher-layer wiring can be covered by the inorganic insulating film. This allows the photosensitive resin film to be less likely to be damaged by ashing or dry etching, which in turn allows suppressing the occurrence of connection faults between wiring lines disposed at layers higher and lower than the organic-inorganic film stack.

At least part of a higher-layer side of a wall surface of the opening of the photosensitive resin film may be covered by the inorganic insulating film. As a result, the photosensitive resin film can be made less likely to be damaged by ashing or dry etching, even if the inorganic insulating film is patterned by wet etching. This allows suppressing the occurrence of connection faults between wiring lines disposed at layers higher and lower than the organic-inorganic film stack.

The inorganic insulating film may be provided so as to cover the entire photosensitive resin film, excluding at least a portion, on a lower-layer side, of the wall surface of the opening of the photosensitive resin film. Alternatively, an entirety of the wall surface of the opening of the photosensitive resin film may be covered by the inorganic insulating film. In the latter case, the inorganic insulating film can be etched by a method such as dry etching in which a resist mask is used, having high microfabrication precision. This allows wiring positioned at a lower layer than the organic-inorganic film stack to be microfabricated, while suppressing the occurrence of connection faults between wiring lines disposed at layers higher and lower than the organic-inorganic film stack.

The display device substrate may comprise at least one from among a terminal area at which a connection terminal for connection with an external connection component is provided, and a peripheral circuit region at which a peripheral circuit is provided. This enables microfabrication of wiring at the peripheral circuit region, and/or enhancement of the reliability of the display device.

The display device substrate may comprise the terminal area and the peripheral circuit region. Specifically, the display device substrate may comprise, on the insulating substrate, a terminal area at which there is provided a connection terminal for connection with an external connection component, and a peripheral circuit region at which a peripheral circuit is provided. This enables microfabrication of wiring at the peripheral circuit region, and enhancement of the reliability of the display device.

The external connection component is not particularly limited, so long as it is an element and/or a circuit board that can be connected to a display panel configured using the above-described display device substrate, and may be, for instance an FPC (flexible printed circuit) board, a TCP (tape carrier package), COG (chip on glass), a resistor element, a capacitor element, preferably an FPC board.

The display device substrate may have the organic-inorganic film stack at the terminal area. This allows enhancing the reliability of the display device.

The display device substrate may have the organic-inorganic film stack at the peripheral circuit region. This allows forming a peripheral circuit that is provided with a microfabricated wiring.

The display device substrate may have the organic-inorganic film stack in plurality. This allows wiring to be laid in multiple layers.

The display device substrate may have the organic-inorganic film stack in plurality at the terminal area. This enables forming a fine-line multilayer wiring at the terminal area.

Preferably, the plurality of organic-inorganic film stacks is stacked alternately with each other.

The display device substrate may have a plurality of wiring layers respectively provided in the plurality of organic-inorganic film stacks. The connection terminal may comprise a wiring layer from among the plurality of wiring layers, excluding the wiring layer positioned on a lowermost-layer side. Thus, the display device substrate may have the wiring layer in plurality, such that the plurality of organic-inorganic film stacks and the plurality of wiring layers are stacked alternately with each other, and the connection terminal may comprise a wiring layer from among the plurality of wiring layers, excluding a wiring layer positioned on a lowermost-layer side. As a result, this allows forming wiring below the connection terminal while securing the reliability of the display device. More specifically, the difference in the extent of deformation of conductive microparticles between a pad and a region other than the pad can be reduced, which allows suppressing occurrence of connection faults caused by nonuniform stress.

The connection terminal may comprise a wiring layer positioned on a uppermost-layer side, from among the plurality of wiring layers. As a result, this allows forming further wiring below the connection terminal, while securing the reliability of the display device.

The display device substrate may have a region at which the inorganic insulating film is stacked directly on the connection terminal, at the terminal area. Also, display device substrate may not be provided with the photosensitive resin film at the terminal area. The mechanical reliability of the display device can be particularly enhanced thereby.

More specifically, the terminal area is preferably a region at which there is disposed a conductive material (preferably, an anisotropic conductive material such as an ACF (anisotropic conductive film)) for connecting the display device substrate of the present invention and an external connection component (preferably, a circuit board). Thus, the inorganic insulating film may cover the photosensitive resin film in such a manner that the photosensitive resin film at least does not come into contact with the conductive material.

The display device substrate may have the plurality of organic-inorganic film stacks at the peripheral circuit region. This allows forming a peripheral circuit that is provided with fine-line multilayer wiring. Also, the inorganic insulating film may be provided, at the peripheral circuit region, so as to cover at least the face (top face) of the photosensitive resin film on a higher-layer side. The inorganic insulating film may be provided, at the peripheral circuit region, in such a way so as to cover the entire photosensitive resin film, excluding at least a portion, on a lower-layer side, of the wall surface of the opening of the photosensitive resin film, or may be provided, at the peripheral circuit region, so as to cover the entire photosensitive resin film, including the wall surface of the opening of the photosensitive resin film.

The present invention is also a display device substrate manufacturing method (hereafter, also referred to as the "first display device substrate manufacturing method of the present invention"), being a method for manufacturing the display device substrate of the present invention, the manufacturing method comprising: a photosensitive resin film etching step of etching the photosensitive resin film; an inorganic insulating film formation step of forming the inorganic insulating film after the photosensitive resin film etching step; and an inorganic insulating film etching step of etching the inorganic insulating film after the inorganic insulating film formation step. Wiring can be microfabricated as a result while suppressing occurrence of wiring connection faults.

The first display device substrate manufacturing method of the present invention is not particularly limited as regards other processes, so long as the method comprises the aforementioned steps.

Preferred embodiments of the first display device substrate manufacturing method of the present invention are explained in detail below. The various below-described embodiments can be suitable combined with each other.

In the inorganic insulating film etching step, the inorganic insulating film may be dry-etched by way of a first resist. This allows wiring to be microfabricated more reliably.

In the inorganic insulating film etching step, a region which overlaps a region at which the photosensitive resin film is etched away, may be etched away from the inorganic insulating film. This allows forming small contact holes.

The display device substrate manufacturing method may further comprise a photosensitive resin film exposure step of exposing to light the photosensitive resin film, by way of a first photomask before the photosensitive resin film etching step. This allows suppressing wiring connection faults yet more reliably. Thus, the photosensitive resin film is preferably exposed to light and etched (developed), i.e. is photo-etched.

The display device substrate manufacturing method may further comprise: a resist formation step of forming a second resist on the inorganic insulating film after the inorganic insulating film formation step; and a resist exposure step of exposing to light the second resist by way of the first photomask after the resist formation step. Accordingly, the same first photomask can be used in the photosensitive resin film exposure step and the resist exposure step. As a result, the number of required photomasks can be reduced by one in the manufacturing process, and manufacturing costs reduced accordingly. When using two photomasks, positional mismatch in the openings of the photosensitive resin film and the inorganic insulating film, which may arise owing to a difference in state between the two photomasks, is a concern. However, the above configuration allows suppressing occurrence of positional mismatch between the respective openings of the photosensitive resin film and the inorganic insulating film.

The present invention is also a display device substrate manufacturing method (hereafter, also referred to as the "second display device substrate manufacturing method of the present invention"), being a method for manufacturing the display device substrate of the present invention, the manufacturing method comprising: an inorganic insulating film etching step of etching the inorganic insulating film, by wet etching, using a third resist as a mask; a resist removal step of removing the third resist after the inorganic insulating film etching step; and a photosensitive resin film etching step of etching the photosensitive resin film using the inorganic insulating film as a mask after the resist removal step. Thus, the inorganic insulating film is etched by wet etching, and hence no ashing is required, so that the third resist can be stripped with a stripping solution. Therefore, this allows preventing damage caused by ashing to the uncovered wall surface of the photosensitive resin film in contact holes. Wiring connection faults can be suppressed as a result.

The second display device substrate manufacturing method of the present invention is not particularly limited as regards other processes, so long as the method comprises the aforementioned steps.

The present invention is also a display device (hereafter, also referred to as "first display device of the present invention") comprising the display device substrate of the present invention. Faults caused by bubbles in the pixel region can be suppressed as a result.

So long as the above essential constituent elements are formed therein, the configuration of the first display device of the present invention is not particularly limited, and may optionally comprise other constituent elements.

The present invention is also a liquid crystal display device comprising the display device substrate of the present invention. Faults caused by bubbles in the pixel region can be suppressed as a result.

So long as the above essential constituent elements are formed therein, the configuration of the liquid crystal display device of the present invention is not particularly limited, and may optionally comprise other constituent elements.

The liquid crystal display device may have a liquid crystal layer comprising a monomer dispersion-type liquid crystal. This allows effectively suppressing faults caused by bubbles in the pixel region, in a PSA mode liquid crystal display device. In similar terms, the liquid crystal display device may comprise a substrate facing the display device substrate of the present invention, and a liquid crystal layer sandwiched between the foregoing two substrates, such that a polymer that defines the pretilt angle of the liquid crystal molecules in the liquid crystal layer can be formed, on at least one of the two substrates (preferably, both substrates), on the side of the liquid crystal layer, by polymerizing a polymerizable component in the liquid crystal layer under application of a voltage to the liquid crystal layer.

The liquid crystal display device may comprise a counter substrate facing the display device substrate, a liquid crystal material sealed between the display device substrate and the counter substrate, and a sealing material for sealing the liquid crystal material between the display device substrate and the counter substrate. The abovementioned gas-barrier insulating film may be formed overlapping (in contact with) the sealing material. As a result, faults caused by generation of gas and/or formation of bubbles in a pixel region can be suppressed more effectively in a PSA mode liquid crystal display device.

The present invention is also a liquid crystal display device manufacturing method, being a method for manufacturing the liquid crystal display device of the present invention, and the manufacturing method comprises a step of irradiating light onto the liquid crystal layer after a liquid crystal filling step. This allows manufacturing a PSA mode liquid crystal display device while effectively suppressing faults caused by bubbles in the pixel region.

The liquid crystal display device manufacturing method of the present invention is not particularly limited as regards other processes, so long as the method comprises the aforementioned steps.

The present invention is also an organic electroluminescent display device (hereafter also referred to as organic EL display) that comprises the display device substrate of the present invention, the organic electroluminescent display device having a substrate affixed to the display device substrate by way of a photocurable adhesive. This allows effectively suppressing faults caused by generation of gas in a pixel region, in an organic EL display having a flat sealing structure.

So long as the above essential constituent elements are formed therein, the configuration of the organic electroluminescent display device of the present invention is not particularly limited, and may optionally comprise other constituent elements. The substrate is preferably a sealing substrate.

The present invention is also a display device (hereafter referred to also as "second display device" of the present application) comprising a display device substrate manufactured in accordance with the display device substrate manufacturing method of the present invention. Faults caused by generation of gas and/or formation of bubbles in a pixel region can be suppressed as a result.

So long as the above essential constituent elements are formed therein, the configuration of the second display device of the present invention is not particularly limited, and may optionally comprise other constituent elements.

EFFECT OF THE INVENTION

The display device substrate, display device substrate manufacturing method, display device, liquid crystal display device, liquid crystal display device manufacturing method and organic electroluminescent display device of the present invention allow suppressing faults caused by generation of gas and/or formation of bubbles in a pixel region.

BRIEF DESCRIPTION OF THE DRAWINGS

FIG. 5 is a cross-sectional schematic diagram of a frame region in a liquid crystal display device of Embodiment 3, wherein

FIG. 9 is a cross-sectional schematic diagram illustrating a variation of the liquid crystal display device of Embodiment 3, wherein

FIG. 11 is a cross-sectional schematic diagram illustrating a variation of the liquid crystal display device of Embodiment 3, wherein

FIG. 14 is a cross-sectional schematic diagram illustrating a variation of the liquid crystal display device of Embodiment 3, wherein

FIG. 16 is a cross-sectional schematic diagram illustrating a variation of the liquid crystal display device of Embodiment 3, wherein

FIG. 18 is a cross-sectional schematic diagram of a frame region in a liquid crystal display device of Embodiment 4, wherein FIG. 18(a) illustrates a terminal area, and FIG. 18(b) illustrates a peripheral circuit region;

FIG. 19 is a cross-sectional schematic diagram illustrating a variation of the liquid crystal display device of Embodiment 4, wherein

FIG. 22 is a cross-sectional schematic diagram illustrating a variation of the liquid crystal display device of Embodiment 5, wherein

FIGS. 28-2(e) to 28-2(g) are cross-sectional schematic diagrams of the peripheral circuit region in the liquid crystal display devices according to Embodiments 1 to 6 in a manufacturing process;

FIGS. 30-1(a) to 30-1(d) are cross-sectional schematic diagrams of the peripheral circuit region in a variation of the liquid crystal display devices according to Embodiments 1 to 6 in a manufacturing process;

FIGS. 30-2(e) to 30-2(h) are cross-sectional schematic diagrams of the peripheral circuit region in a variation of the liquid crystal display devices according to Embodiments 1 to 6 in a manufacturing process;

FIGS. 31-1(a) to 31-1(c) are cross-sectional schematic diagrams of the peripheral circuit region in a variation of the liquid crystal display devices according to Embodiments 1 to 6 in a manufacturing process;

FIGS. 31-2(d) to 31-2(f) are cross-sectional schematic diagrams the peripheral circuit region in a variation of the liquid crystal display devices according to Embodiments 1 to 6 in a manufacturing process;

FIG. 34 is a cross-sectional schematic diagram of a pixel region in a liquid crystal display device of Comparative Embodiment 2, wherein FIG. 34(a) illustrates a terminal area, and FIG. 34(b) illustrates a peripheral circuit region;

BEST MODE FOR CARRYING OUT THE INVENTION

The present invention will be explained in further detail below based on embodiments, with reference to accompanying drawings. However, the present invention is not limited to the embodiments.

Embodiment 1

Figure 1:
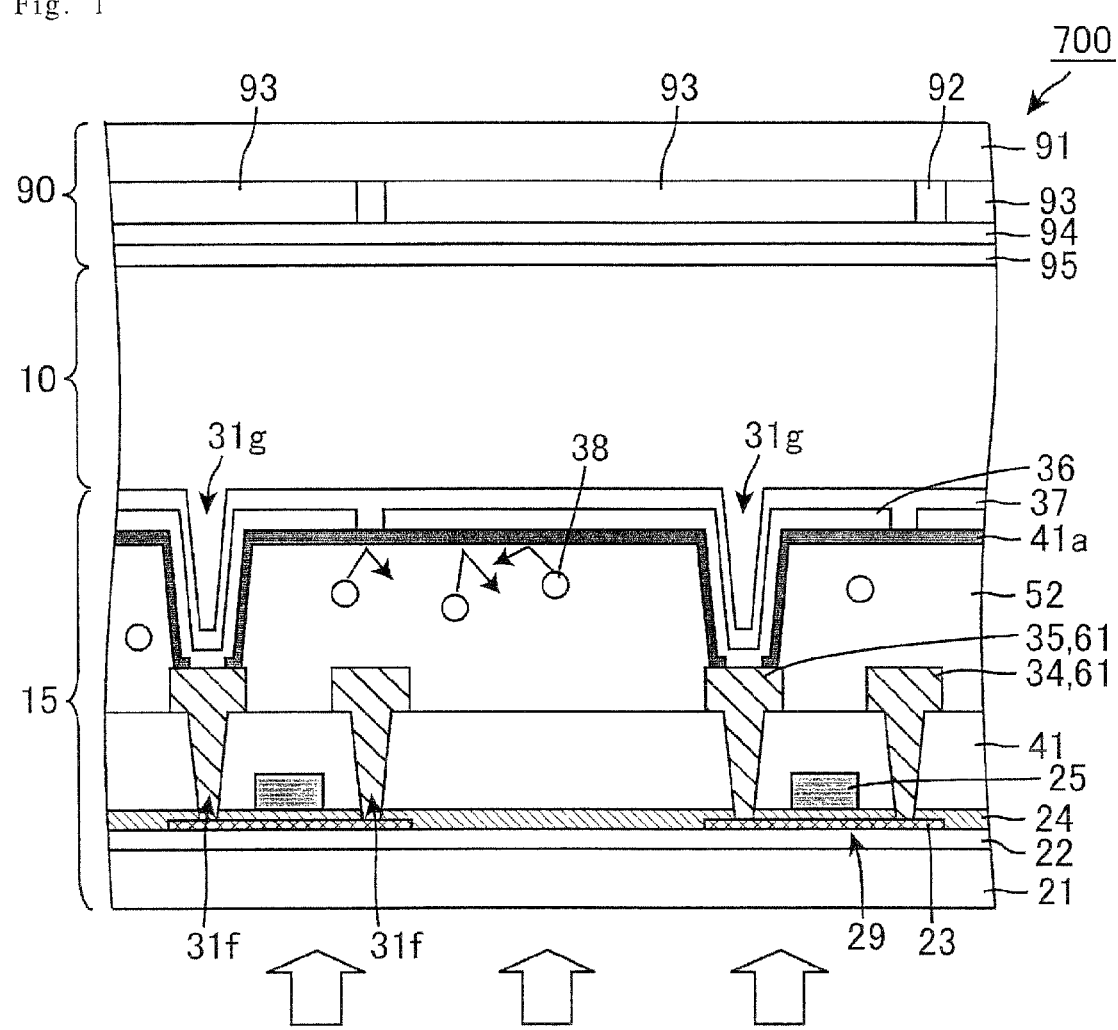
FIG. 1 is a cross-sectional schematic diagram of a pixel region in a liquid crystal display device of Embodiment 1.
Figure 37:
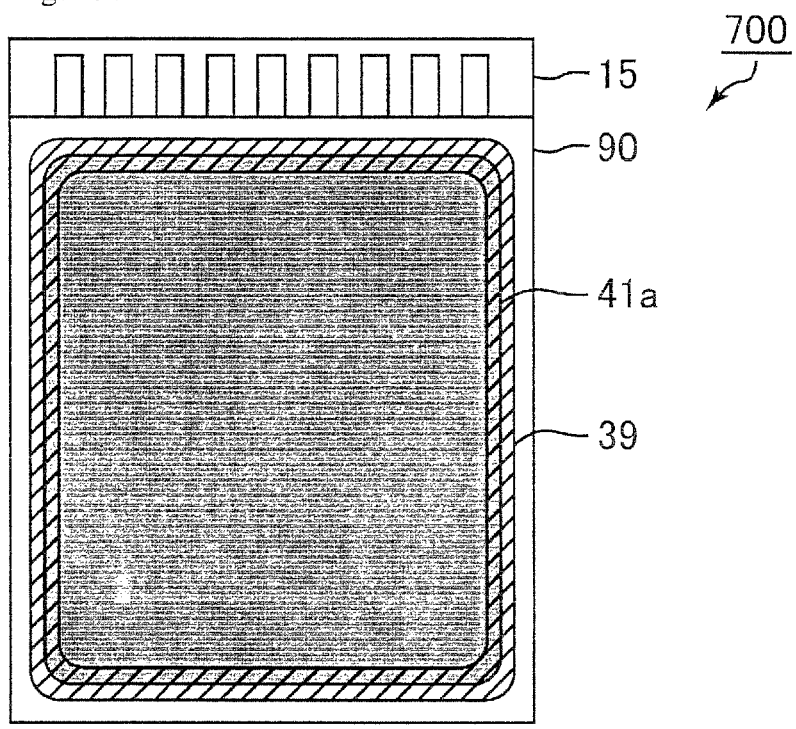
FIG. 37 is a plan-view schematic diagram of the liquid crystal display device of Embodiment 1.

FIG. 1 is a cross-sectional schematic diagram of a pixel region in a liquid crystal display device of Embodiment 1. A liquid crystal display device 700 of the present Embodiment is a transmissive-type liquid crystal display device, and, as illustrated in FIGS. 1, 37, has a TFT substrate 15 as a display device substrate, and a CF substrate 90 disposed facing the TFT substrate 15. A liquid crystal layer 10 is formed by sealing a liquid crystal material between the two substrates 15, 90 by way of a sealing material 39 provided at the periphery of the substrates 15, 90.

The TFT substrate 15 has a structure wherein an insulating substrate 21 at a pixel region (display region at which a plurality of pixels is arranged) has sequentially stacked thereon, from the side of the insulating substrate 21, a base coat film 22, a semiconductor layer 23, a gate insulator 24, a gate electrode 25, an inorganic insulating film 41 functioning as an interlayer insulating film, a source electrode 34 and drain electrode 35 comprising a first wiring layer 61, a stack of a photosensitive resin film 52 and an inorganic insulating film 41a, the photosensitive resin film 52 functioning as an interlayer insulating film and as a planarizing film, the inorganic insulating film 41a functioning as a gas-barrier insulating film, pixel electrodes 36 provided for each pixel, and an alignment film 37 provided so as to cover each pixel region. Thus, a TFT 29 functioning as a pixel switching element and that comprises the semiconductor layer 23, the gate insulator 24 and the gate electrode 25, is directly manufactured on the insulating substrate 21 that makes up the TFT substrate 15, for each pixel. The source electrode 34 and drain electrode 35 comprising the first wiring layer 61 are connected to source/drain regions of the semiconductor layer 23 by way of contact holes 31f that are provided in the inorganic insulating film 41a. Each of the pixel electrodes 36 is connected to the drain electrode 35 comprising the first wiring layer 61 by way of a contact hole (via hole) 31*g* that is provided in the photosensitive resin film 52 and the inorganic insulating film 41*a*.

Organic films such as the photosensitive resin film 52 are soft, and hence detach and are damaged readily, but have excellent planarity. Conversely, inorganic films such as the inorganic insulating film 41*a* have poor planarity, but are hard, and hence do not detach or are damaged readily.

As used in the present description, the term planarizing film denotes a film having the planarizing effect of evening out (reducing) level differences. Preferably, the surface of the planarizing film is substantially planar, but may exhibit level differences the height whereof is no greater than about 500 nm (preferably 200 nm). If the planarizing film has a level difference portion in the surface thereof, the radius of curvature of the level difference portion is preferably greater than the height of the level difference. As a result, generation of etching residue can be effectively suppressed during etching for forming a wiring layer at a layer higher than the planarizing film. Examples of planarizing films include, for instance, organic films such as the photosensitive resin film 52, and SOG (Spin-on-Glass) films.

The CF substrate 90 has, at the pixel region, an insulating substrate 91, and sequentially formed thereon, in this order from the side of the insulating substrate 91, a black matrix 92 comprising a light-shielding member provided between each pixel, a red, green and blue color filter 93 provided for each pixel, a common electrode 94 comprising a transparent conductive film, and an alignment film 95.

A method for manufacturing the liquid crystal display device 700 of Embodiment 1 is explained below.

A method for manufacturing the TFT substrate 15 will be explained next.

As a pre-treatment, the insulating substrate 21 is firstly subjected to cleaning and pre-annealing. The insulating substrate 21 is not particularly limited, but is preferably, for instance, a glass substrate or resin substrate, from the viewpoint of costs, among others. Steps (1) to (14) below are carried out next.

(1) Base Coat Film Formation Step

On the insulating substrate 21 there is formed the base coat film 22 through sequential formation of a SiON film having a film thickness of 50 nm, and a SiOx film having a film thickness of 100 nm by plasma-enhanced chemical vapor deposition (PECVD). Examples of a starting material gas for forming the SiON film include, for instance, a mixed gas of monosilane ($SiH_4$), nitrous oxide gas ($N_2O$) and ammonia ($NH_3$). Preferably, the SiOx film is formed using tetraethyl orthosilicate (TEOS) gas as a starting material gas. The base coat film 22 may also comprise a silicon nitride (SiNx) film formed using, for instance, a mixed gas of monosilane ($SiH_4$) and ammonia ($NH_3$) as a starting material gas.

(2) Semiconductor Layer Formation Step

An amorphous silicon (a-Si) film having a film thickness of 50 nm is formed by PECVD. Examples of starting material gas for forming the a-Si film include, for instance, $SiH_4$, disilane ($Si_2H_6$). The a-Si film formed by PECVD comprises hydrogen, and hence a treatment for lowering the hydrogen concentration in the a-Si film is performed at about 500° C. (dehydrogenation treatment). Laser annealing is performed next, followed by formation of a p-Si film through melting, cooling and crystallization of the a-Si film. Laser annealing is performed, for instance, using an excimer laser. To form the p-Si film, as a pre-treatment of the laser annealing (in order to form continuous-grain (CG) silicon), a metallic catalyst, such as nickel, is applied, without performing a dehydrogenation treatment, followed by solid-phase growth by way of a thermal treatment. To crystallize the a-Si film there may be performed solid-phase growth alone, by way of a thermal treatment. Next, dry etching is performed using a mixed gas of carbon tetrafluoride ($CF_4$) and oxygen ($O_2$), to pattern the p-Si film and form the semiconductor layer 23.

(3) Gate Insulator Formation Step

Next, the gate insulator 24 comprising silicon oxide and having a film thickness of 45 nm is formed using TEOS gas as a starting material gas. The material of the gate insulator 24 is not particularly limited, and there may be used, for instance, a SiNx film or a SiON film. The starting material gas for forming the SiNx film and the SiON film may be the same as the starting material gas in the base coat film formation step described above. The gate insulator 24 may be a stack comprising the above-mentioned plurality of materials.

(4) Ion Doping Step

An impurity such as boron is doped into the semiconductor layer 23, by ion doping, ion implantation or the like, in order to control the threshold value of the TFT 29. More specifically, an impurity such as boron is doped into a semiconductor layer that constitutes an N channel-type TFT or a P channel-type TFT (first doping step), and then an impurity such as boron is further doped into the semiconductor layer that constitutes the N channel-type, in a state where the semiconductor layer that constitutes the P channel-type TFT is masked with a resist (second doping step). The first doping step may be omitted if threshold value control of the P channel-type TFT is not necessary.

(5) Gate Electrode Formation Step

Next, a tantalum nitride (TaN) film having a film thickness of 30 nm, and a tungsten (W) film having a film thickness of 370 nm are formed, in this order, by sputtering. Next, a resist mask is formed by patterning a resist film to a desired shape, by photolithography, after which the gate electrode 25 is formed by dry etching using an etching gas in which there are adjusted the quantities of a mixed gas of, for instance, argon (Ar), sulfur hexafluoride ($SF_6$), carbon tetrafluoride ($CF_4$), oxygen ($O_2$), chlorine ($Cl_2$). As the material of the gate electrode 25 there can be used a high-melting point metal, having a planarized surface and stabilized characteristics, for instance tantalum (Ta), molybdenum (Mo), molybdenum tungsten (MoW) or the like, or a low-resistivity metal such as aluminum (Al). The gate electrode 25 may be a stack comprising the above-described plurality of materials.

(6) Source/Drain Region Formation Step

Next, in order to form the source/drain regions of the TFT 29, the semiconductor layer 23 is heavily doped with an impurity such as phosphorus, for an N channel-type TFT, or an impurity such as boron, for a P channel-type TFT, by ion doping or ion implantation, using the gate electrode 25 as a mask. An LDD (lightly doped drain) region may also be formed in this case, as needed. Next, a thermal activation treatment is performed at about 700° C. for 6 hours in order to activate the impurity ions in the semiconductor layer 23. The electric conductivity of the source/drain regions can be enhanced thereby. Examples of the activation method include, for instance, irradiation of an excimer laser.

(7) Inorganic Insulating Film Formation Step

Next, the inorganic insulating film 41 is formed by PECVD on the entire surface of the insulating substrate 21, through formation of a SiNx film having a film thickness of 100 to 400 nm (preferably, 200 to 300 nm), and a TEOS film having a film thickness of 500 to 1000 nm (preferably, 600 to 800 nm). A SiON film or the like may also be used as the inorganic insulating film 41. A thin cap film (for instance, a TEOS film) about 50 nm thick may be formed at a layer under the inorganic insulating film 41 in order to suppress impairment of TFT characteristics, caused by transient degradation (degradation on account of hot carriers), and in order to stabilize the electric characteristics of the TFT 29.

(8) Contact Hole Formation Step

Next, a resist mask is formed by patterning a resist film to a desired shape, by photolithography, after which the contact holes 31f are formed by wet etching of the gate insulator 24 and the inorganic insulating film 41 using a hydrofluoric acid-based etching solution. Etching may be dry etching. Thereafter, a thermal treatment is performed at about 400° C. for 1 hour in order to correct defects in crystalline Si, caused by hydrogen supplied from the SiNx film of the inorganic insulating film 41.

(9) First Wiring Layer Formation Step

Next, a titanium (Ti) film having a film thickness of 100 nm, an aluminum (Al) film having a film thickness of 500 nm and a Ti film having a film thickness of 100 nm are formed, in this order, by sputtering or the like. Next, a resist mask is formed by patterning a resist film to a desired shape, by photolithography, after which the Ti/Al/Ti metal multilayer film is patterned by dry etching, to form the first wiring layer 61. The source electrode 34 and the drain electrode 35 are formed as a result. An Al—Si alloy or the like may be used, instead of Al, as the metal that makes up the first wiring layer 61. Herein, Al is used for lowering wiring resistance, but the above-described gate electrode materials (Ta, Mo, MoW, W, TaN or the like) may be used as the metal that makes up the first wiring layer 61 in a case where high heat resistance is required and a certain increase in resistance values is allowable (for instance, in case of short wiring structures).

(10) Organic-Inorganic Stack Formation Step

Next, a photosensitive resin film 52 is formed on the entire surface of the substrate 21, through coating, by spin coating or the like, of a photosensitive acrylic resin, for instance a naphthoquinone diazide-based UV-curable resin, to a film thickness of 1 to 5 μm (preferably, 2 to 3 μm). A photosensitive polyalkylsiloxane-based resin may also be used as the material of the photosensitive resin film 52. Next, the region of the photosensitive resin film 52 that yields the contact hole 31g is removed by exposing to light the photosensitive resin film 52 via a photomask having formed therein a light-shielding pattern of desired shape, followed by etching (development). The photosensitive resin film 52 is subjected next to a baking step (for instance, at 200° C. for 30 minutes). Thereby, the shape of the opening (hole portion) of the photosensitive resin film 52 becomes less steep, and the aspect ratio of the contact hole 31g can be reduced. An ashing (stripping) step upon initial removal of the contact section of the photosensitive resin film 52 (portion that yields the contact hole 31g) becomes unnecessary.

Next, the inorganic insulating film 41a is formed on the entire surface of the insulating substrate 21 by forming, by sputtering or PECVD, a SiNx film having a film thickness of 10 to 200 nm (preferably, 20 to 100 nm), or a $SiO_2$ film having a film thickness of 10 to 200 nm (preferably, 20 to 100 nm) using TEOS gas as a starting material gas. A SiON film or the like may also be used as the inorganic insulating film 41a. Alternatively, a $SiO_2$ film or SiN film may be formed, as the inorganic insulating film 41a, by sputtering, CAT-CVD, ICP plasma CVD (for instance, a method that utilizes an ICP-CVD apparatus by SELVAC Co., Ltd), or ozone oxidation (for instance, a method that utilizes a Meiden Pure Ozone Generator by Meidensha Corporation).

A high-quality film can be formed at low temperature by way of the above processes. From among the foregoing, a $SiO_2$ film is the same base material as the insulating substrate having small UV light attenuation, and hence attenuation of UV light can be effectively suppressed in a below-described UV irradiation step if a $SiO_2$ film is used as the inorganic insulating film 41a. Also, a thermosetting resin, for instance a thermosetting epoxy resin film, a thermosetting polyimide resin film or a thermosetting parylene resin film having a film thickness of 0.1 to 3.0 μm (preferably, 0.5 to 2.0 μm) may be formed, instead of the inorganic insulating film 41a, as the gas-barrier insulating film.

Thus, the material of the gas-barrier insulating film is not particularly limited, provided that the film hinders advance of gas generated upon irradiation of light onto the photosensitive resin film 52, in a state where gas from inside the panel has no place to escape to, for instance during and/or after panel sealing, and provided that no gas is released by the film itself when irradiated with light (particularly UV irradiation).

Next, a resist mask is formed by patterning a resist film to a desired shape, by photolithography. Herein, the resist for patterning the inorganic insulating film 41a may be exposed using the same photomask as used for exposing to light the photosensitive resin film 52. The number of required photomasks can be reduced by one, and manufacturing costs reduced accordingly, by using thus the same photomask for exposure of the resist for patterning the inorganic insulating film 41a and the photosensitive resin film 52. At the same time, there can be suppressed the occurrence of positional mismatch in the openings of the photosensitive resin film 52 and the inorganic insulating film 41a, which can arise owing to a difference in state between two photomasks. In this case, preferably, the photosensitive resin film 52 is overexposed (exposure with excess with respect to an appropriate luminous energy) while the resist for patterning the inorganic insulating film 41a is exposed with an ordinary exposure energy. Doing so allows the inorganic insulating film 41a to remain on the wall surface of the opening of the photosensitive resin film 52.

Thereafter, the region of the inorganic insulating film 41a that yields the contact hole 31g is removed, by dry etching using carbon tetrafluoride ($CF_4$) or the like, in such a manner that the removed portion overlaps the region at which the photosensitive resin film 52 is removed. The contact hole 31g can be microfabricated, and the lower-layer first wiring layer 61 can have finer lines, through patterning of the inorganic insulating film 41a by dry etching. Thereafter, the resist mask is ashed by $O_2$ plasma, using the inorganic insulating film 41a as a stopper material. The contact hole 31g that runs through the photosensitive resin film 52 and the inorganic insulating film 41a is formed as a result.

Thus, damage caused by a dry process can be suppressed by forming the inorganic insulating film 41a (passivation film) on the photosensitive resin film 52. More specifically, the entire surface of the photosensitive resin film 52 on the side of the liquid crystal layer 10 is covered by the inorganic insulating film 41a, during etching of the inorganic insulating film 41a and the pixel electrode 36 by dry etching. That is, the side face (for instance, opening wall surface) and the top face of the photosensitive resin film 52 on the side of the liquid crystal layer 10 are covered by the inorganic insulating film 41a. This allows suppressing damage to the photosensitive resin film 52 caused by dry etching, and allows preventing damage to the photosensitive resin film 52 by oxygen plasma during resist ashing in the formation step of the contact hole 31g and the pixel electrode 36. In the light of the above, preferably, the entire opening wall surface of the opening of the photosensitive resin film 52 is covered by the inorganic insulating film 41a.

Figure 2:
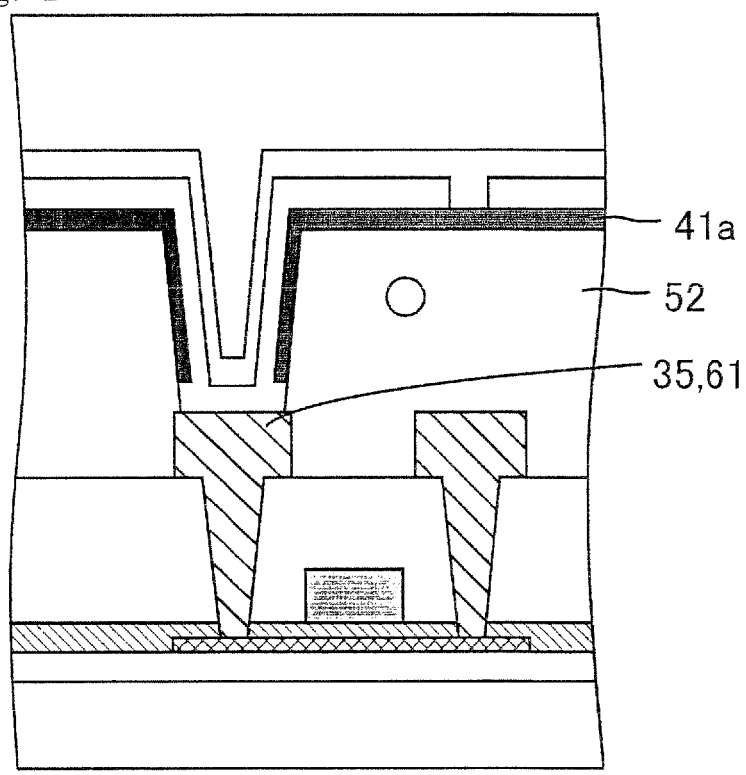
FIG. 2 is a cross-sectional schematic diagram illustrating a variation of the pixel region in the liquid crystal display device of Embodiment 1.

The inorganic insulating film 41a may be wet-etched. In this case, the resist mask may be stripped using a stripping solution. Therefore, this allows preventing the photosensitive resin film 52 from being damaged by ashing or dry etching. In case that the inorganic insulating film 41a is wet-etched, part of the wall surface of the opening of the photosensitive resin film 52, on the side of a lower layer, may become uncovered, as illustrated in FIG. 2, by causing the opening of the inorganic insulating film 41a to be greater than the opening of the photosensitive resin film 52. Likewise, this allows preventing the photosensitive resin film 52 from being damaged by ashing or dry etching.

To form the configuration illustrated in FIG. 2, firstly there is patterned a resist for patterning the inorganic insulating film 41a using a photomask that is different from the photomask that is used for exposing to light the photosensitive resin film 52. Next, the contact hole 31g is formed through etching of the inorganic insulating film 41a by wet etching with hydrofluoric acid (HF), using the resist for patterning the inorganic insulating film 41a as a mask, in such a manner that part of the wall surface of the opening of the photosensitive resin film 52, on the side of a lower layer, is uncovered. Lastly, the resist for patterning the inorganic insulating film 41a may be stripped using a stripping solution.

In a case where a thermosetting resin film is formed as the gas-barrier insulating film, holes may be formed in the thermosetting resin film by laser such as a $CO_2$ laser.

In both the photosensitive resin film 52 and the inorganic insulating film 41a there may be stacked a plurality of films comprising dissimilar materials. That is, a plurality of films comprising dissimilar materials may be stacked in the gas-barrier insulating film as well.

As a result of the above processes there is formed an organic-inorganic stack wherein the inorganic insulating film 41a is stacked on the photosensitive resin film 52. The inorganic insulating film 41a (gas-barrier insulating film) need not necessarily be formed on the entire surface of the insulating substrate 21, provided that the inorganic insulating film 41a is formed so as to cover at least the pixel region. Preferably, however, the inorganic insulating film 41a is formed at least extending up to (overlapping) the sealing material 39, as illustrated in FIG. 37. Advance of the gas 38 generated from the photosensitive resin film 52 can be prevented more effectively as a result. In a case where, as in Embodiment 3 and hereafter in the description below, a terminal area and a peripheral circuit region are provided on the TFT substrate 15, the inorganic insulating film 41a (gas-barrier insulating film) is preferably formed up to the terminal area and the peripheral circuit region.

The photosensitive resin film 52 and the inorganic insulating film 41a may also be formed as follows. Firstly, the photosensitive resin film 52 and the inorganic insulating film 41a are formed in this order. Next, a resist mask is formed by patterning a resist film to a desired shape, by photolithography, after which the contact hole 31g is formed by dry etching using a mixed gas of carbon tetrafluoride ($CF_4$) and oxygen ($O_2$) while adjusting the flow rate of both gases. The resist mask is ashed (stripped) using the inorganic insulating film 41a as a stopper material. The contact hole 31g can be microfabricated as a result, whereby the lower-layer first wiring layer 61 can have finer lines.

In this case, however, the film thickness of the photosensitive resin film 52 is large, for instance of 2 μm or greater, and hence the aspect ratio of the contact hole 31g formed in the stack of the photosensitive resin film 52 and the inorganic insulating film 41a is high, which may make contact between higher and lower layers more difficult. Alternately, the aspect ratio of the contact hole 31g can be reduced by using a procedure wherein the inorganic insulating film 41a is formed and opened after opening of the photosensitive resin film 52.

In this case, the uncovered wall surface of the opening of the photosensitive resin film 52 in the contact hole 31g may become ashed as well during $O_2$ ashing of the resist mask, and the wall surface of the opening of the photosensitive resin film 52 may recede with respect to the wall surface of the opening of the inorganic insulating film 41a, such that the contact hole 31g overhangs (takes on a jutting shape), as a result of which higher-layer pixel electrode 36 and the lower-layer first wiring layer 61 may become disconnected in the contact hole 31g. By contrast, disconnection between the higher-layer pixel electrode 36 and the lower-layer first wiring layer 61 in the contact hole 31g can be effectively suppressed by using a procedure wherein the inorganic insulating film 41a is formed and opened after opening of the photosensitive resin film 52.

(11) Pixel Electrode and Alignment Film Formation Step

Next, an ITO film and/or an IZO film having a film thickness of 50 to 200 nm (preferably, 100 to 150 nm) is formed by sputtering or the like, and is then patterned to a desired shape by photolithography, to form the pixel electrode 36. Thereafter, a polyimide film as the alignment film 37 is applied, for instance by printing, onto the pixel electrode 36, in such a way so as to cover at least the pixel region, and the alignment film 37 is subjected to an aligning treatment to complete thereby the TFT substrate 15.

(12) CF Substrate Formation Step

In the CF substrate 90, firstly the insulating substrate 91 is prepared in the same way as in the insulating substrate 21. A light shielding film is formed then by sputtering, and the film is patterned to form the black matrix 92. Next, a resin film (dry film) having a red pigment dispersed therein is laminated on the entire surface of the pixel region, and the resin film is exposed to light, and is developed and baked (thermal treatment) to form thereby a red color filter 93. Next, a resin film having a green pigment dispersed therein is laminated on the entire surface the pixel region, overlapping the red color filter 93, and the resin film is exposed to light, and is developed and baked (thermal treatment) to form thereby a green color filter 93. A blue color filter 93 is formed in the same way. At this time, a columnar spacer (not shown) comprising a stack of the light shielding film and the resin film is formed at a light-shielding region outside the pixel opening. Next, the common electrode 94 is formed on the color filter 93 by vapor deposition of ITO. Next, a polyimide film as the alignment film 95 is applied, for instance by printing, onto the common electrode 94, in such a way so as to cover at least the pixel region, and the alignment film 95 is subjected to an aligning treatment, to complete thereby the CF substrate 90. The color filter 93 may be formed by photolithography using a color resist. A photospacer may be formed by photolithography, using a color resist, on the CF substrate 90. The source lines and/or CS lines of the TFT substrate 15 may be formed for the black matrix 92 instead of the black matrix 92.

(13) Panel Bonding Step and Liquid Crystal Filling Step

Next, the sealing material 39 is applied onto the outer periphery of the pixel region of the TFT substrate 15, and then a liquid crystal material, in which a polymerizable component is added to liquid crystal molecules having a negative dielectric constant, is dripped inward of the sealing material 39, using a dispenser or the like. The material that can be used as the polymerizable component is not particularly limited, and may be, for instance, a photopolymerizable monomer or a photopolymerizable oligomer. Next, the CF substrate 90 is bonded to the TFT substrate 15 having the liquid crystal material dripped thereon. The process thus far is carried out in vacuum. Next, the bonded substrates 15, 90 are returned to the air atmosphere, whereupon the liquid crystal material diffuses between the two bonded substrates 11, 90 on account of atmospheric pressure. Next, the sealing material 39 is cured through irradiation thereon of UV light while moving a UV light source along the region coated with the sealing material 39. Thus, the diffused liquid crystal material becomes sealed between the two substrates 11, 90, to form thereby the liquid crystal layer 10.

The method for filling the liquid crystal material may involve providing a liquid crystal filling port at periphery of the substrates 11, 90, and filling the liquid crystal material through the port, followed by sealing of the liquid crystal filling port using a UV-curable resin or the like.

(14) Polymerizable Component Light Irradiation Step

Next, AC voltage is applied across the source electrode 34 and the common electrode 94 in a state where voltage that turns the TFT 29 on is applied to the gate electrode 25, and, while the liquid crystal molecules are tilted, UV light is irradiated onto the liquid crystal layer 10 from the side of the TFT substrate 15 (blanked arrows in FIG. 1). As a result, the photopolymerizable monomer added to the liquid crystal material becomes polymerized, and a polymer is formed that defines the pretilt angle of the liquid crystal molecules on the surface of the alignment films 37, 95 on the side of the liquid crystal layer 10.

The liquid crystal display device 100 of the present Embodiment can be completed thereafter by performing, for instance, a panel cutting step, a polarizer affixing step, an FCP substrate affixing step, and a liquid crystal display panel and backlight unit combination step.

The liquid crystal display device 700 of the present Embodiment has a gas-barrier insulating film provided between the photosensitive resin film 52 and the pixel electrode 36. Therefore, intrusion of the gas 38 into the liquid crystal layer 10 can be prevented by the gas-barrier insulating film, as illustrated in FIG. 1 even when the gas 38 is generated in the photosensitive resin film 52 below the pixel electrode 36, upon irradiation of UV light onto the photosensitive resin film 52 in the polymerizable component light irradiation step. Formation of bubbles in the liquid crystal layer 10 can thus be suppressed, as a result of which the occurrence of faults due to bubbles can be likewise suppressed.

Arguably, the gas 38 is particularly likely to intrude into the liquid crystal layer 10 through gaps between adjacent pixel electrodes 36. However, the gas-barrier insulating film covers regions at which the top face and the side face (for instance, wall surface of the opening) of the photosensitive resin film 52 are not covered by the pixel electrode 36. The gas 38 can be blocked more effectively as a result.

Similarly, the gas-barrier insulating film is provided at gaps between pixel electrodes 36. The gas 38 can be blocked more effectively as a result.

Figure 3:
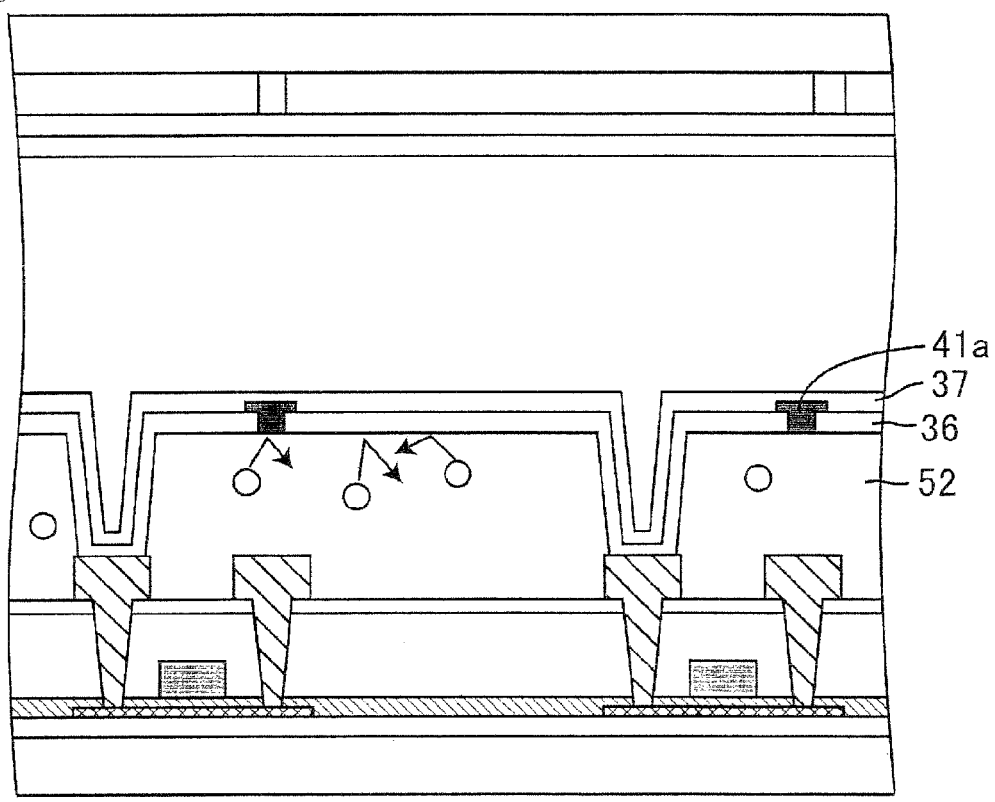
FIG. 3 is a cross-sectional schematic diagram of a pixel region in another liquid crystal display device of Embodiment 1.

FIG. 3 is a cross-sectional schematic diagram of a pixel region in another liquid crystal display device of Embodiment 1.

In the present Embodiment, the pixel electrodes 36 and the inorganic insulating film 41a may be formed in this order. The inorganic insulating film 41a, functioning as a gas-barrier insulating film, may be formed at a layer higher than the pixel electrodes 36, specifically directly on the pixel electrodes 36. Faults caused by bubbles can be suppressed as well in this case. However, voltage drop on account of the capacitive component of the gas-barrier insulating film may occur if the entire pixel electrode 36 is covered by the inorganic insulating film 41a.

Preferably, therefore, the inorganic insulating film 41a is selectively formed at a region where the pixel electrode 36 is absent as shown in FIG. 3. Preferably, the inorganic insulating film 41a overlaps the outer edge portion of the pixel electrode 36 and has openings on the pixel electrode 36. Preferably, the inorganic insulating film 41a selectively covers a region at which the top face of the photosensitive resin film 52 is not covered by the pixel electrodes 36, and is selectively provided at gaps between pixel electrode 36 that are provided spaced apart from each other. As a result, this allows suppressing the occurrence of faults caused by bubbles in the pixel region, while suppressing voltage drops on account of the capacitive component of the gas-barrier insulating film. If there is a region at which the side face of the photosensitive resin film 52 (for instance, outer edge portion of the photosensitive resin film 52 positioned at a frame region) is not covered by the pixel electrodes 36, then such a region is preferably covered also by the inorganic insulating film 41a. The extent to which the gas-barrier insulating film is to overlap the pixel electrodes 36 can be appropriately set in accordance with the patterning precision and the material of the gas-barrier insulating film, within an allowable voltage drop range.

The liquid crystal display device 700 of the present Embodiment may be of domain-division type. The liquid crystal display device 700 of the present Embodiment may be a black and white display. The liquid crystal display device 700 of the present Embodiment may be of reflective type, or of semitransmissive-type (reflective/transmissive type).

Embodiment 2

Figure 4:
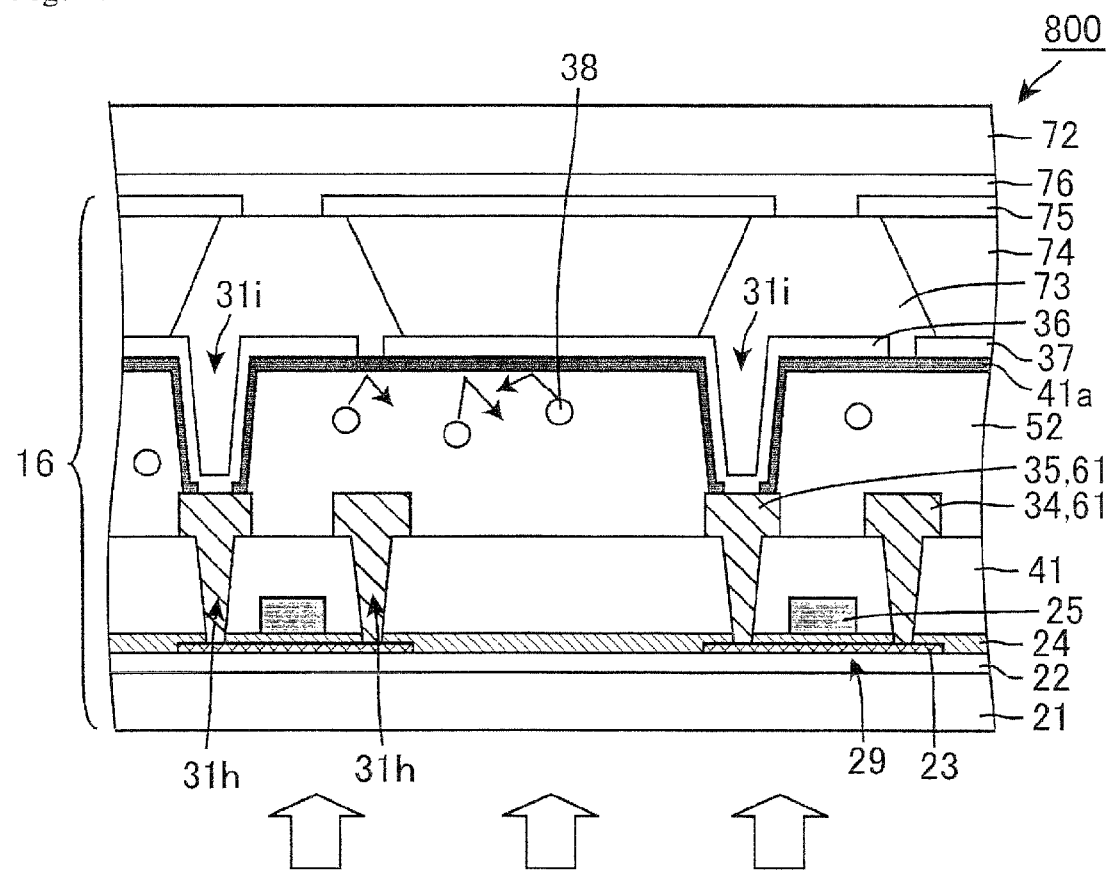
FIG. 4 is a cross-sectional schematic diagram of a pixel region in an organic EL display of Embodiment 2.

FIG. 4 is a cross-sectional schematic diagram of a pixel region in an organic EL display of Embodiment 2. Recurrent features common to the present Embodiment and Embodiment 1 will not be explained again.

An organic EL display 800 of the present Embodiment is an active matrix-type organic EL display, and has a TFT substrate 16 as a display device substrate, and a sealing substrate 72 disposed facing the TFT substrate 16, as illustrated in FIG. 4.

Like the TFT substrate 15 of Embodiment 1, the TFT substrate 16 has a structure wherein, at a pixel region, an insulating substrate 21 has sequentially stacked thereon, from the side of the insulating substrate 21, a base coat film 22, a semiconductor layer 23, a gate insulator 24, a gate electrode 25, an inorganic insulating film 41 functioning as an interlayer insulating film, a source electrode 34 and drain electrode 35 comprising a first wiring layer 61, and a stack of a photosensitive resin film 52 and an inorganic insulating film 41a, the photosensitive resin film 52 functioning as a interlayer insulating film and as a planarizing film, the inorganic insulating film 41a functioning as a gas-barrier insulating film. Also, a pixel electrode (lower electrode) 36 functioning as an anode is provided on the inorganic insulating film 41a for each pixel, and a partition 73, along the boundary of the pixel, is provided on the pixel electrode 36. An EL film (organic film) 74, comprising a positive hole injection and transport layer and an emissive layer, is formed at an opening of the partition 73 corresponding to each pixel. An upper electrode 75, functioning as a cathode, is provided on the EL film 74. Thus, a TFT 29 functioning as a pixel switching element and that comprises the semiconductor layer 23, the gate insulator 24 and the gate electrode 25, is directly manufactured on the insulating substrate 21 that makes up the TFT substrate 16 for each pixel, as in Embodiment 1. The source electrode 34 and the drain electrode 35 comprising a first wiring layer 61 are connected to source/drain regions of the semiconductor layer 23 by way of contact holes 31h that are provided in the inorganic insulating film 41. Further, the pixel electrode 36 is connected to the drain electrode 35, comprising the first wiring layer 61, via a contact hole (via hole) 31i provided in the photosensitive resin film 52 and the inorganic insulating film 41a.

A sealing substrate 72 is bonded, by way of a UV-curable adhesive 76, to the TFT substrate 16 on the side of the upper electrode 75.

A method for manufacturing the organic EL display 800 of Embodiment 2 is explained below.

A method for manufacturing the TET substrate 16 will be explained next.

As a pre-treatment, the insulating substrate 21 is firstly subjected to cleaning and pre-annealing. The insulating substrate 21 is not particularly limited, but is preferably, for instance, a glass substrate, a resin substrate or a metal substrate, from the viewpoint of costs, among others.

Next, the same steps (1) through (10) as in Embodiment 1 are carried out.

(11) Pixel Electrode Formation Step

Next, an ITO film and/or an IZO film having a film thickness of 50 to 200 nm (preferably, 100 to 150 nm) is formed by sputtering or the like, and is then patterned to a desired shape by photolithography, to form the pixel electrode 36 functioning as an anode of each pixel.

(12) Partition Formation Step

Next, a photosensitive resin film is formed on the entire surface of the substrate 21 through coating, by spin coating or the like, of a photosensitive acrylic resin, for instance a naphthoquinone diazide-based UV-curable resin, to a film thickness of 1 to 4 μm (preferably, 2 to 3 μm). A photosensitive polyalkylsiloxane-based resin may also be used as the material of the photosensitive resin film. Next, the photosensitive resin film is exposed to light via a photomask having formed therein a light-shielding pattern of a desired shape, followed by etching (development) to form thereby an opening at each pixel. The pixel electrode 36 is uncovered thereby. The photosensitive resin film is subjected next to a baking step (for instance, at 200° C. for 30 minutes) to form the partition 73. Prior to forming the partition 73 there may be formed a partition comprising an inorganic materials as TEOS, to a thickness of about 50 to 100 nm, and having an opening at the emissive region.

(13) EL Film Formation Step

Next, the interior of the opening of the partition 73 is pattern-coated with a mixed aqueous solution comprising polyethylene dioxythiophene (PEDOT) and polystyrene sulfonic acid (PSS), using an inkjet device, followed by drying by heating. The solvent in which the PEDOT and PSS are dispersed is removed through this heating drying treatment, as a result of which there is formed a charge injection and transport layer having a film thickness of 20 to 70 nm (preferably, 40 to 60 nm). Thereafter, liquid materials of three colors, resulting from dissolving red, blue and green polymeric luminescent materials, such as polyfluorene materials, in a non-polar solvent such as xylene, are pattern-coated onto the charge injection and transport layer within the opening of the partition 73, using an inkjet device. After pattern-coating, the solvent is removed to form thereby an emissive layer having a film thickness of 50 to 150 nm (preferably, 80 to 120 nm). Thus, the color display type of the organic EL display 800 of the present Embodiment is of three-color type.

(14) Upper Electrode Formation Step

Next, calcium to a film thickness of 5 to 30 nm (preferably, 10 to 20 nm) and aluminum to a film thickness of 100 to 400 nm (preferably, 200 to 300 nm) are vapor-deposited on the emissive layer in this order to from the upper electrode 75 functioning as a cathode.

(15) Sealing Substrate Affixing Step

Next, the UV-curable adhesive 76 is applied onto the upper electrode 75 in such a way so as to cover the EL film 74, and then the TFT substrate 16 and the flat sealing substrate 72, being a glass substrate, a resin substrate or the like, are bonded to each other by way of the UV-curable adhesive 76, in an environment of vacuum or reduced pressure and into which there is introduced an inert gas, such as nitrogen ($N_2$) gas or dry air.

The UV-curable adhesive 76 is not particularly limited, and may be the photocurable adhesive composition disclosed in Japanese Patent Application Publication No. 2004-231938. More specifically, the photocurable adhesive composition may be prepared by homogeneously mixing under stirring at a stirring speed of 3000 rpm using a Homodisper-type agitator-mixer (model "Homodisper L", by Primix), the following components: 70 parts by weight of a bisphenol A epoxy resin (trade name: "Epikote 828", by Japan Epoxy Resin) as a photocationic polymerizable compound; 30 parts by weight of a naphthalene epoxy resin (trade name "Epiclon HP-4032", by DIC Corporation) as a photocationic polymerizable compound; 1 part by weight of a photocationic polymerization initiator (trade name: "Adeka Optomer SP170", by Asahi Denka Kogyo) of ionic photoacid generator type (ionic type that generates an acid when irradiated by light) that is activated by visible light rays or near-infrared rays at a wavelength of 340 nm or longer as a photocationic polymerization initiator; 0.2 parts by weight of a thioxanthone derivative-based photosensitizing agent (trade name: Kayacure DETX-S", by Nippon Kayaku) as a photosensitizing agent that absorbs visible light rays or near-infrared rays at a wavelength of 340 nm or longer; and 20 parts by weight of synthetic mica (trade name: "Micromica MK-100, by Co-op Chemical) as a filler.

UV light (blanked arrows in FIG. 4, having, for instance a wavelength of 365 nm and irradiation energy of 6000 mJ/cm$^2$) is irradiated from the side of the TEl substrate 16 to cure thereby the UV-curable adhesive 76. The EL film 74 can as a result be blocked off from external air by the sealing substrate 72. The UV light may also be irradiated through the sealing substrate 72.

Thereafter, the organic EL display 800 of the present Embodiment can be completed through, for instance, an FOP substrate affixing step.

In the organic EL display 800 of the present Embodiment, a gas-barrier insulating film is provided between the pixel electrode 36 and the photosensitive resin film 52. Therefore, intrusion of the gas 38 into the EL film 74 can be prevented by the gas-barrier insulating film, as illustrated in FIG. 4, even when the gas 38 is generated in the photosensitive resin film 52 below the pixel electrode 36, upon irradiation of UV light onto the photosensitive resin film 52 in the affixing step of the sealing substrate 72. This allows therefore suppressing the occurrence of faults caused by the gas 38.

Arguably, the gas 38 is likely to intrude into the EL film 74, in particular, through gaps between adjacent pixel electrodes 36. However, the gas-barrier insulating film covers regions at which the top face of the photosensitive resin film 52 is not covered by the pixel electrode 36. The gas 38 can be blocked more effectively as a result.

Similarly, the gas-barrier insulating film is provided at gaps between pixel electrodes 36. The gas 38 can be blocked more effectively as a result.

Generation of gas from the partition 73 cannot be blocked by the gas-barrier insulating film in a case where the partition 73 is formed out of a photosensitive resin, as described above. However, the frequency of occurrence of faults can be reduced as compared with conventional cases, since the absolute amount of gas is reduced.

The gas-barrier insulating film may overlap the outer edge portion of the pixel electrode 36, may have an opening over the pixel electrode 36, may selectively cover regions at which the top face and/or the side face of the photosensitive resin film 52 is not covered by the pixel electrode 36, and may be selectively provided at gaps between pixel electrodes 36 that are provided spaced apart from each other.

The organic EL display 800 of the present Embodiment may be of top emission type, or of bottom emission type. The organic EL display 800 of the present Embodiment may comprise a low-molecular weight emissive material. Thus, the organic layer between the pixel electrode 36 and the upper electrode 75 may be formed in accordance with a wet method, as described above, or may be formed in accordance with a dry method such as vapor deposition. Further, the color display type of the organic EL display 800 of the present Embodiment may be a color conversion type, or a color filter type.

In the below-described embodiments, the gas-barrier insulating film in the above-described inorganic insulating film and so forth is used also at a terminal area, a peripheral circuit and a pixel region. As a result, there can be realized not only a gas barrier effect, but also an additional effect of reducing the number of processes.

Embodiment 3

Figure 5A:
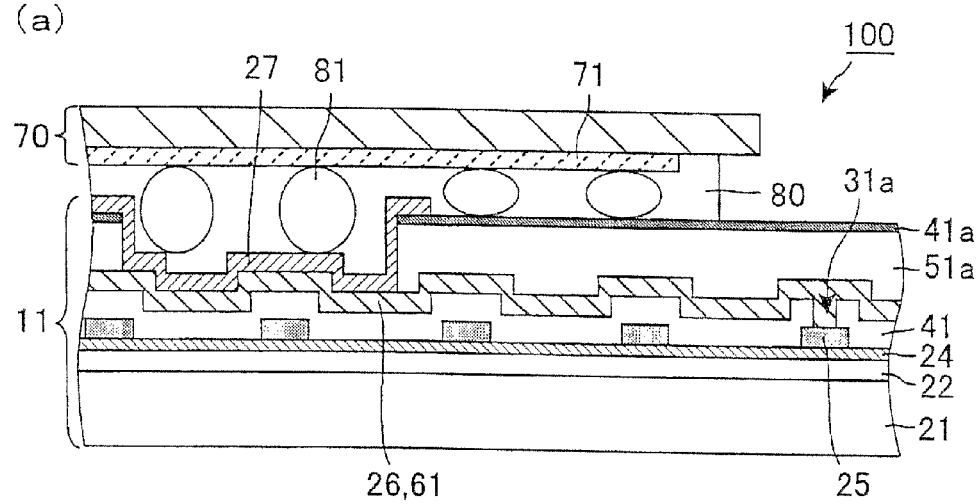
FIG. 5(a) illustrates a terminal area.
Figure 5B:
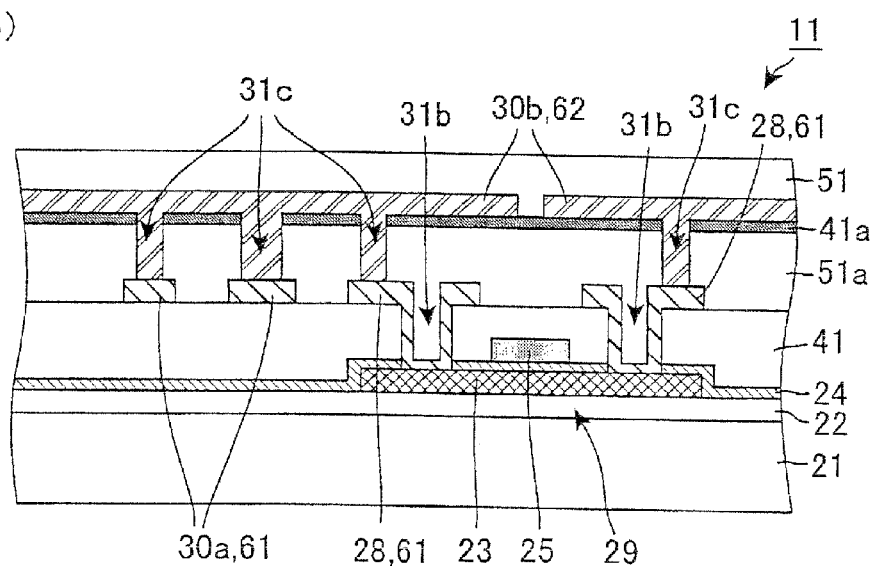
FIG. 5(b) illustrates a peripheral circuit region.
Figure 6:
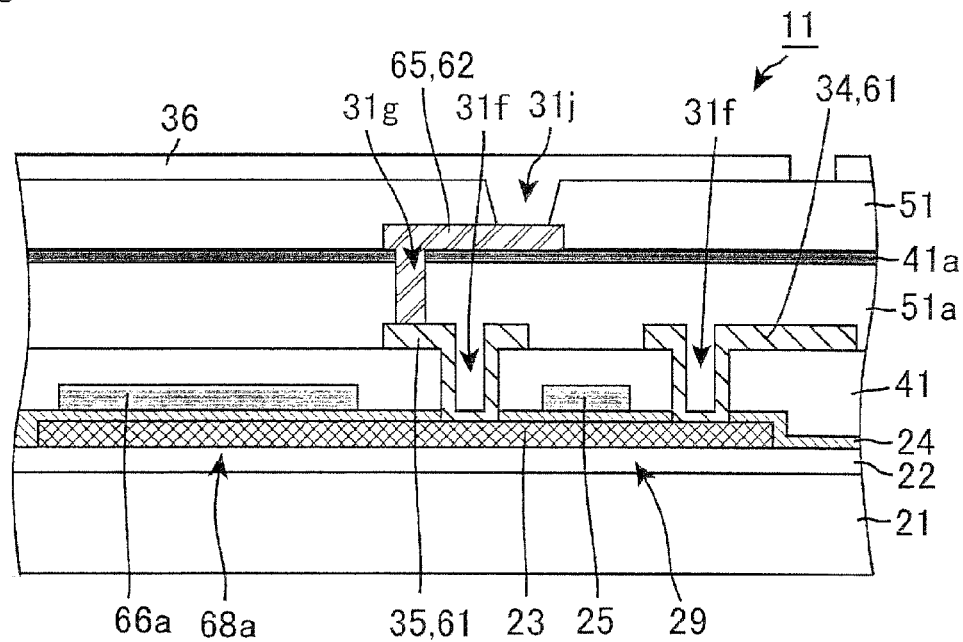
FIG. 6 is a cross-sectional schematic diagram of a pixel region in the liquid crystal display device of Embodiment 3.

FIG. 5 is a cross-sectional schematic diagram of a frame region in a liquid crystal display device of Embodiment 3, wherein FIG. 5(a) illustrates a terminal area, and FIG. 5(b) illustrates a peripheral circuit region. FIG. 6 is a cross-sectional schematic diagram of a pixel region in a liquid crystal display device of Embodiment 3. As illustrated in FIG. 5(a), a liquid crystal display device 100 of the present Embodiment has a structure wherein a TFT substrate 11, being a display device substrate, and an FPC board 70, being another circuit board, are connected by way of an ACF 80, at a terminal area.

The liquid crystal display device 100 is formed by stacking, on an insulating substrate, a black matrix comprising a light-shielding member; red, green and blue color filters; an overcoat layer; a common electrode comprising a transparent conductive film; and an alignment film, in this order from the insulating substrate. The liquid crystal display device 100 has also a CF substrate (not shown) disposed facing the TFT substrate 11, such that a liquid crystal material is filled in between the TFT substrate 11 and the CF substrate.

As illustrated in FIG. 5(a), the TFT substrate 11 has a structure wherein, at a terminal area, an insulating substrate 21 has sequentially stacked thereon, from the side of the insulating substrate 21, a base coat film 22, a gate insulator 24, a gate electrode 25, an inorganic insulating film 41 functioning as an interlayer insulating film, a connection terminal (external connection terminal) 26 comprising a first wiring layer 61, and a stack of an inorganic insulating film 41a and an organic insulating film 51a functioning as a protective film. The organic insulating film 51a and the inorganic insulating film 41a are removed at the end portion of the connection terminal 26, and a pad (abutting section with conductive microparticles 81 in the ACF 80) 27 is provided at the end portion of the connection terminal 26. The pad 27 and a connection terminal 71 of the FPC board 70 are in contact with conductive microparticles 81 in the ACF 80, whereby the TFT substrate 11 and the FPC board 70 are connected and fixed to each other. The connection terminal (external connection terminal) 26 comprising the first wiring layer 61 is connected to the gate electrode (gate wiring) 25 by way of a contact hole 31a provided in the inorganic insulating film 41.

As illustrated in FIG. 5(b), the TFT substrate 11 has a structure wherein, at the peripheral circuit region, the insulating substrate 21 has formed thereon, from the side of the insulating substrate 21, the base coat film 22, the semiconductor layer 23, the gate insulator 24, the gate electrode 25, the inorganic insulating film 41 functioning as an interlayer insulating film, source/drain electrodes 28 and routing wiring (wiring for connecting elements and/or terminals to one another) 30a comprising the first wiring layer 61, a stack of an inorganic insulating film 41a and an organic insulating film 51a functioning as a interlayer insulating film and as a planarizing film, routing wiring 30b comprising a second wiring layer 62, and an organic insulating film 51 functioning as a protective film. Thus, a TFT 29 that comprises the semiconductor layer 23, the gate insulator 24 and the gate electrode 25, and that makes up a peripheral circuit such as a driver circuit, is directly formed on the insulating substrate 21 that makes up the TFT substrate 11. The source/drain electrodes 28 comprising the first wiring layer 61 are connected to source/drain regions in the semiconductor layer 23 by way of contact holes 31b provided in the inorganic insulating film 41. The routing wiring 30b comprising the second wiring layer 62 is connected to the routing wiring 30a comprising the first wiring layer 61 and the source/drain electrodes 28 comprising the first wiring layer 61 by way of contact holes (via holes) 31c that are provided in the organic insulating film 51a and the inorganic insulating film 41a. The peripheral circuit is not particularly limited, and may be a driver circuit such as a transmission gate, a latch circuit, a timing generator, an inverter circuit by a power source circuit, or a circuit such as a buffer circuit, a digital-analog conversion circuit (DAC circuit), a shift register or a sampling memory.

As illustrated in FIG. 6, the TFT substrate 15 has a structure wherein an insulating substrate 21 at a pixel region (display region at which a plurality of pixels are arranged) has sequentially stacked thereon, from the side of the insulating substrate 21, the base coat film 22, the semiconductor layer 23, the gate insulator 24, the gate electrode 25 and a storage capacitor upper electrode 66a functioning as an upper electrode of a pixel storage capacitor 68a, the inorganic insulating film 41 functioning as an interlayer insulating film, the source electrode 34 and drain electrode 35 comprising the first wiring layer 61, the stack of the organic insulating film 51a and the inorganic insulating film 41a, the organic insulating film 51a functioning as an interlayer insulating film and a planarizing film, the inorganic insulating film 41a functioning as a gas-barrier insulating film, drain wiring 65 comprising the second wiring layer 62, the organic insulating film 51 functioning as a protective film, a pixel electrode 36 provided for each pixel, and an alignment film (not shown) provided so as to cover the pixel region. Thus, a TFT 29 functioning as a pixel switching element and that comprises the semiconductor layer 23, the gate insulator 24 and the gate electrode 25, is directly manufactured on the insulating substrate 21 that makes up the TEF substrate 11, for each pixel. Each pixel has directly manufactured thereon the pixel storage capacitor 68a that functions also as a storage capacitor lower electrode (electrode functioning as a lower electrode of a pixel storage capacitor) and that comprises the semiconductor layer 23, the gate insulator 24 and the storage capacitor upper electrode 66a. The source electrode 34 and drain electrode 35 comprising the first wiring layer 61 are connected to source/drain regions of the semiconductor layer 23 by way of contact holes 31f that are provided in the inorganic insulating film 41. The drain wiring 65 is connected to the drain electrode 35 comprising the first wiring layer 61 by way of a contact hole (via hole) 31g that is provided in the organic insulating film 51a and inorganic insulating film 41a. Each pixel electrode 36 is connected to the drain wiring 65 comprising the second wiring layer 62 by way of a contact hole (via hole) 31j that is provided in the organic insulating film 51.

The organic film that makes up the organic insulating film 51a is soft and hence likely to detach and be damaged, but has excellent planarity. Conversely, the inorganic film that makes up the inorganic insulating film 41a has poor planarity, but is hard, and does not detach or is damaged readily.

The liquid crystal display device 100 has the organic-inorganic stack functioning as an interlayer insulating layer and/or a planarizing layer, in which the inorganic insulating film 41a is stacked directly on the organic insulating film 51a. At the terminal area, thus, the organic insulating film 51a can be further protected by the inorganic insulating film 41a by covering the organic insulating film 51a (at least the upper surface of the organic insulating film 51a) with the inorganic insulating film 41a. Therefore, it is possible to prevent the organic insulating film 51a from detaching or being damaged even if rework is required in a process of connecting a panel and the FPC board 70, more specifically the TFT substrate 11 and the FPC board 70. As a result, it becomes possible to reduce exposure of the first wiring layer 61 (connection terminal 26) positioned below the organic insulating film 51a to prevent thereby corrosion of the first wiring layer 61 caused by moisture and the like. It is also possible to suppress the occurrence of faulty contact with the FPC board 70 caused by residues fallen out from the organic insulating film 51a. This allows enhancing the reliability of the liquid crystal display device 100.

The inorganic insulating film 41a can be used as a stopper material during ashing of a resist mask. This allows therefore using a method that includes an ashing step, i.e. a method such as dry etching in which a resist mask is utilized, having high microfabrication precision, as a method for forming the contact holes 31c, 31g in the organic insulating film 51a and the inorganic insulating film 41a. As a result, wiring positioned below the stack of the organic insulating film 51a and the inorganic insulating film 41a, and among such wiring, routing wiring 30a and the like provided at the peripheral circuit region which requires microfabrication, can be formed as fine lines with high precision.

Also, using a planarizing film in the form of the organic insulating film 51a or organic insulating film 51 having excellent planarity, allows reducing level differences in the first wiring layer 61 and the TFT 29, on a lower-layer side, and allows the second wiring layer 62 to be routed on a higher-layer side, while effectively suppressing the occurrence of short circuits.

A method for manufacturing the liquid crystal display device of Embodiment 3 is explained below.

As a pre-treatment, the insulating substrate 21 is firstly subjected to cleaning and pre-annealing. The insulating substrate 21 is not particularly limited, but is preferably, for instance, a glass substrate or a resin substrate, from the viewpoint of costs, among others. Steps (1) to (17) below are carried out next.

(1) Base Coat Film Formation Step

On the insulating substrate 21 there is formed a base coat film 22 through sequential formation of a SiON film having a film thickness of 50 nm, and a SiOx film having a film thickness of 100 nm by plasma-enhanced chemical vapor deposition (PECVD). Examples of a starting material gas for forming the SiON film include, for instance, a mixed gas of monosilane ($SiH_4$), nitrous oxide gas ($N_2O$) and ammonia ($NH_3$). Preferably, the SiOx film is formed using tetraethyl orthosilicate (TEOS) gas as a starting material gas. The base coat film 22 may also comprise a silicon nitride (SiNx) film formed using, for instance, a mixed gas of monosilane ($SiH_4$) and ammonia ($NH_3$) as a starting material gas.

(2) Semiconductor Layer Formation Step

An amorphous silicon (a-Si) film having a film thickness of 50 nm is formed by PECVD. Examples of starting material gas for forming the a-Si film include, for instance, $SiH_4$, disilane ($Si_2H_6$). The a-Si film formed by PECVD comprises hydrogen, and hence a treatment for lowering the hydrogen concentration in the a-Si film is performed at about 500° C. (dehydrogenation treatment). Laser annealing is performed next, followed by formation of a p-Si film through melting, cooling and crystallization of the a-Si film. Laser annealing is performed, for instance, using an excimer laser. To form the p-Si film, as a pre-treatment of the laser annealing (in order to form continuous-grain (CG) silicon), a metallic catalyst, such as nickel, is applied without performing a dehydrogenation treatment, followed by solid-phase growth by way of a thermal treatment. To crystallize the a-Si film there may be performed solid-phase growth alone by way of a thermal treatment. Next, dry etching is performed using a mixed gas of carbon tetrafluoride ($CF_4$) and oxygen ($O_2$) to pattern the p-Si film and form the semiconductor layer 23.

(3) Gate Insulator Formation Step

Next, the gate insulator 24 comprising silicon oxide and having a film thickness of 45 nm is formed using TEOS gas as a starting material gas. The material of the gate insulator 24 is not particularly limited, and there may be used, for instance, a SiNx film or a SiON film. The starting material gas for forming the SiNx film and the SiON film may be the same as the starting material gas in the base coat film formation step described above. The gate insulator 24 may be a stack comprising the above-mentioned plurality of materials.

(4) Ion Doping Step

An impurity such as boron is doped into the semiconductor layer 23 by ion doping, ion implantation or the like, in order to control the threshold value of the TFT 29. More specifically, an impurity such as boron is doped into a semiconductor layer that constitutes an N channel-type TFT or a P channel-type TFT (first doping step), and then an impurity such as boron is further doped into the semiconductor layer that constitutes the N channel-type, in a state where the semiconductor layer that constitutes the P channel-type TFT is masked with a resist (second doping step).

The first doping step may be omitted if threshold value control of the P channel-type TFT is not necessary.

(5) Gate Electrode and Storage Capacitor Upper Electrode Formation Step

Next, a tantalum nitride (TaN) film having a film thickness of 30 nm, and a tungsten (W) film having a film thickness of 370 nm are formed, in this order, by sputtering. Next, a resist mask is formed by patterning a resist film to a desired shape, by photolithography, after which the gate electrode 25 and the storage capacitor upper electrode 66a are formed by dry etching using an etching gas in which there are adjusted the quantities of a mixed gas of, for instance, argon (Ar), sulfur hexafluoride ($SF_6$), carbon tetrafluoride ($CF_4$), oxygen ($O_2$), and chlorine ($Cl_2$). As the material of the gate electrode 25 and the storage capacitor upper electrode 66a there can be used a high-melting point metal having a planarized surface and stabilized characteristics, for instance tantalum (Ta), molybdenum (Mo), or molybdenum tungsten (MoW), or a low-resistivity metal such as aluminum (Al). The gate electrode 25 and the storage capacitor upper electrode 66a may be a stack comprising the above-described plurality of materials.

(6) Source/Drain Region Formation Step

Next, in order to form the source/drain regions of the TFT 29, the semiconductor layer 23 is heavily doped with an impurity such as phosphorus for an N channel-type TFT, or an impurity such as boron for a P channel-type TFT, by ion doping or ion implantation, using the gate electrode 25 as a mask. An LDD (lightly doped drain) region may also be formed in this case, as needed. Next, a thermal activation treatment is performed at about 700° C. for 6 hours in order to activate the impurity ions in the semiconductor layer 23. The electric conductivity of the source/drain regions can be enhanced thereby. Examples of the activation method include, for instance, irradiation of an excimer laser.

(7) Inorganic Insulating Film Formation Step

Next, the inorganic insulating film 41 is formed by PECVD on the entire surface of the insulating substrate 21, through formation of a SiNx film having a film thickness of 100 to 400 nm (preferably, 200 to 300 nm), and a TEOS film having a film thickness of 500 to 1000 nm (preferably, 600 to 800 nm). A SiON film or the like may also be used as the inorganic insulating film 41. A thin cap film (for instance, a TEOS film) about 50 nm thick may be formed under the inorganic insulating film 41 in order to suppress impairment of TFT characteristics, caused by transient degradation, and in order to stabilize the electric characteristics of the TFT 29.

(8) Contact Hole Formation Step

Next, a resist mask is formed by patterning a resist film to a desired shape, by photolithography, after which. the contact holes 31a, 31b, 31f are formed by wet etching of the gate insulator 24 and the inorganic insulating film 41 using a hydrofluoric acid-based etching solution. Etching may be dry etching.

(9) Hydrogenation Step

Thereafter, a thermal treatment is performed at about 400° C. for 1 hour in order to correct defects in crystalline Si by hydrogen supplied from the SiNx film of the inorganic insulating film 41.

(10) First Wiring Layer Formation Step

Next, a titanium (Ti) film having a film thickness of 100 nm, an aluminum (Al) film having a film thickness of 500 nm and a Ti film having a film thickness of 100 nm are formed in this order by sputtering or the like. Next, a resist mask is formed by patterning a resist film to a desired shape by photolithography, after which the Ti/Al/Ti metal multilayer film is patterned by dry etching to form the first wiring layer 61. As a result there are formed the connection terminal (external connection terminal) 26, the source/drain electrodes 28, the routing wiring 30a, the source electrode 34 and the drain electrode 35. An Al—Si alloy or the like may be used instead of Al, as the metal that makes up the first wiring layer 61. Herein, Al is used for lowering wiring resistance, but the above-described gate electrode materials (Ta, Mo, MoW, W, TaN or the like) may be used as the metal that makes up the first wiring layer 61 in a case where high heat resistance is required and a certain increase in resistance values is allowable (for instance, in case of short wiring structures).

(11) Organic-Inorganic Stack Formation Step

Next, the organic insulating film 51a is formed by forming (applying) a photosensitive resin film such as a photosensitive acrylic resin film to a film thickness of 1 to 5 μm (preferably, 2 to 3 μm) by spin coating or the like, on the entire surface of the insulating substrate 21. As the material of the organic insulating film 51a there can be used, for instance, non-photosensitive resins such as non-photosensitive acrylic resins, and photosensitive or non-photosensitive polyalkylsiloxane resins, polysilazane resins, polyimide resins and parellin resins. Other examples of materials of the organic insulating film 51a include methyl-containing polysiloxane (MSQ) materials and porous MSQ materials. Among the foregoing, using a photosensitive resin as the material of the organic insulating film 51a allows patterning the organic insulating film 51a through exposure to light and etching (development) of the photosensitive resin film prior to the formation of the inorganic insulating film 41a, as described in the organic-inorganic stack formation step (10) in Embodiment 1. Next, the inorganic insulating film 41a is formed on the entire surface of the insulating substrate 21 by forming, by sputtering or PECVD, a SiNx film having a film thickness of 10 to 200 nm (preferably, 20 to 100 nm), or a $SiO_2$ film having a film thickness of 10 to 200 nm (preferably, 20 to 100 nm) using TEOS gas as a starting material gas. A SiON film or the like may also be used as the inorganic insulating film 41a. Alternatively, a $SiO_2$ film or SiN film may be formed as the inorganic insulating film 41a by sputtering, CAT-CVD, ICP plasma CVD (for instance, a method that utilizes an ICP-CVD apparatus by SELVAC Co., Ltd), or ozone oxidation (for instance, a method that utilizes a Meiden Pure Ozone Generator by Meidensha Corporation). A high-quality film can be formed at low temperature by way of the above processes. As a result there is formed an organic-inorganic stack in which the inorganic insulating film 41a is stacked on the organic insulating film 51a. The organic insulating film 51a and the inorganic insulating film 41a may each be a stack of a plurality of films comprising dissimilar materials. The inorganic insulating film 41a need not necessarily be formed on the entire surface of the insulating substrate 21, provided that the inorganic insulating film 41a is formed so as to cover the organic insulating film 51a at least at the terminal area, the peripheral circuit region and the pixel region.

(12) Contact Hole Formation Step

Next, a resist mask is formed by patterning a resist film to a desired shape by photolithography, after which the contact holes 31c, 31g are formed by dry etching using a mixed gas of carbon tetrafluoride ($CF_4$) and oxygen ($O_2$) while adjusting the flow rate of both gases, and the organic insulating film 51a and the inorganic insulating film 41a are removed from the region at which the pad 27 is provided. The resist mask is ashed (stripped) using the inorganic insulating film 41a as a stopper material. The contact holes 31c, 31g can be microfabricated as a result, whereby the lower-layer first wiring layer 61 can have finer lines.

In this case, however, the uncovered wall surfaces of the openings of the organic insulating film 51a in the contact holes 31c, 31g may become ashed as well during O$_2$ ashing of the resist mask, whereby the wall surface of the openings of the organic insulating film 51a may recede with respect to the wall surface of the openings of the higher-layer inorganic insulating film 41a, such that the contact holes 31c, 31g overhang (take on a jutting shape). This may result in disconnection between the higher-layer second wiring layer 62 and the lower-layer first wiring layer 61 in the contact holes 31c, 31g.

(13) Second Wiring Layer Formation Step

Next, a titanium (Ti) film having a film thickness of 100 nm, an aluminum (Al) film having a film thickness of 500 nm and a Ti film having a film thickness of 100 nm are formed in this order by sputtering or the like. Next, a resist mask is formed by patterning a resist film to a desired shape by photolithography, after which the Ti/Al/Ti metal multi-layer film is patterned by dry etching, and the first wiring layer 62 is formed. The routing wiring 30b and the drain wiring 65 are formed as a result. An Al—Si alloy or the like may be used instead of Al as the metal that makes up the second wiring layer 62. Herein, Al is used for lowering wiring resistance, but the above-described gate electrode materials (Ta, Mo, MoW, W, TaN or the like) may be used as the metal that makes up the second wiring layer 62 in a case where high heat resistance is required and a certain increase in resistance values is allowable (for instance, in case of short wiring structures).

Herein, the openings of the organic insulating film 51a are covered by the second wiring layer 62, being wiring at a higher layer than the inorganic insulating film 41a. As a result, the openings of the organic insulating film 51a are covered by the second wiring layer 62, and the region of the organic insulating film 51a which is not covered by the second wiring layer 62 can be covered by the inorganic insulating film 41a. The organic insulating film 51a can be prevented as a result from being damaged by ashing or dry etching. This allows suppressing the occurrence of connection faults between wiring disposed at layers higher and lower than the organic-inorganic film stack.

(14) Organic Insulating Film Formation Step

Next, the organic insulating film 51 is formed by forming a photosensitive acrylic resin film having a film thickness of 1 to 3 μm (preferably, 2 to 3 μm) by spin coating or the like. As the material of the organic insulating film 51 there can be used, for instance, non-photosensitive resins such as non-photosensitive acrylic resins, and photosensitive or non-photosensitive polyalkylsiloxane resins, polysilazane resins, polyimide resins and parellin resins. Other examples of materials of the organic insulating film 51 include methyl-containing polysiloxane (MSQ) materials and porous MSQ materials.

Here, the organic insulating film 51 is formed on the entire surface of the substrate 21 through coating, by spin coating or the like, of a photosensitive acrylic resin, for instance a naphthoquinone diazide-based UV-curable resin, to a film thickness of 1 to 5 μm (preferably, 2 to 3 μm). Next, the region of the organic insulating film 51 that yields the contact hole 31j is removed by exposing the organic insulating film 51 via a photomask having formed therein a light-shielding pattern of desired shape, followed by etching (development). The organic insulating film 51 is subjected next to a baking step (for instance, at 200° C. for 30 minutes). Thereby, the shape of the opening (hole portion) of the organic insulating film 51 becomes less steep, and the aspect ratio of the contact hole 31j can be reduced. An ashing (stripping) step upon initial removal of the contact section of the organic insulating film 51 (portion that yields the contact hole 31j) becomes unnecessary.

(15) Pad and Pixel Section Formation Step

Next, an ITO film and/or an IZO film having a film thickness of 50 to 200 nm (preferably, 100 to 150 nm) is formed by sputtering or the like, and is then patterned to a desired shape by photolithography to form the pad 27 and a pixel section. A pixel electrode 36 is formed as a result, for each pixel, on the organic insulating film 51 in the display region. Thereafter, an alignment film (not shown) is coated onto the display region, and the alignment film is subjected to an aligning treatment to complete thereby the TFT substrate 11.

(16) Panel Assembly Step

Next, the liquid crystal display panel is manufactured by performing a bonding step of the TFT substrate 11 and the CF substrate, a liquid crystal material filling step, and a polarizer affixing step, as in conventional methods. The liquid crystal mode of the liquid crystal display panel is not particularly limited, and may be, for instance, a TN (Twisted Nematic) mode, an IPS (In Plane Switching) mode, a VATN (Vertical Alignment Twisted Nematic) mode, or a PSA mode. The liquid crystal display panel may be of domain-division type. The liquid crystal display panel may be of transmissive-type, of reflective type, or of semitransmissive-type (reflective/transmissive type). The liquid crystal display panel may be driven by passive matrix driving.

In the case of a PSA mode, the panel bonding step and the liquid crystal filling step are carried out as follows. Firstly, a sealing material is applied onto the outer periphery of the pixel region of the TFT substrate 11, and then a liquid crystal material wherein a polymerizable component is added to liquid crystal molecules having a negative dielectric constant, is dripped inward of the sealing material, using a dispenser or the like. The material that can be used as the polymerizable component is not particularly limited, and may be, for instance, a photopolymerizable monomer or a photopolymerizable oligomer. Next, the CF substrate is bonded to the TFT substrate 11 having the liquid crystal material dripped thereon. The process thus far is carried out in vacuum. Next, the bonded substrates are returned to the air atmosphere, whereupon the liquid crystal material diffuses between the bonded two substrates on account of atmospheric pressure. Next, the sealing material is cured through irradiation thereon of UV light while moving a UV light source along the region coated with the sealing material, to cure thereby the sealing material. Thus, the diffused liquid crystal material becomes sealed between the two substrates to form thereby the liquid crystal layer.

The method for filling the liquid crystal material may involve providing a liquid crystal filling port at periphery of the substrates, and filling the liquid crystal material through the port, followed by sealing of the liquid crystal filling port using a UV-curable resin or the like.

A polymerizable component light irradiation step is carried out next. Firstly, AC voltage is applied across the source electrode 34 and the common electrode of the CF substrate in a state where voltage that turns the TFT 29 on is applied to the gate electrode 25, and, while the liquid crystal molecules are tilted, UV light is irradiated onto the liquid crystal layer, from the side of the TFT substrate 11. The photopolymerizable monomer added to the liquid crystal material becomes polymerized as a result, and a polymer is formed that defines the pretilt angle of the liquid crystal molecules on the surface of the alignment films on the side of the liquid crystal layer.

(17) FCP Substrate Affixing Step

The TFT substrate 11 and the FPC board 70 are thermo-compression-bonded by way of via the ACF (anisotropic conductive film) 80, which is a resin adhesive (for instance, a thermosetting resin such as a thermosetting epoxy resin) having conductive microparticles 81 dispersed therein. The TFT substrate 11 and the FPC board 70 become connected and fixed to each other as a result. Even if rework is required, it is possible to suppress detachment of, or damage to, the organic insulating film 51a, since the organic insulating film 51a is protected by the inorganic insulating film 41a and is not in direct contact with the ACF 80. As a result, it becomes possible to reduce exposure of the first wiring layer 61 positioned below the organic insulating film 51a, to prevent thereby corrosion of the first wiring layer 61 caused by moisture and the like. It is also possible to suppress the occurrence of connection faults with the FPC board 70 caused by gas generated in the uncovered organic insulating film 51a.

Thereafter, polarizers are affixed to the outer faces of the TFT substrate 11 and the CF substrate, and the liquid crystal display panel and a backlight unit are combined together. The liquid crystal display device 100 of the present Embodiment can be completed thereby.

The liquid crystal display device 100 of the present Embodiment described above has enhanced reliability and enables wiring microfabrication.

Also, there is provided the inorganic insulating film 41a functioning as a gas-barrier insulating film, between the organic insulating film 51a and the pixel electrode 36, and hence faults caused by gas or bubbles in a PSA mode can be suppressed. That is, the inorganic insulating film 41a can protect the liquid crystal layer against intrusion of gas generated from layers lower than the organic insulating film 51a, even if gas is generated in a layer lower than the pixel electrode 36 as a result of irradiation of the organic insulating film 51a and the like with UV light in the polymerizable component light irradiation step, in a case where the organic insulating film 51a or the like is formed of a photosensitive resin. Formation of bubbles in the liquid crystal layer can therefore be suppressed.

In the present Embodiment, the organic insulating film 51a and/or the organic insulating film 51 may be planarizing films (inorganic planarizing films) comprising an inorganic insulating film. Films formed of a Si—H-containing polysiloxane (MSQ) material, or a porous silica film may be employed in this case. The liquid crystal display device 100 of the present Embodiment may have a planarizing film-inorganic film stack in which the inorganic insulating film is stacked directly on the planarizing film.

Variations of the present Embodiment are explained next.

Figure 7:
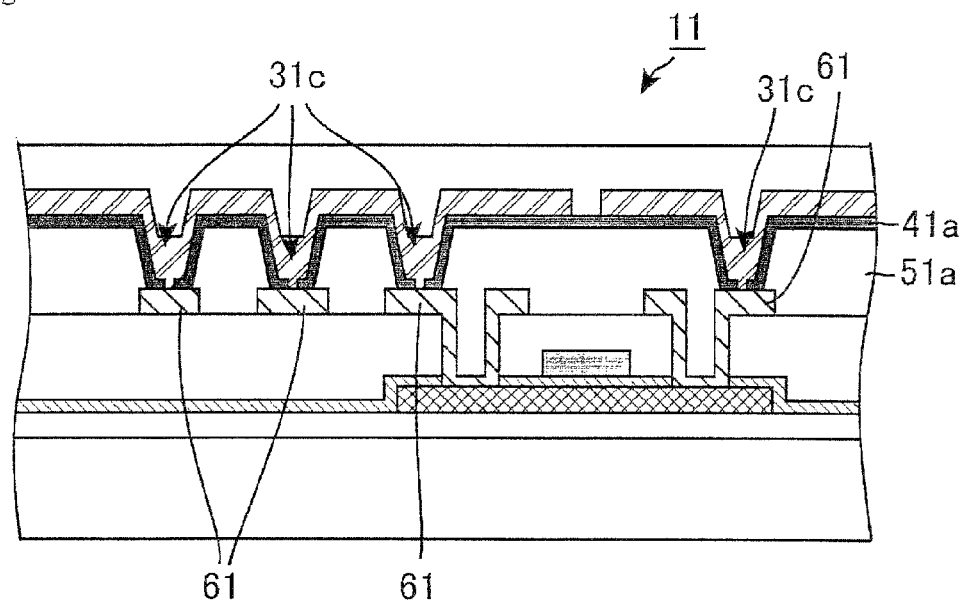
FIG. 7 is a cross-sectional schematic diagram illustrating a peripheral circuit region in a variation of the liquid crystal display device of Embodiment 3.
Figure 8:
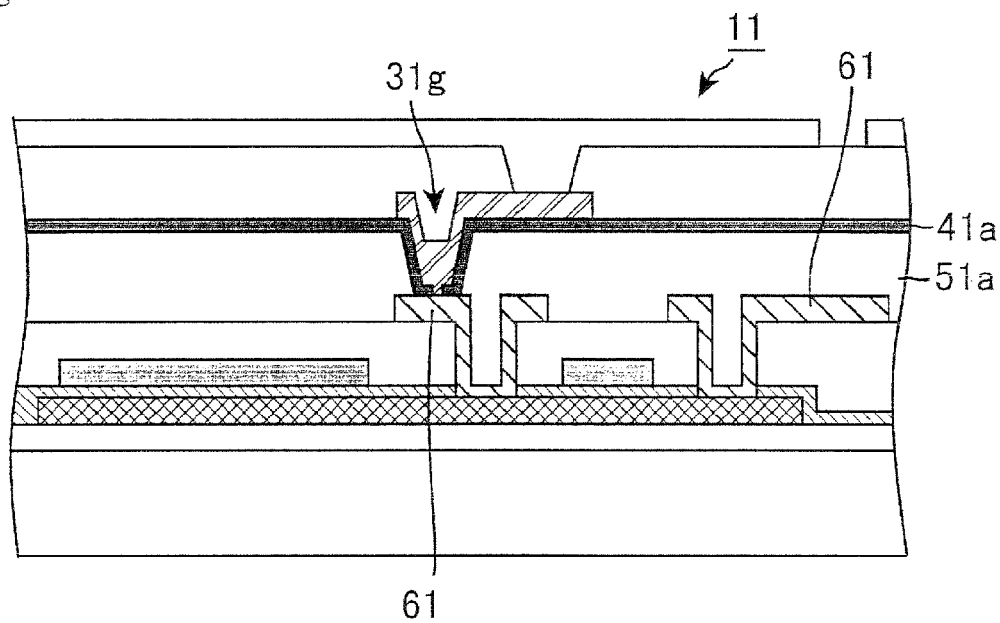
FIG. 8 is a cross-sectional schematic diagram illustrating a pixel region in a variation of the liquid crystal display device of Embodiment 3.

FIG. 7 is a cross-sectional schematic diagram illustrating a peripheral circuit region in a variation, of the liquid crystal display device of Embodiment 3. FIG. 8 is a cross-sectional schematic diagram illustrating a pixel region in a variation of the liquid crystal display device of Embodiment 3.

In the present variation, the organic insulating film 51a is formed by photoetching using a photosensitive resin, as illustrated in FIGS. 7 and 8. More specifically, the organic insulating film 51a is patterned by exposing a photosensitive resin film to light and etching the film (development) before formation of the inorganic insulating film 41a. The organic insulating film 51a is subjected next to a baking step (for instance, at 200° C. for 30 minutes). Thereby, the shape of the opening (hole portion) of the organic insulating film 51a becomes less steep, and the aspect ratio of the contact holes 31c, 31g can be reduced. An ashing (stripping) step upon initial removal of the contact section of the organic insulating film 51a (portion that yields the contact holes 31c, 31g) becomes unnecessary. Thereafter, the inorganic insulating film 41a is formed and dry-etched with carbon tetrafluoride ($CF_4$) or the like, to remove a region of the inorganic insulating film 41a that yields the contact holes 31c, 31g so as to overlap the removed region of the organic insulating film 51a. The contact holes 31c, 31g can be microfabricated, and the lower-layer first wiring layer 61 can have finer lines, through patterning of the inorganic insulating film 41a by dry etching. Thereafter, the resist mask is ashed by $O_2$ plasma, using the inorganic insulating film 41a as a stopper material. The contact holes 31c, 31g that run through the organic insulating film 51a and the inorganic insulating film 41a are formed as a result.

Thus, damage caused by a dry process can be suppressed by forming the inorganic insulating film 41a (passivation film) on the organic insulating film 51a comprising a photosensitive resin. More specifically, the entire surface of the organic insulating film 51a on the side of the liquid crystal layer 10 is covered by the inorganic insulating film 41a, during etching of the inorganic insulating film 41a by dry etching. That is, the side face (for instance, opening wall surface) and the top face of the organic insulating film 51a on the side of the liquid crystal layer 10 are covered by the inorganic insulating film 41a. This allows suppressing damage to the organic insulating film 51a caused by dry etching, and allows preventing damage to the organic insulating film 51a by oxygen plasma during resist ashing in the formation step of the contact holes 31c, 31g. In the light of the above, preferably, the entire opening wall surface of the organic insulating film 51a is covered by the inorganic insulating film 41a.

The inorganic insulating film 41a may be wet-etched. In this case, the resist mask may be stripped using a stripping solution. The organic insulating film 51a can be prevented as a result from being damaged by ashing or dry etching.

Figure 9A:
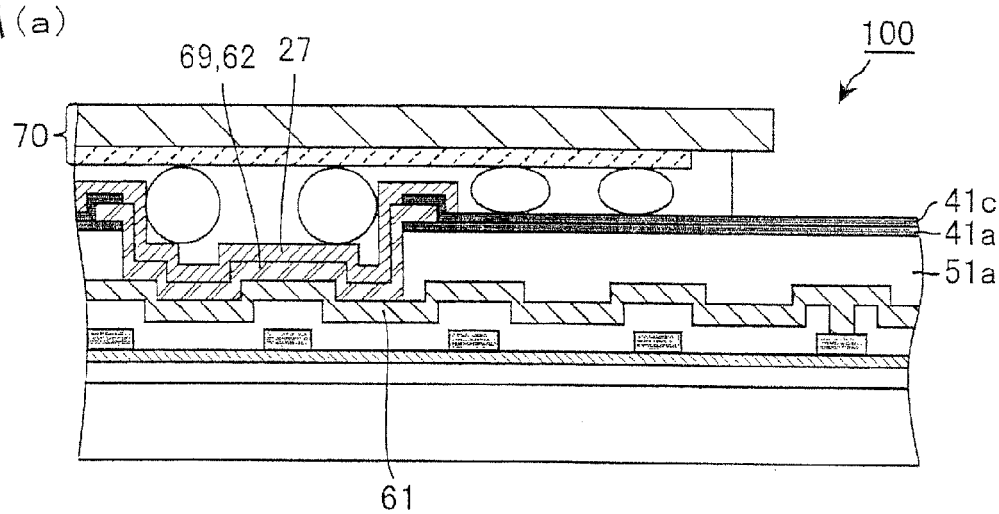
FIG. 9(a) illustrates a terminal area in a frame region.
Figure 9B:
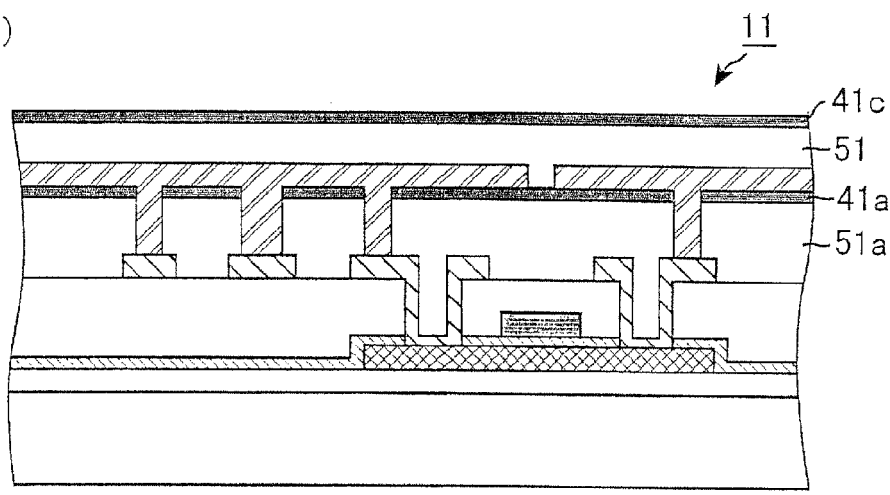
FIG. 9(b) illustrates a peripheral circuit section in the frame region.
Figure 10:
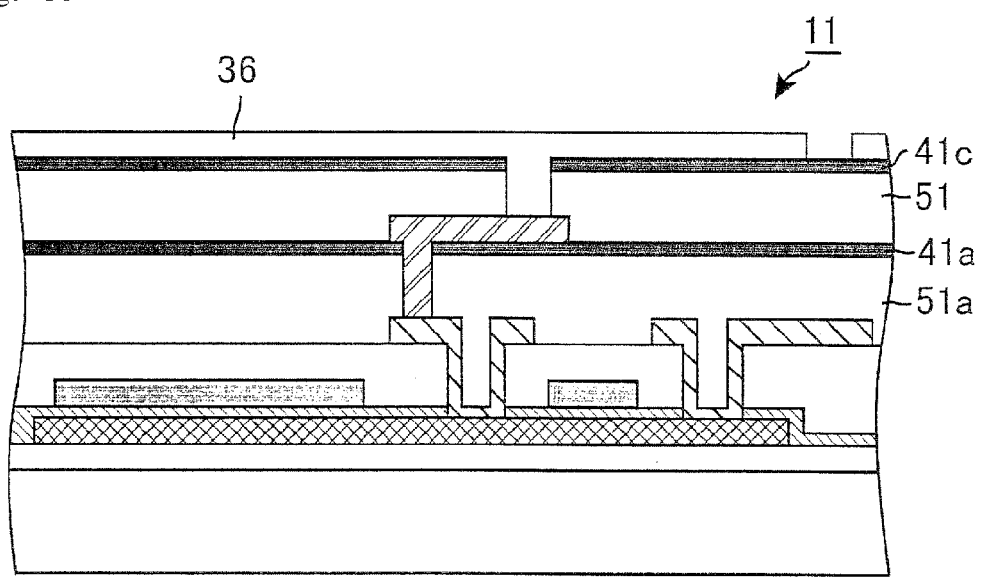
FIG. 10 is a cross-sectional schematic diagram illustrating a pixel region in a variation of the liquid crystal display device of Embodiment 3.

FIG. 9 is a cross-sectional schematic diagram illustrating a variation of the liquid crystal display device of Embodiment 3, wherein FIG. 9(a) illustrates a terminal area in a frame region, and FIG. 9(b) illustrates a peripheral circuit section in the frame region. FIG. 10 is a cross-sectional schematic diagram illustrating a pixel region in a variation of the liquid crystal display device of Embodiment 3.

In the present variation, an inorganic insulating film 41c functioning as a gas-barrier insulating film like the inorganic insulating film 41a is formed on the organic insulating film 51, as illustrated in FIGS. 9(b) and 10. That is, the stack of the organic insulating film 51 and the inorganic insulating film 41c is formed in the same way the stack of the organic insulating film 51a and the inorganic insulating film 41a.

The inorganic insulating films 41a, 41c that function as a gas-barrier insulating film are provided under the pixel electrode 36, and hence faults caused by gas or bubbles in a PSA mode can be further suppressed. That is, the inorganic insulating films 41a, 41c can protect, substantially completely, the liquid crystal layer against intrusion of gas generated from layers lower than the pixel electrode 36, even if gas is generated in a layer lower than the pixel electrode 36 as a result of irradiation of the organic insulating films 51a, 51 with UV light in the polymerizable component light irradiation step in the case where the organic insulating films 51a, 51 are formed of a photosensitive resin. Formation of bubbles in the liquid crystal layer can therefore be further suppressed.

As illustrated in FIG. 9(a), the organic insulating film 51 is not provided at the terminal area. At the terminal area, therefore, the inorganic insulating film 41c is directly stacked on the inorganic insulating film 41a. Thus, providing a stack of the inorganic insulating films 41a, 41c at the terminal area allows enhancing the mechanical strength of the films in a case where a single-layer inorganic insulating film 41a is provided. Therefore, this allows suppressing more effectively various faults caused by rework during thermocompression bonding of the FPC board 70.

In the present Embodiment, a wiring layer (nearest lower wiring layer 69, second wiring layer 62 in the present Embodiment) directly under a uppermost wiring layer is disposed below the pad 27 that is formed from a uppermost wiring layer (transparent conductive film such as an ITO film or IZO film) at the same level as that of the pixel electrode 36. The terminal resistance of the pad 27 can be reduced thereby. In case that the pad 27 is formed out of the uppermost wiring layer alone, then the uppermost wiring layer is ordinarily a transparent conductive film, such as an ITO film, and the sheet resistance value is high. However, the sheet resistance value of the pad 27 can arguably be reduced by using a stack structure with a lower-layer low-resistance wiring layer (first wiring layer 61 and/or second wiring layer 62). In case that the nearest lower wiring layer 69 is removed by dry etching or the like, however, the surface wiring layer under the nearest lower wiring layer 69 (first wiring layer 61 in the present Embodiment) is damaged by the etching. This damage gives rise to an increase in contact resistance between the wiring layer (first wiring layer 61) under the nearest lower wiring layer 69, and the uppermost wiring layer (transparent conductive film). Thereby, terminal resistance is increased. Preferably, therefore, the nearest lower wiring layer 69 remains under the uppermost wiring layer of the pad 27.

Figure 11A:
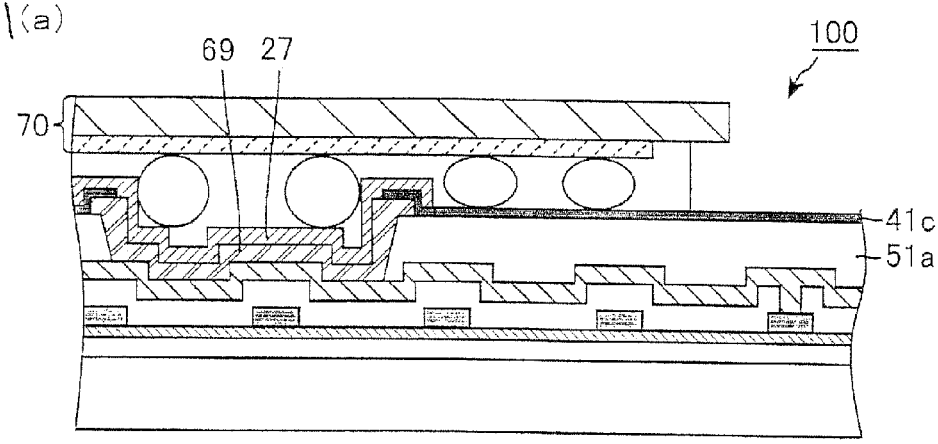
FIG. 11(a) illustrates a terminal area in a frame region.
Figure 11B:
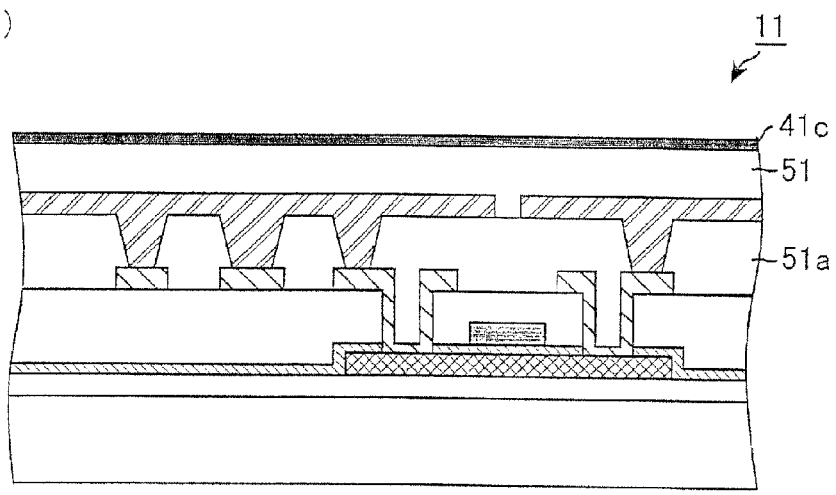
FIG. 11(b) illustrates a peripheral circuit section in the frame region.
Figure 12:
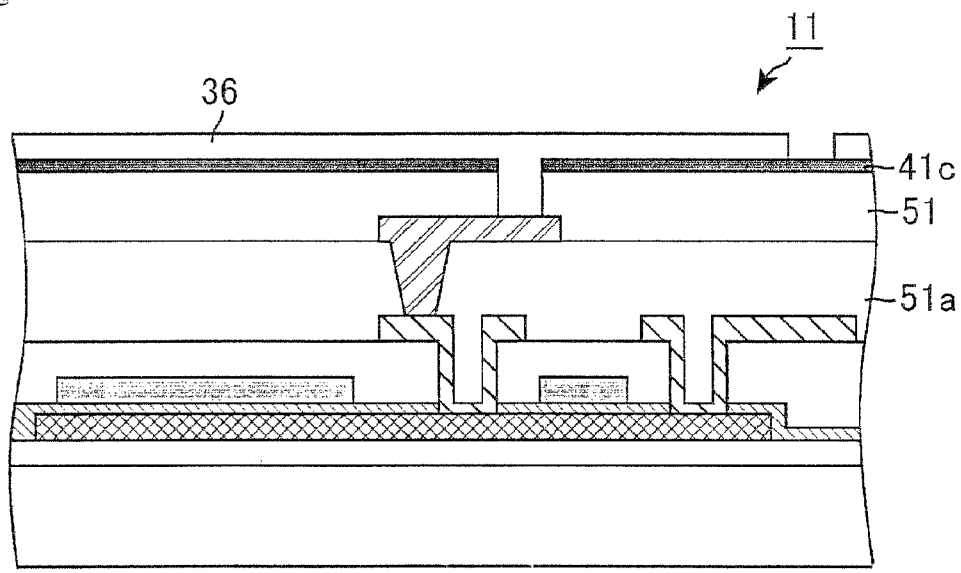
FIG. 12 is a cross-sectional schematic diagram illustrating a pixel region in a variation of the liquid crystal display device of Embodiment 3.

FIG. 11 is a cross-sectional schematic diagram illustrating a variation of the liquid crystal display device of Embodiment 3, wherein FIG. 11(a) illustrates a terminal area in a frame region, and FIG. 11(b) illustrates a peripheral circuit section in the frame region. FIG. 12 is a cross-sectional schematic diagram illustrating a pixel region in a variation of the liquid crystal display device of Embodiment 3.

In the present variation, the inorganic insulating film 41a is not formed. Instead, the inorganic insulating film 41c functioning as a gas-barrier insulating film like the inorganic insulating film 41a, is formed on the organic insulating film 51, as illustrated in FIG. 11(b) and FIG. 12.

The inorganic insulating film 41c functioning as a gas-barrier insulating film is provided under the pixel electrode 36, and hence faults caused by gas or bubbles in a PSA mode can be suppressed. That is, the inorganic insulating film 41c can protect, substantially completely, the liquid crystal layer against intrusion of gas generated from layers lower than the pixel electrode 36, even if gas is generated in a layer lower than the pixel electrode 36 as a result of irradiation of the organic insulating films 51a, 51 with UV light in the polymerizable component light irradiation step in the case where the organic insulating films 51a, 51 are formed of a photosensitive resin. Formation of bubbles in the liquid crystal layer can therefore be further suppressed. Also, the formation step of the inorganic insulating film 41a can be omitted, which allows simplifying the manufacturing process.

At the terminal area, as illustrated in FIG. 11(a), the inorganic insulating film 41c is stacked on the organic insulating film 51a, so that there is provided a stack of the organic insulating film 51a and the inorganic insulating film 41c. This allows suppressing various faults caused by rework during thermocompression bonding of the FTC board 70, similarly to the case where the inorganic insulating film 41a is used. The nearest lower wiring layer 69 is provided under the uppermost wiring layer of the pad 27. The organic insulating film 51a is formed by photoetching using a photosensitive resin, as illustrated in FIGS. 11 and 12.

Figure 13:
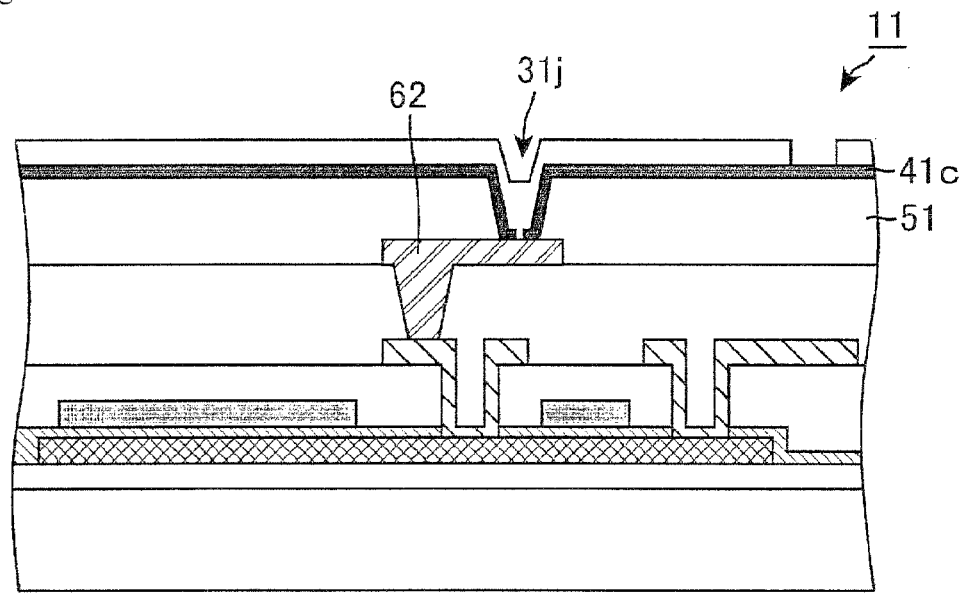
FIG. 13 is a cross-sectional schematic diagram illustrating a pixel region in a variation of the liquid crystal display device of Embodiment 3.

FIG. 13 is a cross-sectional schematic diagram illustrating a pixel region in a variation of the liquid crystal display device of Embodiment 3.

The present variation has the same configuration as that in the example illustrated in FIG. 12, but now the organic insulating film 51 is formed by photoetching using a photosensitive resin, as illustrated in FIG. 13. Specifically, the organic insulating film 51 is patterned by exposing a photosensitive resin film to light and etching the film (development) before formation of the inorganic insulating film 41c. The organic insulating film 51 is subjected next to a baking step (for instance, at 200° C. for 30 minutes). Thereby, the shape of the opening (hole portion) of the organic insulating film 51 becomes less steep, and the aspect ratio of the contact hole 31j can be reduced. An ashing (stripping) step upon initial removal of the contact section of the organic insulating film 51 (portion that yields the contact hole 31j) becomes unnecessary. Thereafter, the inorganic insulating film 41c is formed and dry-etched with carbon tetrafluoride ($CF_4$) or the like, to remove a region of the inorganic insulating film 41c that yields the contact hole 31j so as to overlap the removed region of the organic insulating film 51. The contact hole 31j can be microfabricated, and the lower-layer second wiring layer 62 can have finer lines, through patterning of the inorganic insulating film 41c by dry etching. Thereafter, the resist mask is ashed by $O_2$ plasma, using the inorganic insulating film 41c as a stopper material. The contact hole 31j that runs through the organic insulating film 51 and the inorganic insulating film 41c is formed as a result.

Thus, damage caused by a dry process can be suppressed by forming the inorganic insulating film 41c (passivation film) on the organic insulating film 51 comprising a photosensitive resin. More specifically, the entire surface of the organic insulating film 51 on the side of the liquid crystal layer is covered by the inorganic insulating film 41c during etching of the inorganic insulating film 41c by dry etching. That is, the side face (for instance, opening wall surface) and the top face of the organic insulating film 51 on the side of the liquid crystal layer are covered by the inorganic insulating film 41c. This allows suppressing damage to the organic insulating film 51 caused by dry etching, and allows preventing damage to the organic insulating film 51 by oxygen plasma during resist ashing in the formation step of the contact hole 31j. In the light of the above, preferably, the entire opening wall surface of the organic insulating film 51 is covered by the inorganic, insulating film 41c.

The inorganic insulating film 41c may be wet-etched. In this case, the resist mask may be stripped using a stripping solution. Therefore, the organic insulating film 51 can be prevented as a result from being damaged by ashing or dry etching.

Figure 14A:
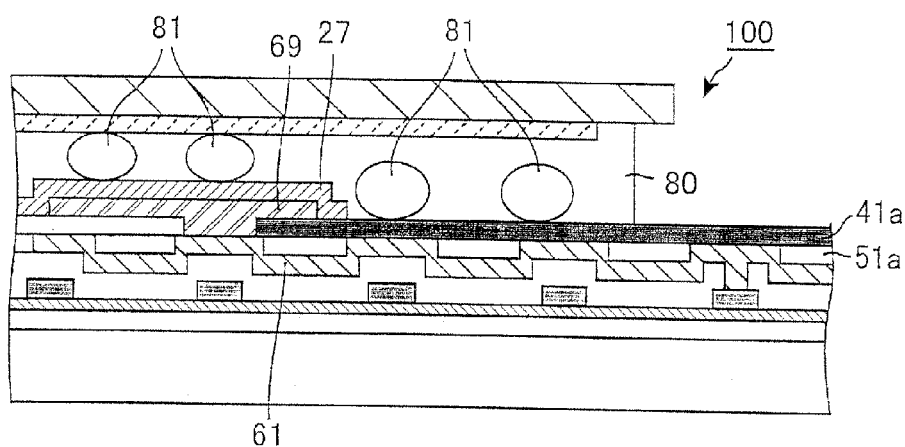
FIG. 14(a) illustrates a terminal area in a frame region.
Figure 14B:
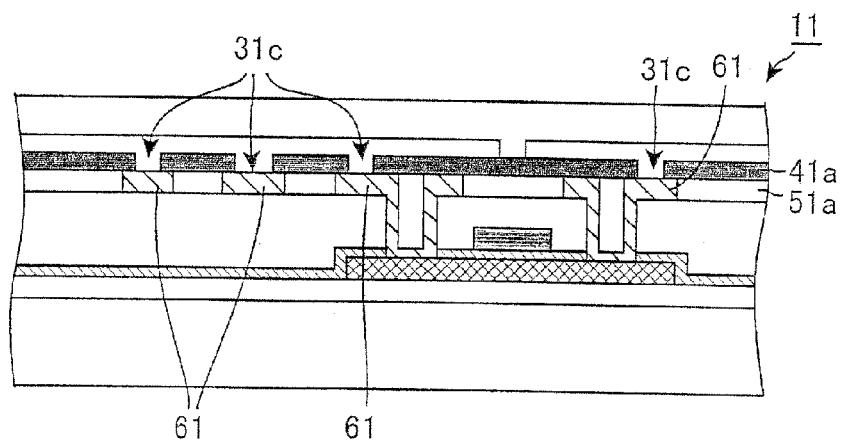
FIG. 14(b) illustrates a peripheral circuit section in the frame region.
Figure 15:
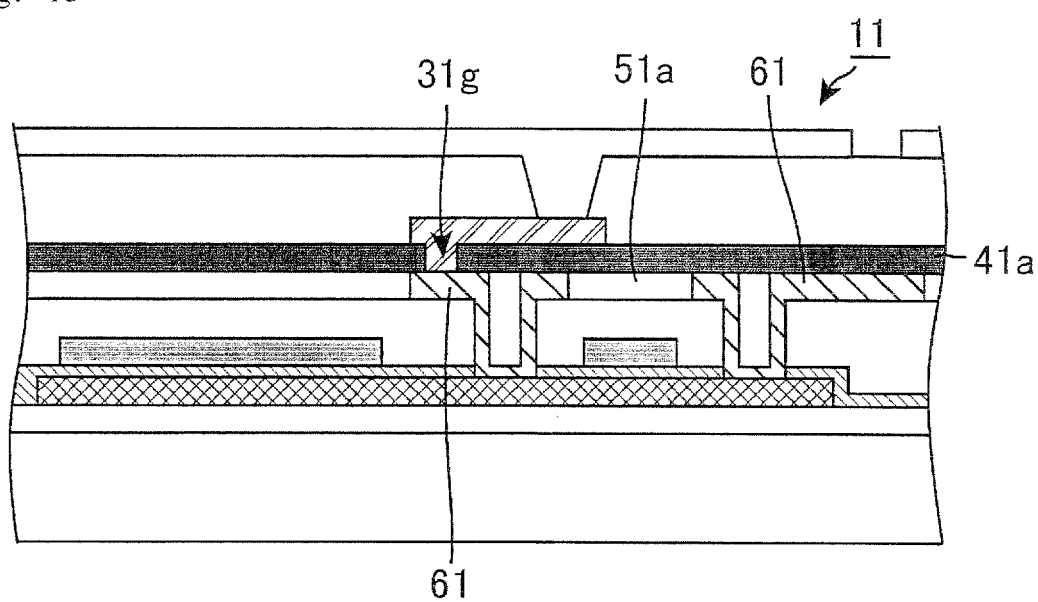
FIG. 15 is a cross-sectional schematic diagram illustrating a pixel region in a variation of the liquid crystal display device of Embodiment 3.

FIG. 14 is a cross-sectional schematic diagram illustrating a variation of the liquid crystal display device of Embodiment 3, wherein FIG. 14(a) illustrates a terminal area in a frame region, and FIG. 14(b) illustrates a peripheral circuit section in the frame region. FIG. 15 is a cross-sectional schematic diagram illustrating a pixel region in a variation of the liquid crystal display device of Embodiment 3.

In the present variation, the organic insulating film 51a is subjected to etch-back, as illustrated in FIGS. 14, 15. More specifically, after formation of the organic insulating film 51a, the organic insulating film 51a is subjected to etch-back, by dry etching, until the first wiring layer 61 is uncovered. Next, the inorganic insulating film 41a is formed, and regions that become the contact holes 31c, 31g of the inorganic insulating film 41a are removed by dry etching using carbon tetrafluoride ($CF_4$) or the like. In the present variation, the level difference between the pad 27 and regions other than the pad 27 is reduced by the thickness of the organic insulating film 51a. As a result, the difference in the extent of deformation of the conductive microparticles 81 in the ACF 80 between the pad 27 and regions other than the pad 27 is reduced, and the contact performance of the ACF can be enhanced.

The nearest lower wiring layer 69 is provided under the uppermost wiring layer of the pad 27 at the terminal area, as illustrated in FIG. 14(a).

Figure 16A:
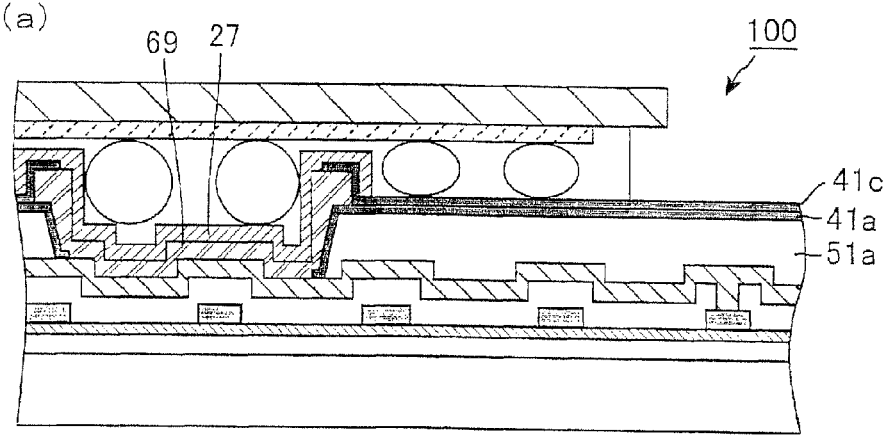
FIG. 16(a) illustrates a terminal area in a frame region.
Figure 16B:
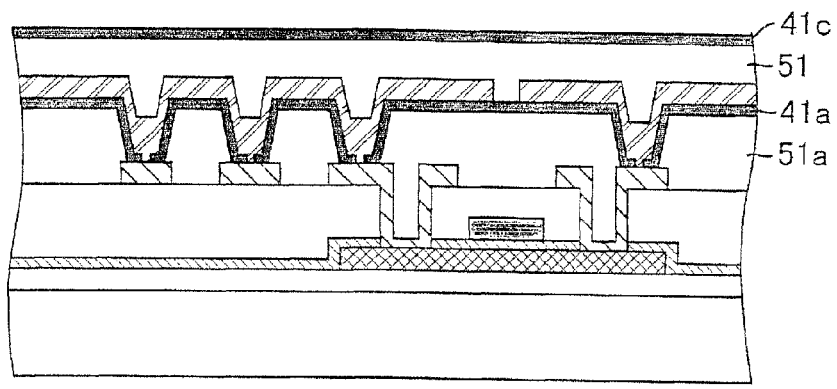
FIG. 16(b) illustrates a peripheral circuit section in the frame region.
Figure 17:
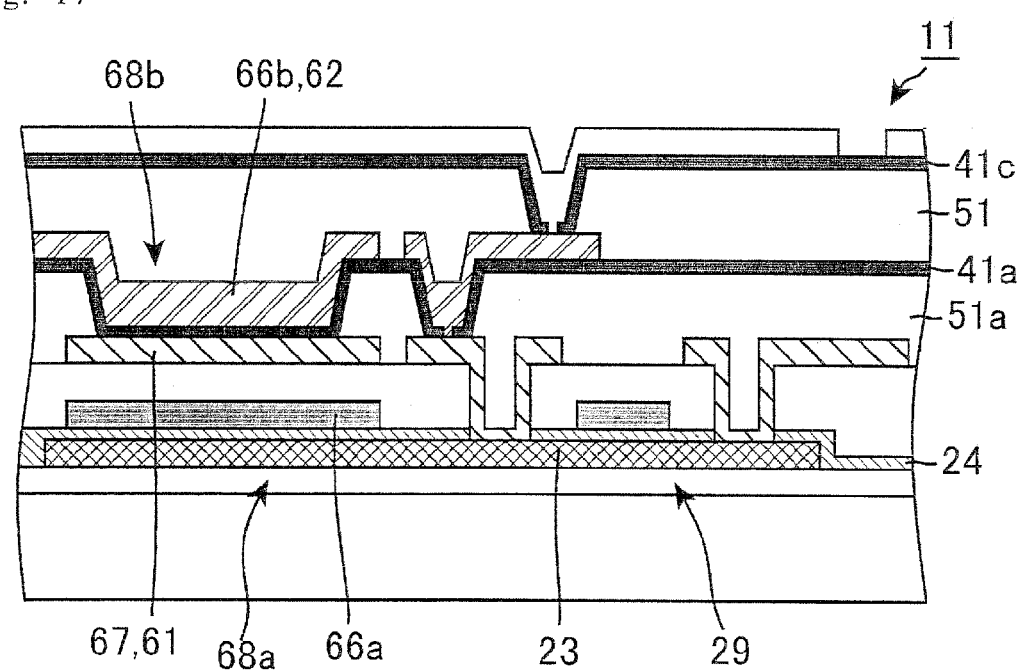
FIG. 17 is a cross-sectional schematic diagram illustrating a pixel region in a variation of the liquid crystal display device of Embodiment 3.

FIG. 16 is a cross-sectional schematic diagram illustrating a variation of the liquid crystal display device of Embodiment 3, wherein FIG. 16(a) illustrates a terminal area in a frame region, and FIG. 16(b) illustrates a peripheral circuit section in the frame region. FIG. 17 is a cross-sectional schematic diagram illustrating a pixel region in a variation of the liquid crystal display device of Embodiment 3.

In the present variation, as illustrated in FIG. 17, a second storage capacitor lower electrode 67 formed by the first wiring layer 61 and a second storage capacitor upper electrode 66b formed by the second wiring layer 62 are provided overlapping the region of the storage capacitor upper electrode 66a. The organic insulating film 51a at the region overlapped by the storage capacitor lower electrode 67 and the storage capacitor upper electrode 66b is removed, so that the storage capacitor lower electrode 67 and the storage capacitor upper electrode 66b are disposed facing each other across the inorganic insulating film 41a. Thus, each pixel is provided not only with a pixel storage capacitor 68a that comprises the semiconductor layer 23, the gate insulator 24 and the storage capacitor upper electrode 66a, but also with a second pixel storage capacitor 68b that comprises the storage capacitor lower electrode 67, the inorganic insulating film 41a and the storage capacitor upper electrode 66b. This allows reducing the size (surface area) of the pixel storage capacitor 68a and of the pixel storage capacitor 68b, as compared with a case in which only one pixel storage capacitor 68a is formed in one pixel. The pixel aperture ratio can be enhanced thereby.

As illustrated in FIGS. 16, 17, the organic insulating films 51a, 51 are formed by photoetching using a photosensitive resin, after which the inorganic insulating films 41a, 41c are formed and patterned by etching. At the terminal area, as illustrated in FIG. 16(a), a stack of the inorganic insulating films 41a, 41c is formed on the organic insulating film 51a. The nearest lower wiring layer 69 is provided under the uppermost wiring layer of the pad 27.

Embodiment 4

FIG. 18 is a cross-sectional schematic diagram of a frame region in a liquid crystal display device of Embodiment 4, wherein FIG. 18(a) illustrates a terminal area, and FIG. 18(b) illustrates a peripheral circuit region. Recurrent features common to the present Embodiment and Embodiment 3 will not be explained again.

A liquid crystal display device 200 of the present Embodiment has a structure in which a stack of an organic insulating film 51b and an inorganic insulating film 41b is further formed on the stack of the organic insulating film 51a and the inorganic insulating film 41 of the liquid crystal display device of Embodiment 3.

More specifically, as shown in FIG. 18(a), a TFT substrate 12 of the present Embodiment has a structure wherein routing wiring 30c comprising the second wiring layer 62 and the stack of the organic insulating film 51b and the inorganic insulating film 41b, functioning as a protective film, are further stacked, in this order from the side of the insulating substrate 21, on the stack of the inorganic insulating film 41a and the organic insulating film 51a functioning as an interlayer insulating film and a planarizing film, at the terminal area. The routing wiring 30c comprising the second wiring layer 62 is connected to the connection terminal (external connection terminal) 26 comprising the first wiring layer 61 by way of a contact hole (via hole) 31d provided in the organic insulating film 51a and the inorganic insulating film 41a.

As illustrated in FIG. 18(b), the TFT substrate 12 has a structure wherein the stack of the inorganic insulating film 41b and the organic insulating film 51b functioning as an interlayer insulating film and a planarizing film, and routing wiring 30d comprising a third wiring layer 63, are further stacked, in this order, from the side of the insulating substrate 21, on the second wiring layer 62, at the peripheral circuit region. The routing wiring 30d comprising the third wiring layer 63 is connected to the routing wiring 30b comprising the second wiring layer 62 by way of a contact hole (via hole) 31e provided in the organic insulating film 51b and the inorganic insulating film 41b.

Thus, the liquid crystal display device 200 of the present Embodiment allows forming yet more wiring layers that are amenable to microfabrication.

The number of supplementary wiring layers and the number of the stacks of the organic insulating film and the inorganic insulating film are not particularly limited, and may be appropriately selected in accordance with the desired layout.

The liquid crystal display device 200 of the present Embodiment can be manufactured by appropriately repeating the organic-inorganic stack formation step (11), the contact hole formation step (12), and the second wiring layer formation step (13) of Embodiment 3 as many times as needed. The film thicknesses of the organic insulating film 51b and the inorganic insulating film 41b may be 1 to 4 μm (preferably 2 to 3 μm) and 10 to 200 nm (preferably 20 to 100 nm), respectively. The material of the organic insulating film 51b and the material of the inorganic insulating film 41b may be the same as, or different from, those of the organic insulating film 51a and the inorganic insulating film 41a, respectively. The organic insulating film 51a and the organic insulating film 51b, as well as the inorganic insulating film 41a and the inorganic insulating film 41b may be formed of out of respectively dissimilar materials.

In the present Embodiment, the organic insulating film 51a, the organic insulating film 51b and the organic insulating film 51 may be planarizing films (inorganic planarizing films) comprising an inorganic insulating film. Films formed of a Si—H-containing polysiloxane (MSQ) material, or a porous silica film may be employed in this case. The liquid crystal display device 200 of the present Embodiment may have a planarizing film-inorganic film stack in which the inorganic insulating film is stacked directly on the planarizing film.

Figure 19A:
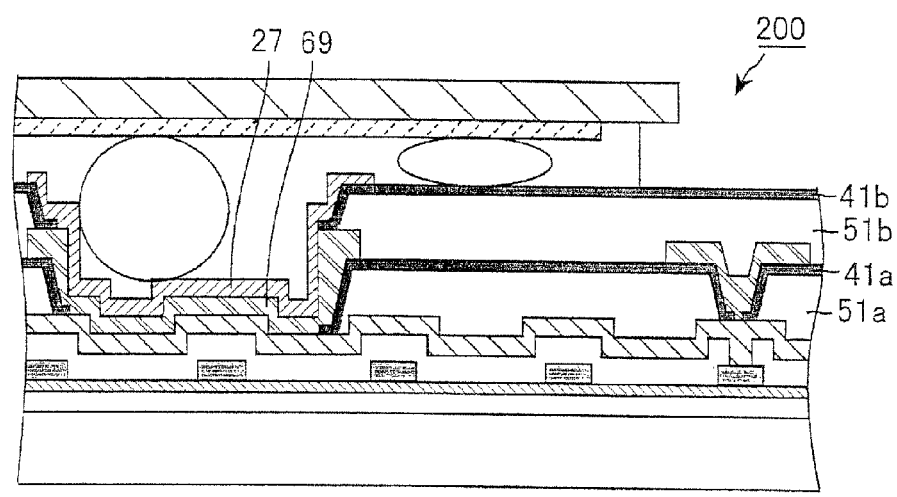
FIG. 19(a) illustrates a terminal area in a frame region.
Figure 19B:
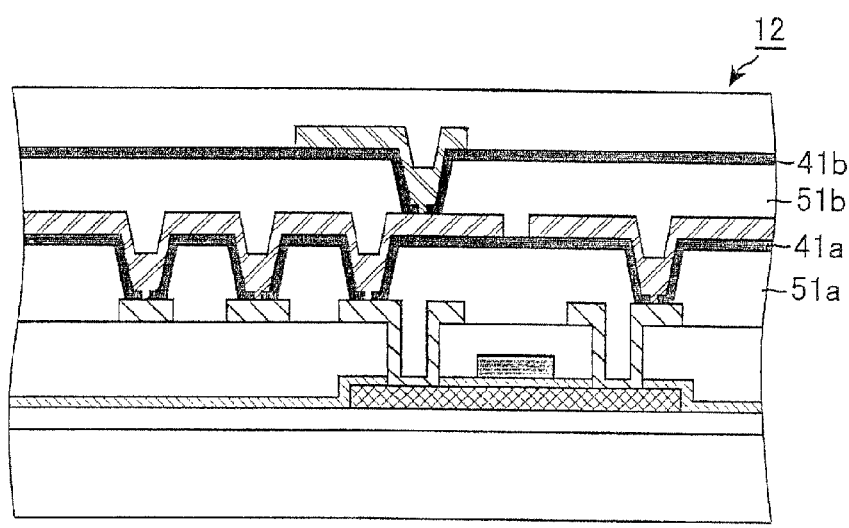
FIG. 19(b) illustrates a peripheral circuit section in the frame region.

FIG. 19 is a cross-sectional schematic diagram illustrating a variation of the liquid crystal display device of Embodiment 4, wherein FIG. 19(a) illustrates a terminal area in a frame region, and FIG. 19(b) illustrates a peripheral circuit section in the frame region.

In the present variation, the organic insulating films 51a, 51b are formed by photoetching using a photosensitive resin, as illustrated in FIG. 19, after which the inorganic insulating films 41a, 41b are formed and patterned by etching. The nearest lower wiring layer 69 is provided under the pad 27 formed by the uppermost wiring layer, at the terminal area, as illustrated in FIG. 19(a).

Embodiment 5

Figure 20:
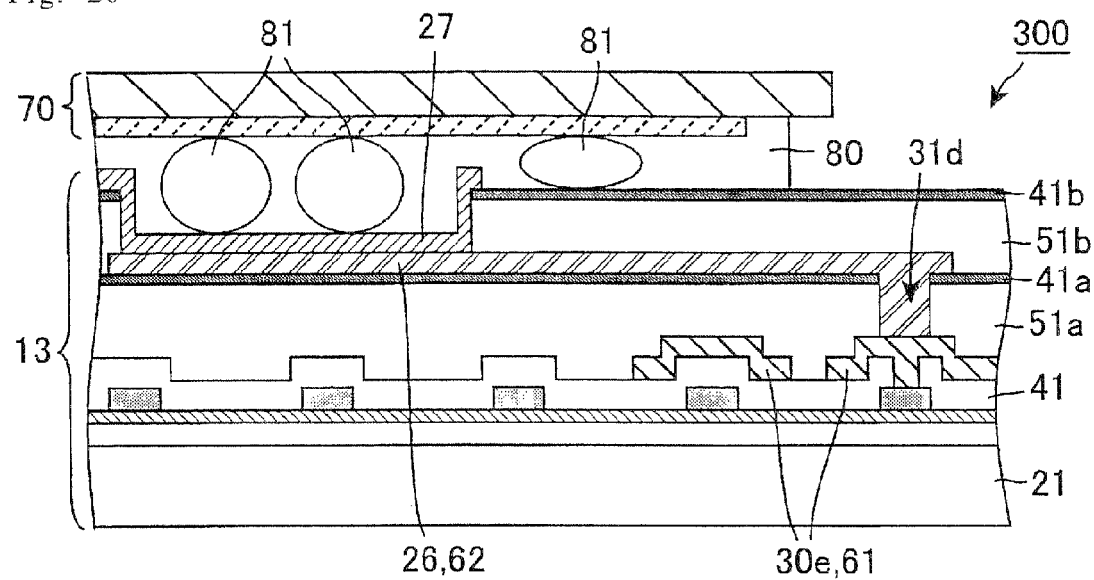
FIG. 20 is a cross-sectional schematic diagram of a terminal area in a liquid crystal display device of Embodiment 5.

FIG. 20 is a cross-sectional schematic diagram of a terminal area in a liquid crystal display device of Embodiment 5. Recurrent features common to the present Embodiment and Embodiments 3 and 4 will not be explained again.

A liquid crystal display device 300 of the present Embodiment has the same configuration as that of the liquid crystal display device 200 of Embodiment 4, except that now the connection terminal (external connection terminal) 26 is not formed out of the first wiring layer 61 but out of the higher-layer second wiring layer 62.

More specifically, as illustrated in FIG. 20, a TFT substrate 13 of the present Embodiment has a structure wherein, at a terminal area, an insulating substrate 41 has sequentially stacked thereon, from the side of the insulating substrate 21, routing wiring 30e comprising the first wiring layer 61, a stack of the inorganic insulating film 41a and the organic insulating film 51a functioning as an interlayer insulating film and a planarizing film, a connection terminal (external connection terminal) 26 comprising the second wiring layer 62, and a stack of the inorganic insulating film 41b and the organic insulating film 51b functioning as a protective film. The connection terminal (external connection terminal) 26 comprising the second wiring layer 62 is connected to the routing wiring 30e comprising the first wiring layer 61 by way of a contact hole (via hole) 31d provided in the organic insulating film 51a and the inorganic insulating film 41a.

In the liquid crystal display device 200 of Embodiment 4, a greater number of stack structures of the wiring layer and the stack of the inorganic insulating film and the organic insulating film entails a greater difference in the extent of deformation of the conductive microparticles 81 in the ACF 80 between the pad 27 and regions other than the pad 27. As a result, this may give rise to non-uniform stress, which may result in connection faults between the TET substrate 12 and the FPC board 70.

By contrast, the recess defined by the pad 27 is smaller in the liquid crystal display device 300 of the present Embodiment as a result of the connection terminal 26 being formed of a layer at a level as high as possible, preferably out of the wiring layer directly under the uppermost stack of the inorganic insulating film and the organic insulating film (second wiring layer 62 of the present Embodiment). The difference in the extent of deformation of the conductive microparticles 81 in the ACF 80 between the pad 27 and regions other than the pad 27 can be thus reduced, which allows suppressing occurrence of connection faults caused by nonuniform stress.

In the present Embodiment, the organic insulating film 51a and/or the organic insulating film 51b may be planarizing films (inorganic planarizing films) comprising an inorganic insulating film. Films formed of a Si—H-containing polysiloxane (MSQ) material, or a porous silica film, may be employed in this case. The liquid crystal display device 300 of the present Embodiment may have a planarizing film-inorganic film stack in which the inorganic insulating film is stacked directly on the planarizing film.

Figure 21:
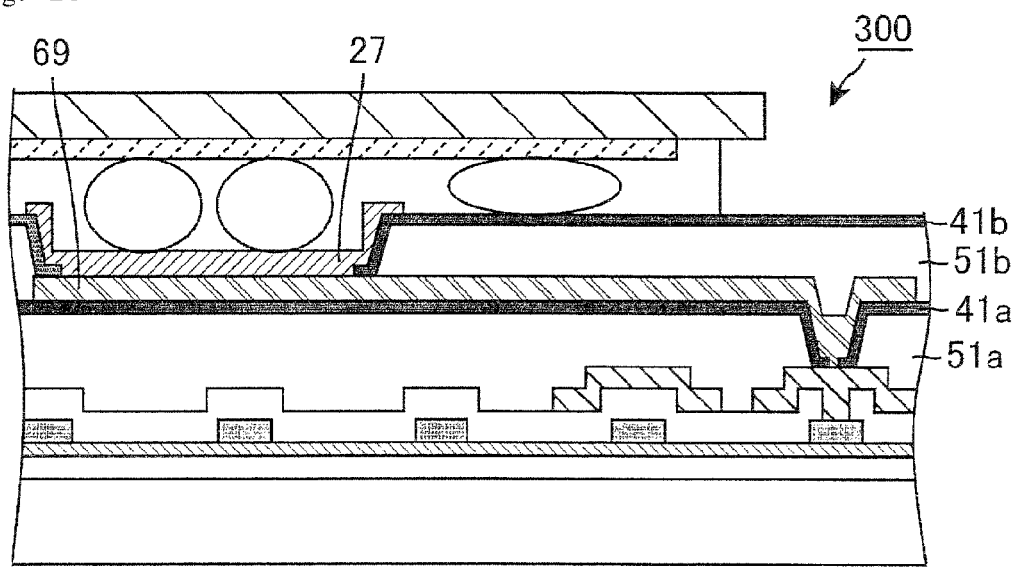
FIG. 21 is a cross-sectional schematic diagram illustrating a variation of the liquid crystal display device of Embodiment 5.

FIG. 21 is a cross-sectional schematic diagram illustrating a terminal area in a frame region in a variation of the liquid crystal display device of Embodiment 5.

In the present variation, the organic insulating films 51a, 51b are formed by photoetching using a photosensitive resin, as illustrated in FIG. 21, after which the inorganic insulating films 41a, 41b are formed and patterned then by etching.

Figure 22A:
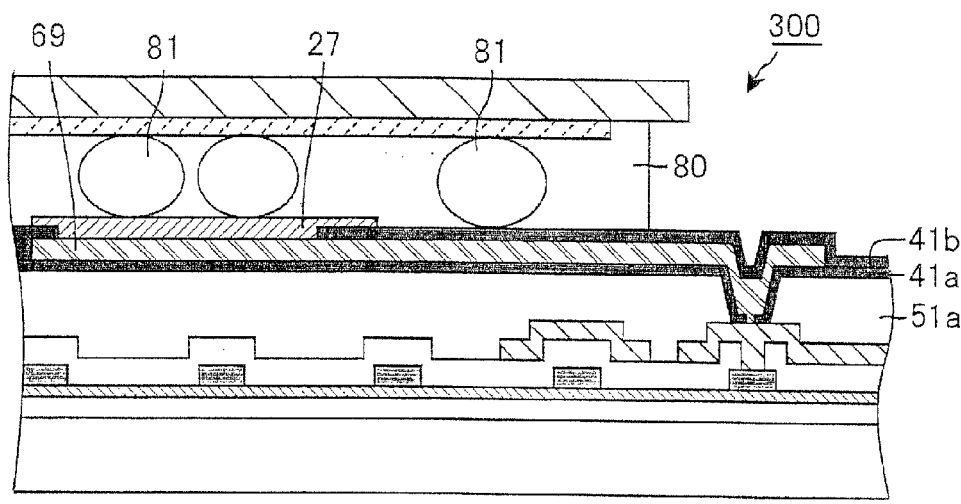
FIG. 22(a) illustrates a terminal area in a frame region.
Figure 22B:
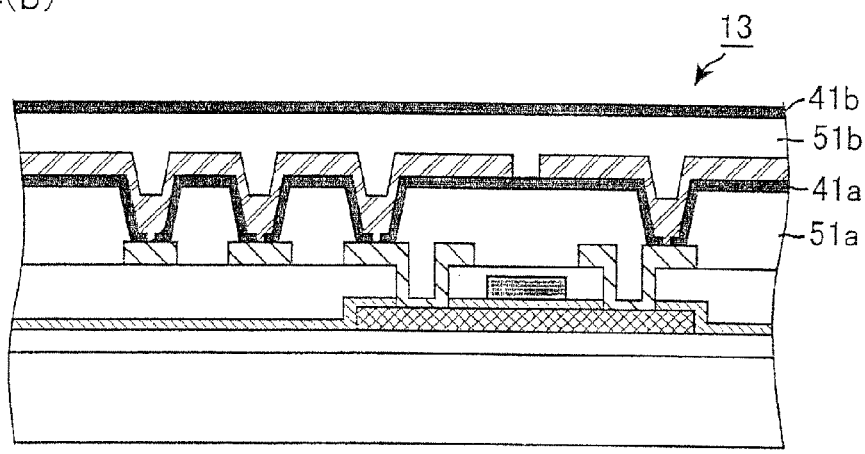
FIG. 22(b) illustrates a peripheral circuit section in the frame region.
Figure 23:
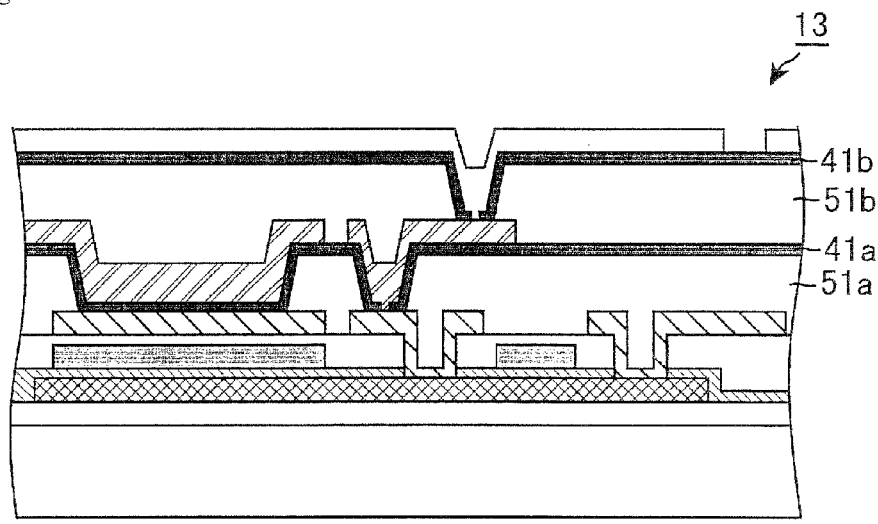
FIG. 23 is a cross-sectional schematic diagram illustrating a pixel region in a variation of the liquid crystal display device of Embodiment 3.

FIG. 22 is a cross-sectional schematic diagram illustrating a variation of the liquid crystal display device of Embodiment 5, wherein FIG. 22(a) illustrates a terminal area in a frame region, and FIG. 22(b) illustrates a peripheral circuit section in the frame region. FIG. 23 is a cross-sectional schematic diagram illustrating a pixel region in a variation of the liquid crystal display device of Embodiment 3.

As illustrated in FIG. 22(a), the organic insulating film 51b is removed from the terminal area, and the inorganic insulating film 41b is formed directly on the connection terminal 26. In the present variation, the level difference between the pad 27 and the region other than the pad 27 is reduced by the thickness of the organic insulating film 51b. Therefore, the difference in the extent of deformation of the conductive microparticles 81 in the ACF 80 between the pad 27 and regions other than the pad 27 is reduced, and the contact performance ACF can be enhanced.

The nearest lower wiring layer 69 is provided under the uppermost wiring layer of the pad 27. In the present variation, the organic insulating films 51a, 51b are formed by photoetching using a photosensitive resin, as illustrated in FIGS. 22(b), 23, after which the inorganic insulating films 41a, 41b are formed and patterned then by etching.

Embodiment 6

Figure 24:
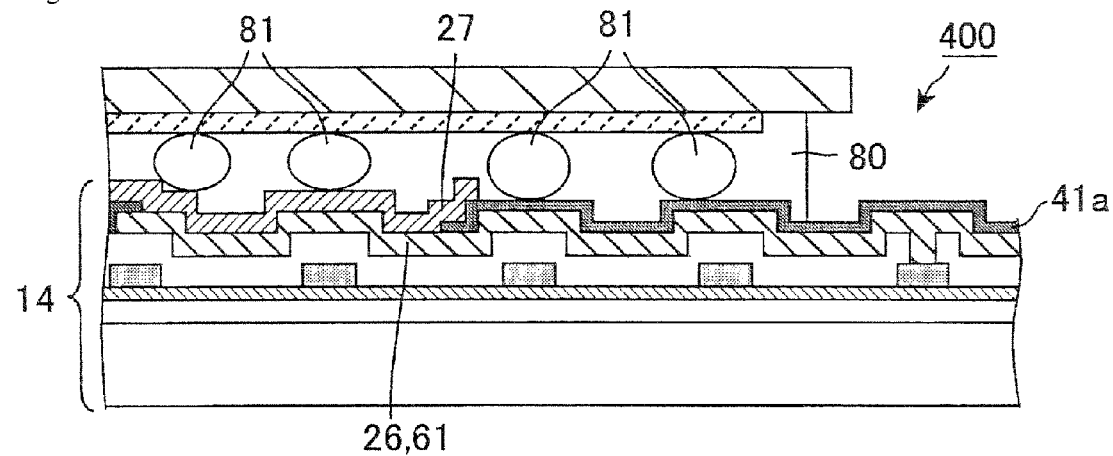
FIG. 24 is a cross-sectional schematic diagram of a terminal area in a liquid crystal display device of Embodiment 6.

FIG. 24 is a cross-sectional schematic diagram of a terminal area in a liquid crystal display device of Embodiment 6. Recurrent features common to the present Embodiment and Embodiments 3 to 5 will not be explained again.

A liquid crystal display device 400 of the present Embodiment has the same configuration as that of the liquid crystal display device 100 of Embodiment 3, except that now all the organic insulating films are removed at the terminal area.

More specifically, a TFT substrate 14 has a structure in which, as illustrated in FIG. 7, the inorganic insulating film 41a functioning as a protective film is directly stacked on the connection terminal (external connection terminal) 26 comprising the first wiring layer 61, at the terminal area.

As long as the organic insulating film is present at the terminal area, as in the liquid crystal display devices 100, 200 and 300 of Embodiments 3 to 5, it is difficult to completely solve the problem of lower reliability caused by rework of the FPC board 70. Although the liquid crystal display device 300 of Embodiment 5 allows suppressing occurrence of connection faults caused by nonuniform stress, there still exists a level difference between the pad 27 and regions other than the pad 27, equivalent to the film thicknesses of the organic insulating film 51b and the inorganic insulating film 41b. Therefore, the difference in the extent of deformation of the conductive microparticles 81 in the ACF 80 is not completely uniform over the pad 27 and the region other pad 27. The contact performance of the ACF has thus room for improvement.

The liquid crystal display device 400 of the present Embodiment, by contrast, has a structure in which the terminal area has no organic insulating film that becomes problematic during rework, and hence the above-described lower reliability caused by rework can be totally improved. The level difference between the pad 27 and the region other than the pad 27 is reduced by the thickness of the organic insulating film. Therefore, the difference in the extent of deformation of the conductive microparticles 81 in the ACF 80 between the pad 27 and regions other than the pad 27 is reduced, and the contact performance ACF can be enhanced.

The liquid crystal display device 400 of the present Embodiment can be manufactured in the same way as the liquid crystal display device 100 of Embodiment 3, except that now no organic insulating film is formed at the terminal area.

In the present Embodiment, preferably, the organic insulating film is not formed in at least a region at which an anisotropic conductive material, such as the ACF 80, is provided.

Figure 25:
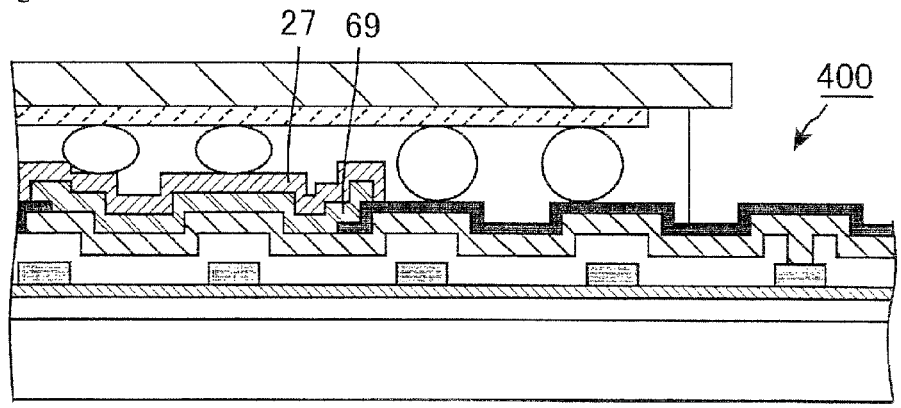
FIG. 25 is a cross-sectional schematic diagram illustrating a variation of the liquid crystal display device of Embodiment 6.

FIG. 25 is a cross-sectional schematic diagram illustrating a variation of the liquid crystal display device of Embodiment 6.

In the present variation, as illustrated in FIG. 25, the nearest lower wiring layer 69 is provided under the uppermost wiring layer of the pad 27.

Figure 26:
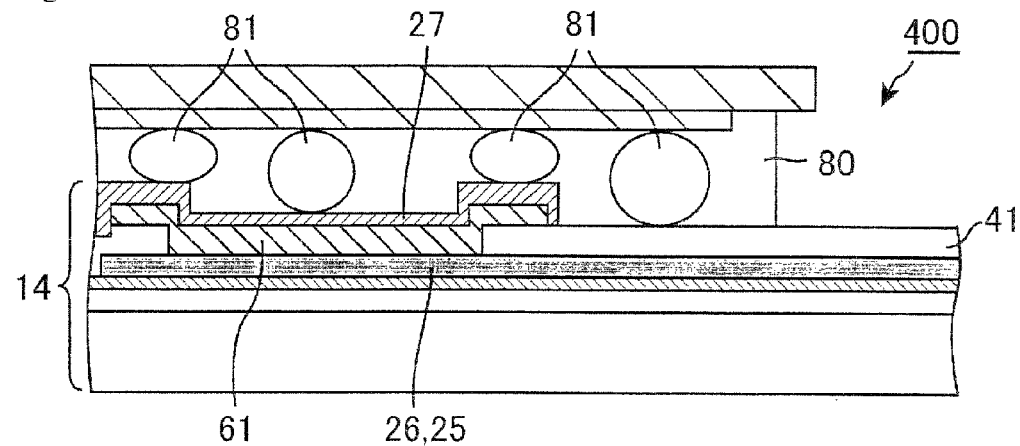
FIG. 26 is a cross-sectional schematic diagram of a terminal area in a variation of the liquid crystal display device of Embodiment 6.

FIG. 26 is a cross-sectional schematic diagram of a terminal area in a variation of the liquid crystal display device of Embodiment 6.

In the TFT substrate 14, as illustrated in FIG. 26, the connection terminal (external connection terminal) 26 comprising the same layer as the gate electrode (gate wiring) 25 may extend up to the terminal area, and the TFT substrate 14 may have the pad 27 comprising the first wiring layer 61 and a transparent conductive film such as an ITO film. As a result, the inorganic insulating film 41 can function as a protective film, even if the inorganic insulating film 41a is not provided at the terminal area, and the same effects as in the case illustrated in FIG. 24 can be elicited.

The liquid crystal display device 400 of the present Embodiment may have the same configuration as the liquid crystal display device 300 of Embodiment 5 illustrated in FIG. 20, except that now the organic insulating film 51b is removed at the terminal area. Specifically, the TFT substrate 14 of the present Embodiment may have a structure wherein, at the terminal area, the inorganic insulating film 41 has sequentially stacked thereon, from the side of the insulating substrate 21, routing wiring 30e comprising the first wiring layer 61, the inorganic insulating film 41a and the organic insulating film 51a functioning as an interlayer insulating film and a planarizing film, the connection terminal (external connection terminal) 26 comprising the second wiring layer 62, and the inorganic insulating film 41b functioning as a protective film. The above structure allows also enhancing the contact performance of the ACF, as in the case illustrated in FIG. 24. In this configuration, the organic insulating film 51a may be a planarizing film (inorganic planarizing film) comprising an inorganic insulating film. A film formed of a Si—H-containing polysiloxane (MSQ) material, or a porous silica film, may be employed in this case. The liquid crystal display device 400 of the present Embodiment may have a planarizing film-inorganic film stack in which the inorganic insulating film is stacked directly on the planarizing film.

An embodiment is explained in more detail below in which the organic insulating film is etched before formation of the inorganic insulating film in the display devices of Embodiments 1 to 6. Although the embodiment described below is explained based on an example of the peripheral circuit region, the embodiment is not particularly limited to the peripheral circuit region, and may be applied to the terminal area and the pixel region.

Figure 27:
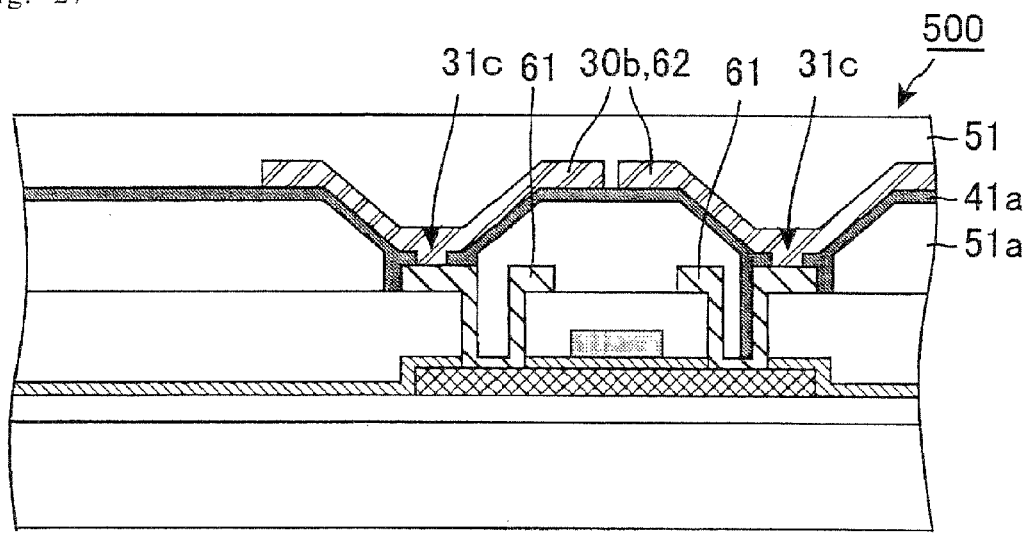
FIG. 27 is a cross-sectional schematic diagram of a peripheral circuit region in the liquid crystal display devices according to Embodiments 1 to 6.

FIG. 27 is a cross-sectional schematic diagram of a peripheral circuit region in the liquid crystal display devices according to Embodiments 1 to 6. FIGS. 28-1(a) to 28-1(d) and FIGS. 28-2(e) to 28-2(g) are cross-sectional schematic diagrams of the peripheral circuit region in the liquid crystal display devices according to Embodiments 1 to 6 in a manufacturing process. Recurrent subject matter common to Embodiment 3 to 6 will not be explained again.

In a case where an organic insulating film and an inorganic insulating film are stacked and the resulting stack is then dry-etched to form thereby contact holes, as in the manufacturing method illustrated in Embodiment 3, the film thickness of the organic insulating film is for instance 2 μm or greater, and the aspect ratio of the contact holes formed in the stack of the organic insulating film and the inorganic insulating film is high, as a result of which contact between higher and lower wiring layers may become difficult. In the inner wall of the contact holes, the organic insulating film becomes uncovered during dry etching and resist ashing. Therefore, as described above, the organic insulating film may become damaged during etching and resist ashing, as described above.

By contrast, the liquid crystal display device 500 of the present Embodiment is manufactured in accordance with the below-described method, in which a photosensitive resin film is used as the material of the organic insulating film 51a and/or the organic insulating film 51.

Figures 1A, 28:
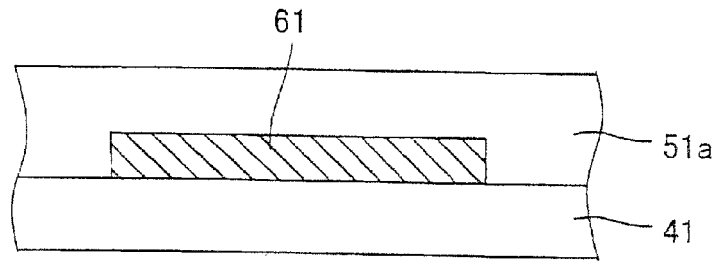
FIGS. 28-1(a) to 28-1(d) are cross-sectional schematic diagrams of the peripheral circuit region in the liquid crystal display devices according to Embodiments 1 to 6 in a manufacturing process.

Firstly, the process of Embodiment 3 is carried out up to the first wiring layer formation step (10). Next, as illustrated in FIG. 28-1(a), the organic insulating film 51a is formed by forming (applying) a photosensitive resin such as a photosensitive acrylic resin film by spin coating or the like, on the entire surface of the insulating substrate, in accordance with the same method as in Embodiment 3. The first wiring layer 61 becomes coated as a result by the organic insulating film 51a, and the surface of the TFT substrate is olanarized.

Figures 1B, 28:
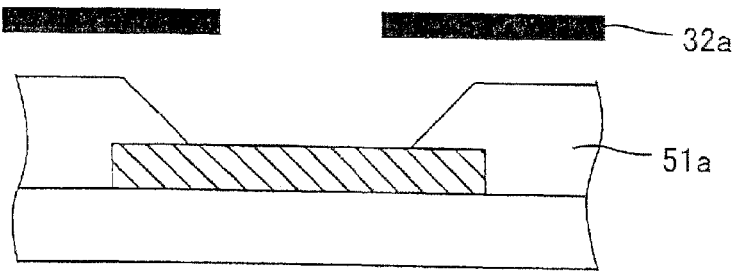

Next, the organic insulating film 51a is photoetched. As illustrated in FIG. 28-1(b), specifically, the organic insulating film 51c is exposed to light through a photomask 32a having a light-shielding pattern of desired shape formed therein, and is then etched (developed) to remove thereby a region of the organic insulating film 51a that yields the contact hole 31c.

Figures 1C, 28:
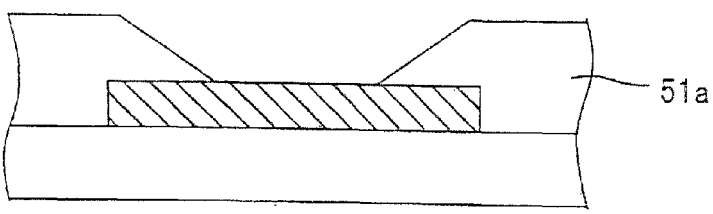

Next, the organic insulating film 51a (photosensitive resin film) is subjected to a baking step (about 200° C., 30 minutes). Thereby, the shape of the opening (hole portion) of the organic insulating film 51a becomes less steep, as illustrated in FIG. 28-1(c), and the aspect ratio of the contact hole 31c can be reduced.

Figures 1D, 28:
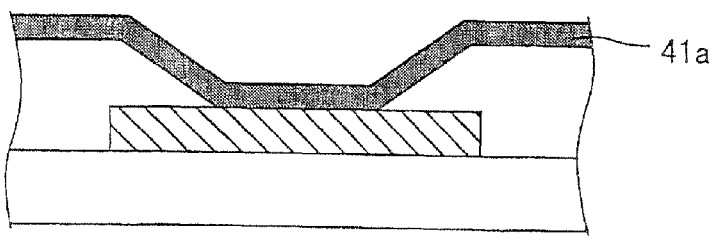

Next, the inorganic insulating film 41a (SiNx film or SiO$_2$ film) is formed by sputtering, PECVD or the like, on the entire surface of the insulating substrate, as illustrated in FIG. 28-1(d), in the same way as in the method of Embodiment 3. Taking into account, for instance, the influence of contamination in the chamber, the inorganic insulating film 41a is preferably formed by sputtering, which enables film formation at a low substrate temperature. The quality of the inorganic insulating film 41a can be enhanced thereby, since a high-temperature treatment may cause organic components to scatter, which in turn may impair film performance and result in chamber contamination.

Next, a pattern is formed in the resist by photolithography. Specifically, the resist 33a is exposed to light through a photomask 32*b* that is different from the photomask 32*a*, and is then developed to remove thereby a region of the resist 33*a* that yields the contact hole 31*c*, as illustrated in FIG. 28-2(*e*).

Next, as illustrated in FIG. 28-2(*f*), the contact hole 31*c* is formed by etching the inorganic insulating film 41*a* by dry-etching with carbon tetrafluoride ($CF_4$) or the like, or by wet-etching with hydrofluoric acid (HF) or the like, using the resist 33*a* as a mask, in such a manner that the wall surface of the opening of the organic insulating film 51*a* is completely covered by the inorganic insulating film 41*a* and that the opening of the inorganic insulating film 41*a* overlaps the removed region of the organic insulating film 51*a*.

Next, as illustrated in FIG. 28-2(*g*), the resist 33*a* is ashed by O2 plasma in the case of dry-etching using the inorganic insulating film 41*a* as a stopper; in the case of wet etching, the resist 33*a* is stripped with a stripping solution using the inorganic insulating film 41*a* as a stopper material.

Thereafter, as illustrated in FIG. 27, the liquid crystal display device 500 of the present Embodiment is completed by carrying out the steps from the second wiring layer formation step (13) onwards in the same manner as in Embodiment 3.

Since a photosensitive resin is used as the material of the organic insulating film 51*a*, an ashing (stripping) step upon initial removal of the contact section of the organic insulating film 51*a* (portion that yields the contact hole 31*c*) becomes unnecessary. As a result, as illustrated in FIG. 27, the contact section (opening) of the organic insulating film 51*a* formed by photoetching is finished to a gently sloping shape, as compared with the case in which the contact section is formed by a dry process. Therefore, the aspect ratio of the contact hole 31*c* can be reduced, and occurrence of connection faults in the second wiring layer 62 stacked thereon can be effectively suppressed.

The entire organic insulating film 51*a* including the inner wall portion (wall surface) of the contact section is covered by the inorganic insulating film 41*a* in the subsequent inorganic insulating film formation step. Therefore, the organic insulating film 51*a* can be protected from damage caused subsequently during etching of the inorganic insulating film 41*a*.

For instance, dry etching, which enables more precise microfabrication than photoetching, can be used to etch the inorganic insulating film 41*a* that is stacked after photoetching of the organic insulating film 51*a*. Therefore, this method also enables microfabrication of the contact hole 31*c* and microfabrication of the lower-layer first wiring layer 61.

The photosensitive resin is used as the material of the organic insulating film 51*a*. In a case where the present Embodiment is applied to Embodiment 4, therefore, the organic insulating film can be removed easily at the terminal area, which does not require precise microfabrication, before stacking of the inorganic insulating film 41*a*.

Figure 29:
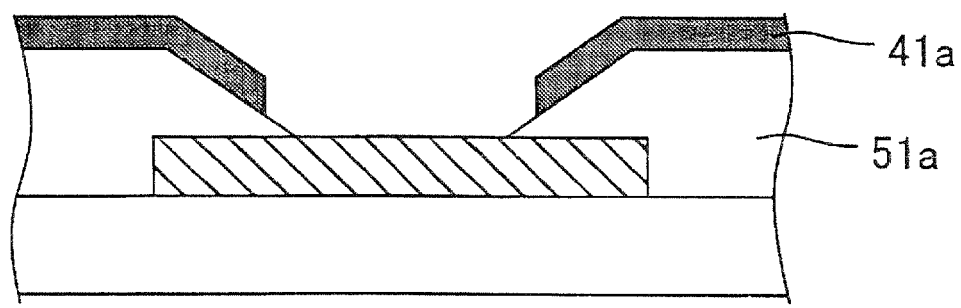
FIG. 29 is a cross-sectional schematic diagram of another form of the peripheral circuit region illustrated in FIG. 28-2(g)

FIG. 29 is a cross-sectional schematic diagram of another form of the peripheral circuit region illustrated in FIG. 28-2(*g*). In case that the inorganic insulating film 41*a* is wet-etched, part of the wall surface of the opening of the organic insulating film 51*a*, on the side of a lower layer, may be uncovered, as illustrated in FIG. 29, by causing the opening of the inorganic insulating film 41*a* to be greater than the opening of the organic insulating film 51*a*. Therefore, the organic insulating film 51*a* can be prevented as a result from being damaged by ashing or dry etching.

In this case, the contact hole may be by through forming, photoetching and baking the organic insulating film 51*a* and forming the inorganic insulating film 41*a*, in accordance with the above-mentioned method (FIGS. 28-1(*a*) to 28-1(*d*)); forming a pattern in the resist using a photomask that is different from the photomask 32*a*; and etching next the inorganic insulating film 41*a* by wet-etching with hydrofluoric acid (HF) or the like, using the resist as a mask, in such a manner that a lower portion of the wall surface of the opening of the organic insulating film 51*a*, on a lower-layer side, is uncovered. Lastly, the resist is stripped using a stripping solution.

Figures 1A, 30:
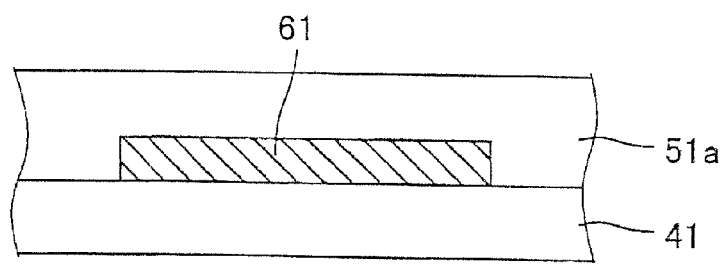
Figures 1B, 30:
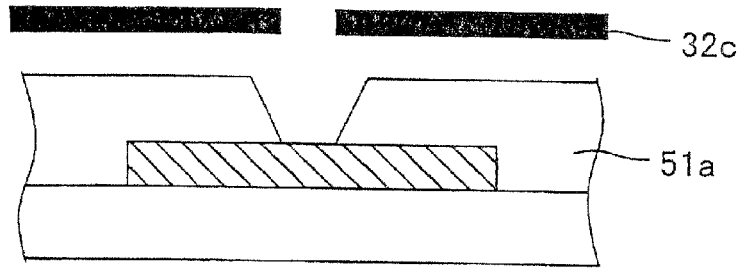
Figures 1C, 30:
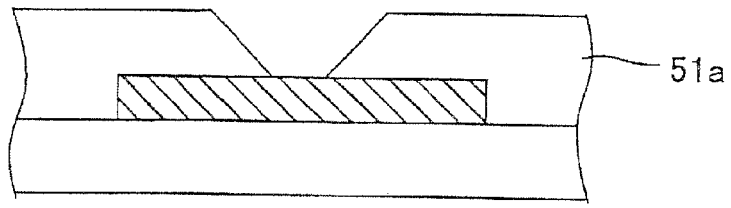
Figures 1D, 30:
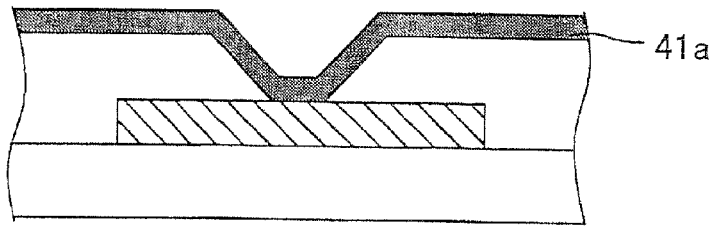
Figures 2E, 30:
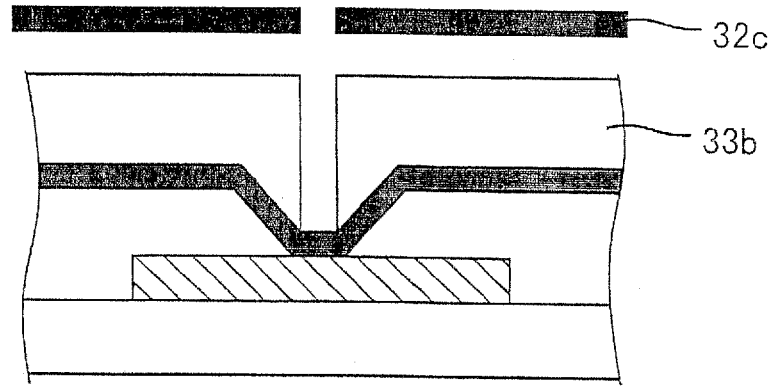
Figures 2F, 30:
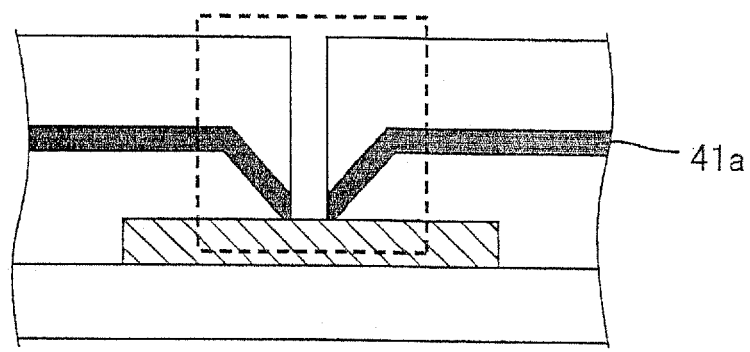
Figures 2G, 30:
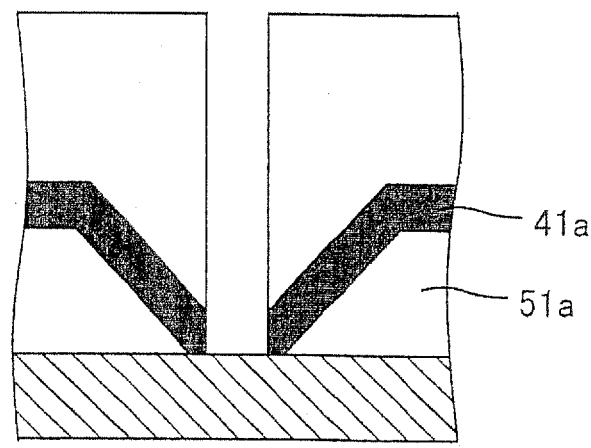

Variations of the present Embodiment are explained next. FIGS. 30-1(*a*) to 30-1(*d*) and FIGS. 30-2(*e*) to 30-2(*h*) are cross-sectional schematic diagrams of the peripheral circuit region in a vibration of the liquid crystal display devices according to Embodiments 1 to 6 in a manufacturing process.

In the present variation, firstly, the process of Embodiment 3 is carried out up to the first wiring layer formation step (10). Next, as illustrated in FIG. 30-1(*a*), the organic insulating film 51*a* is formed by forming (applying) a photosensitive resin such as a photosensitive acrylic resin film, by spin coating or the like, on the entire surface of the insulating, substrate, in accordance with the same method as in Embodiment 3. The first wiring layer 61 becomes coated as a result by the organic insulating film 51*a*, and the surface of the TFT substrate is planarized.

Next, the organic insulating film 51*a* is photoetched. Specifically, as illustrated in FIG. 30-1(*b*), the organic insulating film 51*a* is exposed to light through a photomask 32*c* having formed therein a light-shielding pattern of desired shape, and is then developed to remove thereby a region of the organic insulating film 51*a* that yields the contact hole 31*c*. The organic insulating film 51*a* is overexposed in such a manner that the opening (contact section) in the organic insulating film 51*a* is larger than the opening (contact section) in the inorganic insulating film 41*a* described below.

Next, the organic insulating film 51*a* (photosensitive resin film) is subjected to a baking step (about 200° C., 30 minutes). Thereby, the shape of the opening of the organic insulating film 51*a* becomes less steep, as illustrated in FIG. 30-1(*c*), and the aspect ratio of the contact hole 31*c* can be reduced.

Next, the inorganic insulating film 41*a* ($SiN_x$ film or $SiC_2$ film) is formed by sputtering, PECVD or the like, on the entire surface of the insulating substrate as illustrated in FIG. 30-1(*d*), in the same way as in the method of Embodiment 3. Taking into account, for instance, the influence of contamination in the chamber, the inorganic insulating film 41*a* is preferably formed by sputtering, which enables film formation at a low substrate temperature. The quality of the inorganic insulating film 41*a* can be enhanced thereby, since a high-temperature treatment may cause organic components to scatter, which in turn may impair film performance and result in chamber contamination.

Next, a pattern is formed in the resist by photolithography. Specifically, the resist 33*b* is exposed to light through the photomask 32*c* that is used during light exposure of the organic insulating film 51*a*, and is then developed to remove thereby a region of the resist 33*b* that yields the contact hole 31*c*, as illustrated in FIG. 30-2(*e*). In this case, the resist 33*b* is exposed at ordinary exposure energy, in such a manner that the opening of the inorganic insulating film 41*a* is smaller than the opening of the organic insulating film 51*a*.

Next, as illustrated in FIG. 30-2(*f*), the contact hole 31*c* is formed by etching the inorganic insulating film 41*a* by dry-etching with carbon tetrafluoride ($CF_4$) or the like, or by wet-etching with hydrofluoric acid (HF) or the like, using the resist 33b as a mask, in such a manner that the etched portion overlaps the region at which the organic insulating film 51a is removed. The organic insulating film 51a can be protected from damage during the above-described etching and the below-described ashing since the organic insulating film 51a is coated with the inorganic insulating film 41a, as illustrated in FIG. 30-2(g), which is an enlarged view of the area surrounded by the dotted line in FIG. 30-2(f). For instance dry-etching, which enables more precise microfabrication than photoetching, can be used to etch the inorganic insulating film 41a. Therefore, this method also enables microfabrication of the contact hole 31c and microfabrication of the lower-layer first wiring layer 61.

Figures 2H, 30:
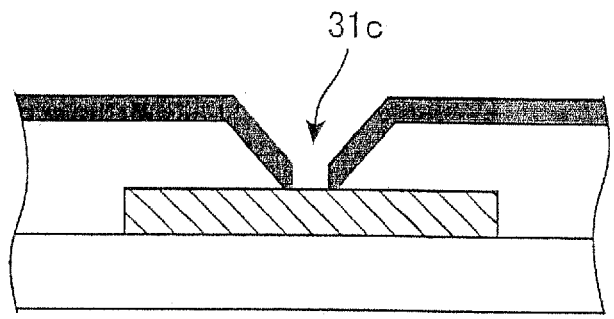

Next, as illustrated in FIG. 30-2(h), the resist 33b is ashed by O2 plasma in the case of dry-etching using the inorganic insulating film 41a as a stopper. In the case of wet etching, the resist 33b is stripped with a stripping solution, using the inorganic insulating film 41a as a stopper material.

In the present variation, thus, the number of required photomasks can be reduced by one, and manufacturing costs reduced accordingly, since the same photomask 32c is used during light exposure of the organic insulating film 51a and of the resist 33b. At the same time, there can be suppressed the occurrence of positional mismatch in the opening of the organic insulating film 51a and the inorganic insulating film 41a, which can arise owing to a difference in state between two photomasks.

FIGS. 31-1(a) to 31-1(c) and FIGS. 31-2(d) to 31-2(f) are cross-sectional schematic diagrams of the peripheral circuit region in a variation of the liquid crystal display devices according to Embodiments 1 to 6 in a manufacturing process.

Figures 1A, 31:
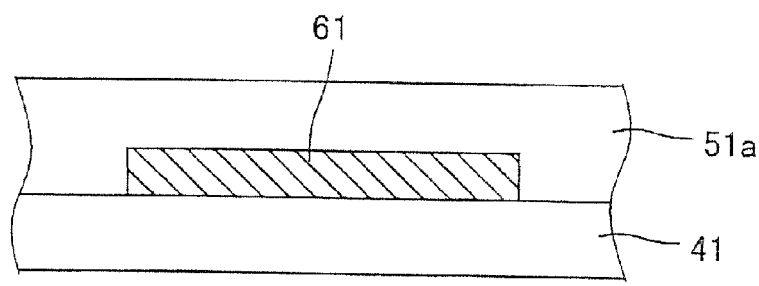
Figures 1B, 31:
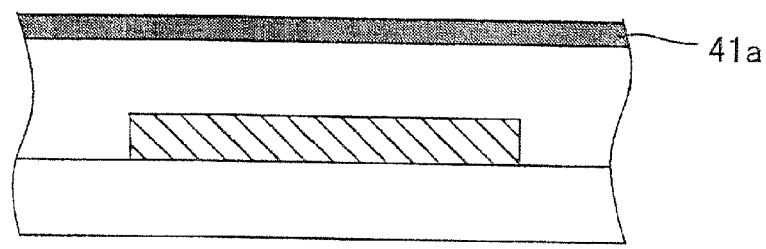
Figures 1C, 31:
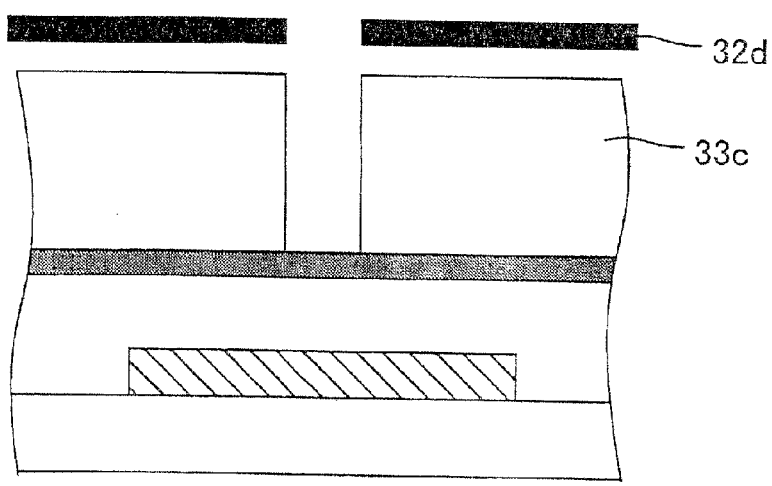
Figures 2D, 31:
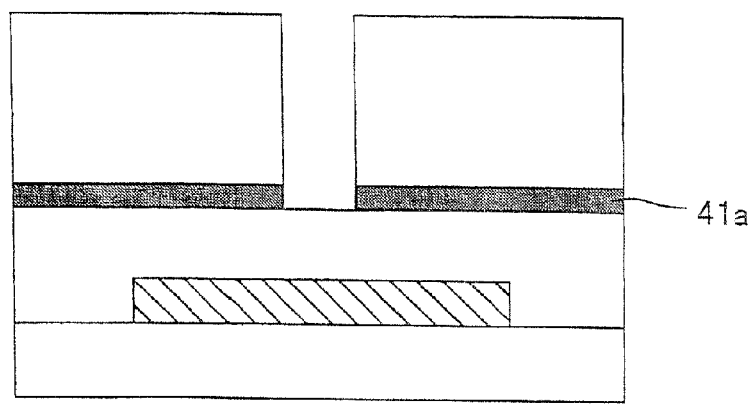
Figures 2E, 31:
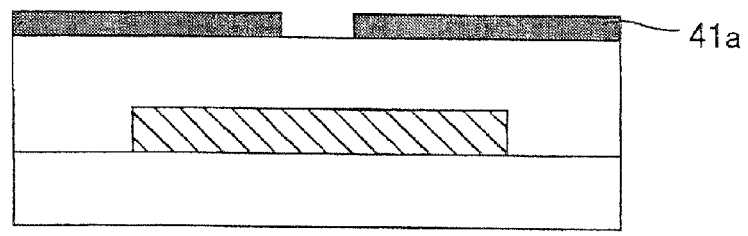
Figures 2F, 31:
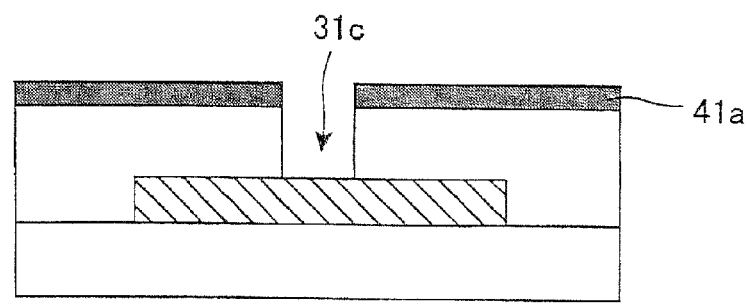

In the present variation, firstly, the process of Embodiment 3 is carried out up to the first wiring layer formation step (10). Next, as illustrated in FIG. 31-1(a), the organic insulating film 51a is formed by forming (applying) a photosensitive resin such as a photosensitive acrylic resin film, by spin coating or the like, on the entire surface of the insulating substrate, in accordance with the same method as in Embodiment 3. The first wiring layer 61 becomes coated as a result by the organic insulating film 51a, and the surface of the TFT substrate is planarized.

Next, as the case may require, the organic insulating film 51a is exposed to light, followed by a baking step (about 200° C., 30 minutes). In the present Comparative Example, the organic insulating film 51a may be a photosensitive resin, or a non-photosensitive resin.

Next, the inorganic insulating film 41a (SiNx film or SiO$_2$ film) is formed by sputtering, PECVD or the like, on the entire surface of the insulating substrate, as illustrated in FIG. 31-1(b), in the same way as in the method of Embodiment 3. Taking into account, for instance, the influence of contamination in the chamber, the inorganic insulating film 41a is preferably formed by sputtering, which enables film formation at a low substrate temperature. The quality of the inorganic insulating film 41a can be enhanced thereby, since a high-temperature treatment may cause organic components to scatter, which in turn may impair film performance and result in chamber contamination.

Next, a pattern is formed in the resist by photolithography. Specifically, the resist 33c is exposed to light through a photomask 32d and is then developed to remove thereby a region of the resist 33c that yields the contact hole 31c, as illustrated FIG. 31-1(c).

Next, as shown in FIG. 31-2 (d), a region of the inorganic insulating film 41a that yields the contact hole 31c is removed by wet-etching with hydrofluoric acid (HF) or the like, using the resist 33c as a mask.

Figures 2E, 28:
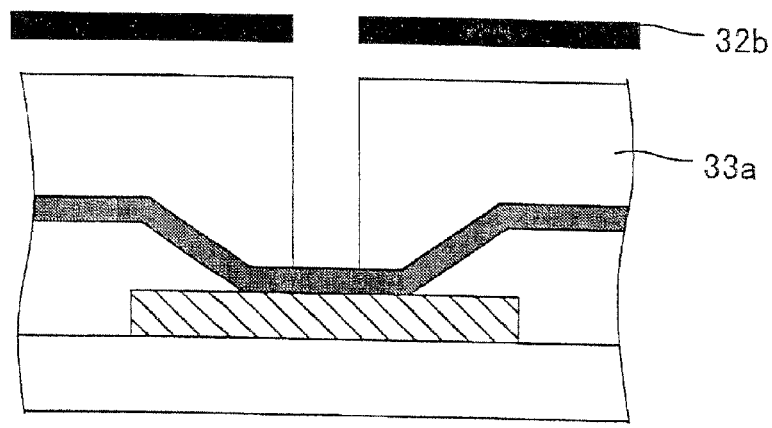

Next, the resist 33c is striped with a stripping solution, using the inorganic insulating film 41a as a stopper material, as illustrated in FIG. 31-2(e).

Figures 2F, 28:
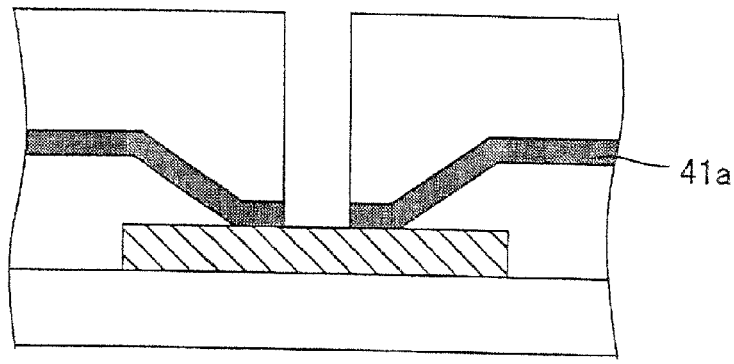
Figures 2G, 28:
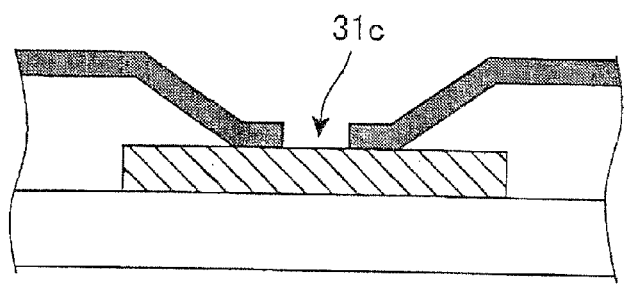

Next, as illustrated in FIG. 31-2(f), the contact hole 31c is formed by etching the organic insulating film 51a by dry-etching, with O$_2$ plasma or the like, using the inorganic insulating film 41a as a mask.

In the present variation, thus, the inorganic insulating film 41a is etched by wet etching. Hence, no ashing is required, and the resist 33c can be stripped with a stripping solution. Therefore, the wall surface of the opening of the organic insulating film 51a, which is uncovered in the contact hole 31c, is not damaged by ashing.

Figure 32A:
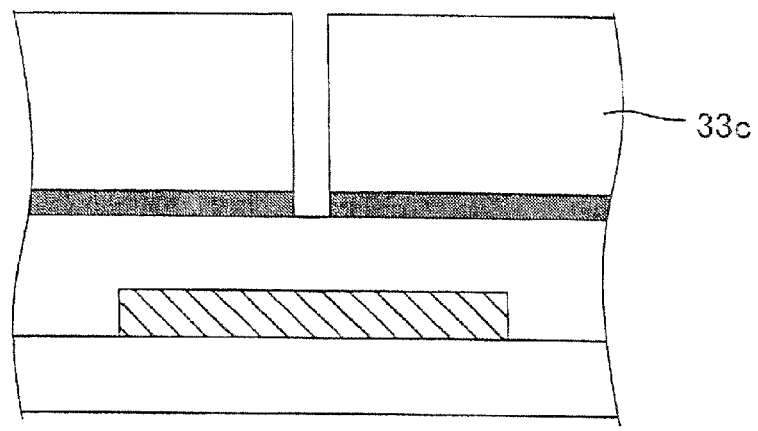
FIGS. 32(a) and 32(b) are cross-sectional schematic diagrams of the peripheral circuit region in a variation of the liquid crystal display devices according to Embodiments 1 to 6 in a manufacturing process.
Figure 32B:
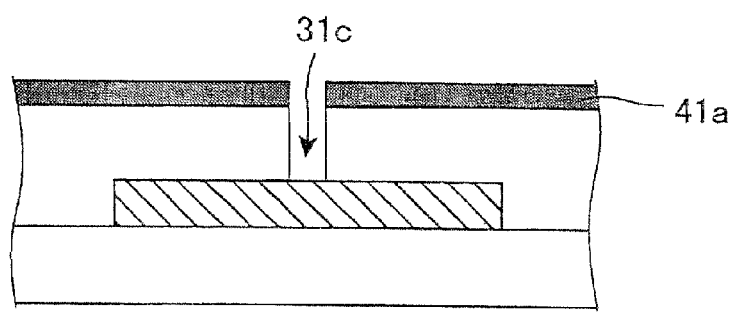

FIGS. 32(a) and 32(b) are cross-sectional schematic diagrams of the peripheral circuit region in a variation of the liquid crystal display devices according to Embodiments 1 to 6 in a manufacturing process.

In the present variation, firstly, processes are performed in the same manner as in the above-described variation, up to the step of patterning the resist 33c, as illustrated in FIG. 31-1(c).

Next, as illustrated in FIG. 32(a), a region that yields the contact hole 31c in the inorganic insulating film 41a is removed by dry-etching with carbon tetrafluoride (CF$_4$) or the like, using the resist 33c as a mask. The contact hole 31c can be microfabricated thus by dry etching.

Next, as illustrated in FIG. 32(b), the contact hole 31c is formed by ashing the resist 33b and etching the organic insulating film 51a, through dry-etching, with O$_2$ plasma or the like, using the inorganic insulating film 41a as a stopper.

In the present variation, thus, the step of removing (ashing) the resist 33b and the step of etching (opening) the organic insulating film 51a are performed simultaneously. Doing so allows reducing damage to the organic insulating film 51a caused by dry-etching.

In the present Embodiment, the organic insulating film 51a and/or the organic insulating film 51 may be planarizing films (inorganic planarizing films) comprising an inorganic insulating film. Films formed of a Si—H-containing polysiloxane (MSQ) material, or a porous silica film, may be employed in this case. The liquid crystal display device 500 of the present Embodiment may have thus a planarizing film-inorganic film stack in which the inorganic insulating film is stacked directly on the planarizing film.

The present invention has been explained on the basis of Embodiments 1 to 6 and other embodiments. However, the embodiments can be suitably combined with each other without departing from the scope of the present invention. For instance, the display device substrate of the present invention may lack the peripheral circuit region, so that the organic-inorganic film stack is provided just at the terminal area. Alternatively, the display device substrate of the present invention may have the organic-inorganic film stack only at the peripheral circuit region, but not at the terminal area, or may have the pixel region set forth in Embodiment 1 or 2, or the terminal area and/or peripheral circuit region set forth in any of Embodiments 3 to 6.

In Embodiments 3 to 6 and other embodiments, the present invention has been explained based on examples of a liquid crystal display device, but embodiments explained from Embodiment 3 onwards can also be used in display devices other than liquid crystal display devices, for instance in organic EL displays or the like.

Comparative Embodiment 1

Figure 33:
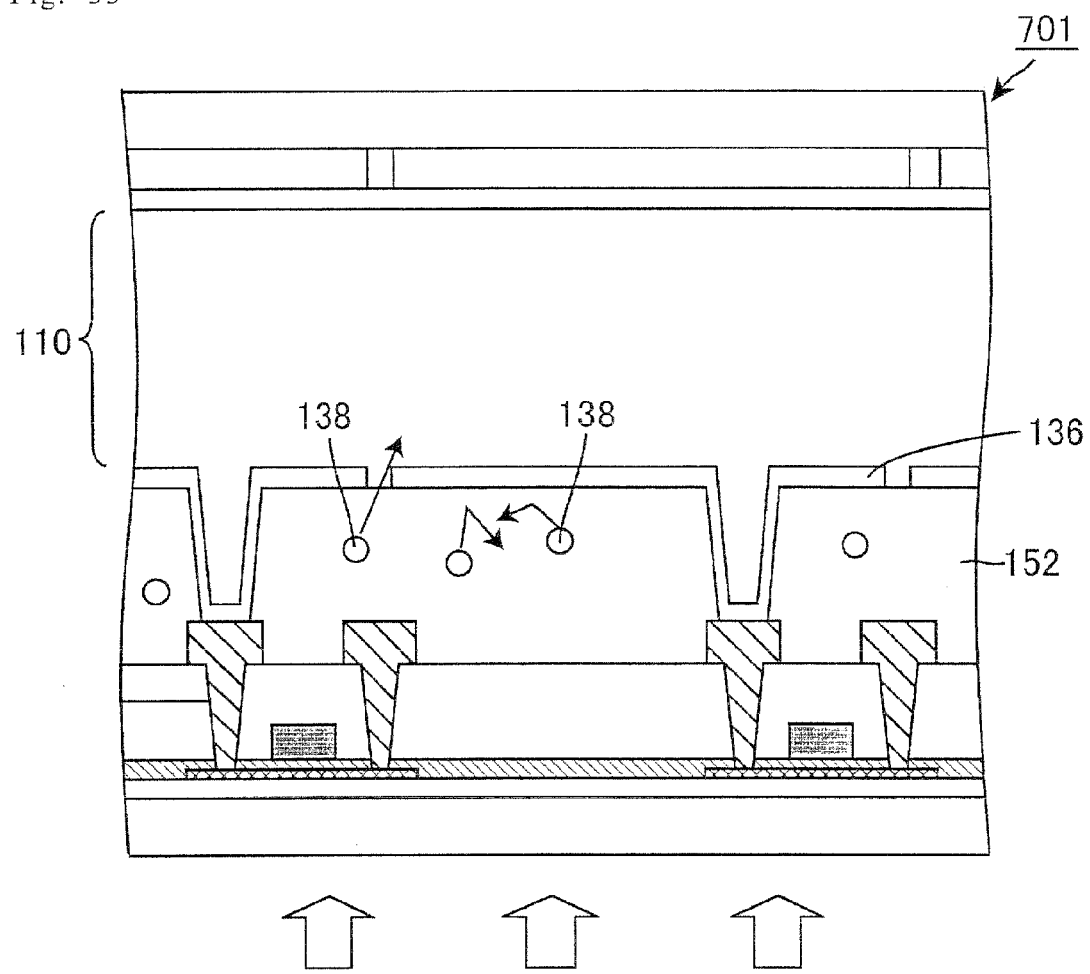
FIG. 33 is a cross-sectional schematic diagram of a pixel region in a liquid crystal display device of Comparative Embodiment 1.

FIG. 33 is a cross-sectional schematic diagram of a pixel region in a liquid crystal display device of Comparative Embodiment 1. A liquid crystal display device 701 of the present Comparative Embodiment has the same configuration as the liquid crystal display device 700 of Embodiment 1, except that now no gas-barrier insulating film is provided.

In the liquid crystal display device 701 of the present Comparative Embodiment, gas 138 may be generated by a photosensitive resin film 152 under pixel electrodes 136 when UV light (blanked arrows in FIG. 33) is irradiated onto the photosensitive resin film 152. Thereupon, the gas 138 may escape through gaps between adjacent pixel electrodes 136 and penetrate into a liquid crystal layer 110, as illustrated in FIG. 33. As a result, faults can occur due to formation of bubbles.

Comparative Embodiment 2

Figure 34:
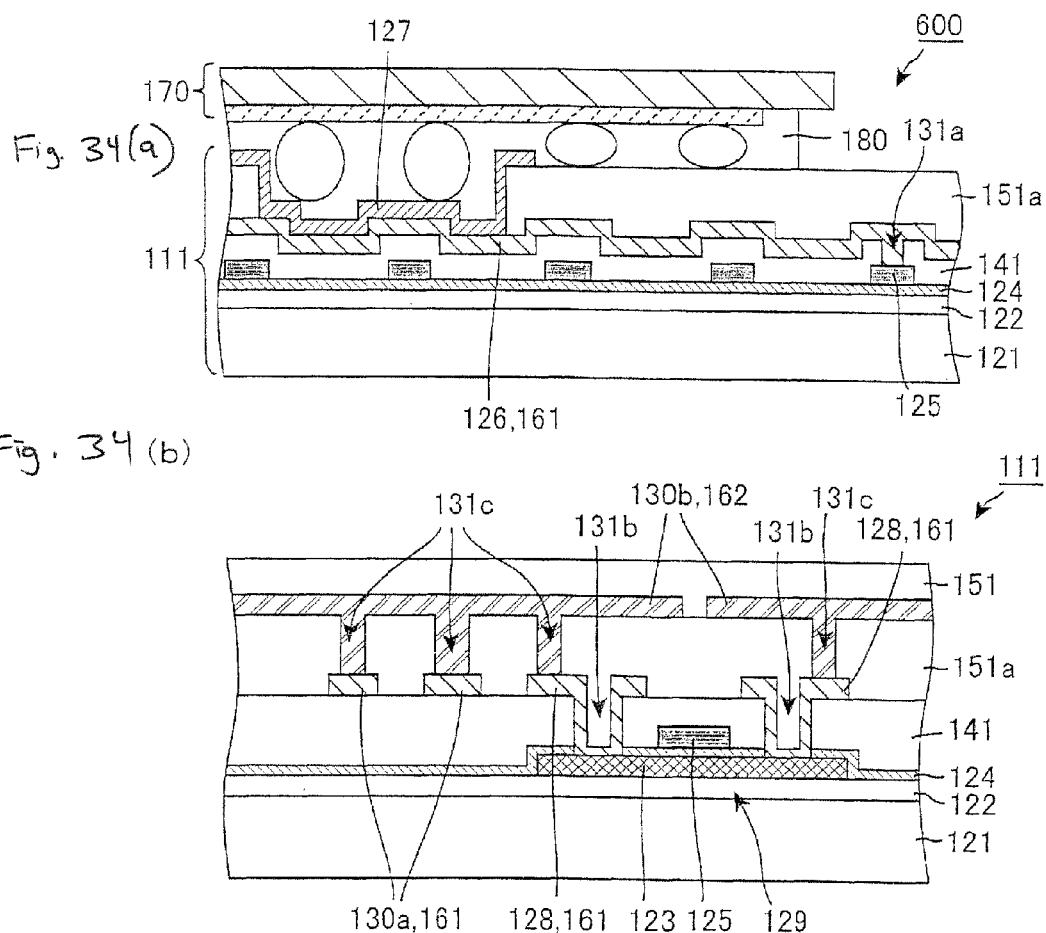
Figure 35:
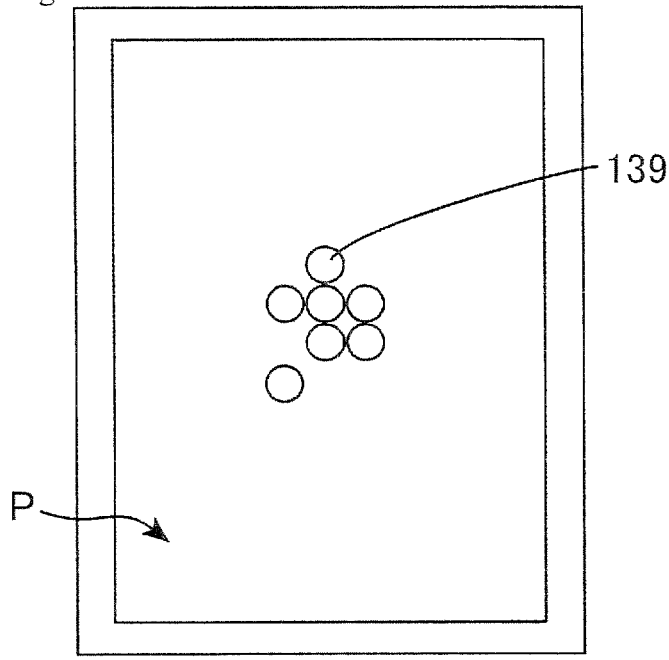
FIG. 35 is a plan-view schematic diagram illustrating a conventional PSA mode liquid crystal display panel.
Figure 36:
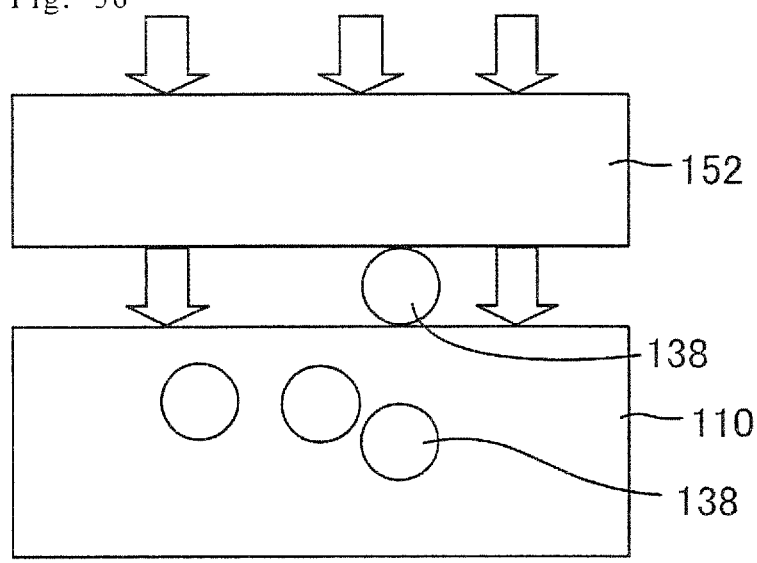
FIG. 36 is a cross-sectional schematic diagram illustrating a conventional PSA mode liquid crystal display panel.

FIG. 34 is a cross-sectional schematic diagram of a pixel region in a liquid crystal display device of Comparative Embodiment 2, wherein FIG. 34(a) illustrates a terminal area, and FIG. 34(b) illustrates a peripheral circuit region. A liquid crystal display device 600 of Comparative Embodiment 2 has a structure wherein a TFT substrate 111, being a display device substrate, and an FPC board 170 are connected to each other, at a terminal area, by way of an ACF 180, as illustrated in FIG. 34(a).

As illustrated in FIG. 34(a), the TFT substrate 111 has a structure wherein, at a terminal area, an insulating substrate 121 has sequentially stacked thereon, from the side of the insulating substrate 121, a base coat film 122, a gate insulator 124, a gate electrode 125, an inorganic insulating film 141 functioning as an interlayer insulating film, a connection terminal (external connection terminal) 126 comprising a first wiring layer 161, and an organic insulating film 151a functioning as a protective film. A pad 127 is provided at an end portion of the connection terminal 126.

As illustrated in FIG. 34(b), the TFT substrate 111 has a structure wherein, at the peripheral circuit region, the insulating substrate 121 has formed thereon, from the side of the insulating substrate 121, the base coat film 122, the semiconductor layer 123, the gate insulator 124, the gate electrode 125, the inorganic insulating film 141 functioning as an interlayer insulating film, routing wiring 130a and source/drain electrodes 128 comprising the first wiring layer 161, the organic insulating film 151a functioning as an interlayer insulating film, routing wiring 130b comprising a second wiring layer 162, and an organic insulating film 151 functioning as a protective film.

Using the organic insulating film 151a having excellent planarity, as a planarizing film, has the effect of reducing level differences in the first wiring layer 161 and the TFT 129, on a lower-layer side, and of preventing short circuits in the second wiring layer 162, even though the second wiring layer 162 is routed on a higher-layer side.

However, when using not a method that employs photoetching, which requires no resist mask, but a method such as dry etching in which a resist mask is employed, having high microfabrication precision, as illustrated in FIG. 34(b), as a method of forming the contact hole (via hole) 131c in the organic insulating film 151a, there is a chance that etching is not performed appropriately on account of lack of selectivity between the resist mask and the organic insulating film 151a in the resist mask ashing (stripping) step. That is because both the resist mask and the organic insulating film 151a are organic films, and hence the selectivity of both is roughly similar. Specifically, the resist mask may become ashed away down into the organic insulating film 151a. Also, even if only the resist mask is ashed, the organic insulating film 151a may be damaged by ashing, so that the second wiring layer 162 to be formed on the organic insulating film 151a fails to be fully deposited, which can give rise to connection faults between the first wiring layer 161 and the second wiring layer 162. In the present Comparative Embodiment, therefore, the organic insulating film 151a is formed using a photosensitive resin, and the contact holes 131c are formed without using a resist mask. Also, the second wiring layer 162 is patterned by a wet process directly on the organic insulating film 151a. The present Comparative Embodiment, thus, leaves room for improvement in terms of enabling wiring microfabrication and suppressing the occurrence of connection faults between higher- and lower-layer wiring. The same problems occur when using an inorganic planarizing film instead of the organic insulating film 151a.

In a case where the uppermost layer is the organic insulating film 151a, as illustrated in FIG. 34(a), the organic insulating film 151a may delaminate or be damaged should rework be necessary during the step of connecting the panel and the FPC board 170, since, for instance, the organic insulating film 151a is an organic film, and has lower mechanical strength, in terms of, for instance, peel strength and hardness (becomes damaged more readily under external pressure) than inorganic films. Also, the wiring under the organic insulating film 151a may become uncovered. Corrosion due to moisture or the like, as well as connection faults in the FPC board 170 derived from gas in the uncovered organic insulating film 151a, may occur as a result. The above configuration leaves thus room for improvement in terms of reliability. The organic insulating film 151a could conceivably be removed only from the terminal area, and the first wiring layer 161 be disposed at the uppermost layer, but in that case as well, the reliability of the first wiring layer 161 would be impaired through the influence of external moisture.

The present application claims priority under the Paris Convention and the laws of transient countries based on Japanese Patent Application No. 2008-257681 filed on Oct. 2, 2008. The entirety of the content of the file is integrated into this application as reference.

EXPLANATION OF REFERENCE NUMERALS

10: liquid crystal layer
11, 12, 13, 14, 15, 16: TFT substrate
21: insulating substrate
22: base coat film
23: semiconductor layer
24: gate insulator
25: gate electrode (gate wiring)
26: connection terminal (external connection terminal)
27: pad
28: source/drain electrode
29: TFT
30a, 30b, 30c, 30d, 30e: routing wiring
31a, 31b, 31c, 31d, 31e, 31f, 31g, 31h, 31i, 31j: contact hole
32a, 32b, 32c, 32d: photomask
33a, 33b, 33c: resist
34: source electrode
35: drain electrode
36: pixel electrode
37: alignment film
38: gas
39: sealing material (sealing region)
41, 41a, 41b, 41c: inorganic insulating film 51, 51a, 51b: organic insulating film
52: photosensitive resin film
61: first wiring layer
62: second wiring layer
63: third wiring layer
65: drain wiring
66a, 66b: storage capacitor upper electrode
67: storage capacitor lower electrode
68a, 68b: pixel storage capacitor
69: nearest lower wiring layer
70: FPC board
71: connection terminal
72: sealing substrate
73: partition
74: EL film
75: upper electrode
76: UV-curable adhesive
80: ACF
81: conductive microparticles
90: CF substrate
91: insulating substrate
92: black matrix
93: color filter
94: common electrode
95: alignment film
100, 200, 300, 400, 500, 700: liquid crystal display device
800: organic EL display

The invention claimed is:

1. An organic electroluminescent display device, comprising:
   an insulating substrate;
   a photosensitive resin film and an electrode provided on the insulating substrate in this order; and
   an insulating film provided between the photosensitive resin film and the electrode,
   wherein the photosensitive resin film is covered by at least one of the electrode and the insulating film in a pixel region,
   the insulating film overlaps an outer edge portion of the electrode and includes a first opening on the electrode in the pixel region,
   the insulating film comprising an inorganic insulating film,
   the organic electroluminescent display device further comprising a gate wiring provided under the photosensitive resin film, an interlayer insulating film provided on the gate wiring, a first conductive layer provided on the interlayer insulating film, and a second conductive layer provided on the insulating film,
   the insulating film and the photosensitive resin film provided with a first contact hole in a terminal area in a frame region, and wherein a side face of the first contact hole is covered by the second conductive layer,
   wherein a void of the first contact hole, the first conductive layer, and the second conductive layer overlap each other, and the first conductive layer being electrically connected to the second conductive layer, and
   wherein the gate wiring is electrically connected to the first conductive layer through a second contact hole in the interlayer insulating film, whereby the gate wiring is electrically connected to the second conductive layer.

2. The organic electroluminescent display device according to claim 1, wherein the photosensitive resin film has a second opening, and the second opening of the photosensitive resin film is covered by the electrode.

3. The organic electroluminescent display device according to claim 1, wherein the insulating film comprises a silicon nitride film.

4. The organic electroluminescent display device according to claim 1, wherein the electrode is an anode, and a partition is provided on the anode.

5. The organic electroluminescent display device according to claim 4, wherein a third opening is formed in the partition, and an organic film comprising an emissive layer is provided in the third opening of the partition.

6. The organic electroluminescent display device according to claim 4, wherein a fourth opening is formed in the anode, and the fourth opening of the anode corresponds to the boundary of a pixel and is covered by the partition.

7. The organic electroluminescent display device according to claim 1, wherein the insulating substrate is a first resin substrate.

8. The organic electroluminescent display device according to claim 7, wherein the organic electroluminescent display device has a second resin substrate affixed to the first resin substrate by way of a photocurable adhesive.

9. An organic electroluminescent display device, comprising:
   an insulating substrate;
   a photosensitive resin film and an electrode provided on the insulating substrate in this order; and
   an insulating film provided between the photosensitive resin film and the electrode,
   wherein in a pixel region, the photosensitive resin film has a first region which is not covered by the electrode but covered by the insulating film, and a second region which is covered by the electrode and the insulating film,
   the electrode is an anode,
   a partition is provided on the anode,
   a first opening is formed in the partition,
   an organic film comprising an emissive layer is provided in the first opening of the partition,
   the insulating film comprising an inorganic insulating film, and wherein the photosensitive resin film has a second opening,
   an entirety of a wall surface of the second opening in the photosensitive resin film is covered by the inorganic insulating film in the pixel region,
   the organic electroluminescent display device further comprising a gate wiring provided under the photosensitive resin film, an interlayer insulating film provided on the gate wiring, a first conductive layer provided on the interlayer insulating film, a second conductive layer provided on the insulating film, another photosensitive resin film provided on the second conductive layer, another insulating film provided on the another photosensitive resin film, and a third conductive layer provided on the another insulating film,
   the insulating film and the photosensitive resin film are provided with a first contact hole, and a side face of the first contact hole is covered by the second conductive layer,
   wherein a void of the first contact hole, the first conductive layer, and the second conductive layer overlap each other, and wherein the first conductive layer is electrically connected to the second conductive layer,
   wherein the another insulating film and the another photosensitive resin film are provided with a second contact hole in a terminal area in a frame region, and a side face of the second contact hole is covered by the third conductive layer, and wherein a void of the second contact hole, the second conductive layer, and the third conductive layer overlap each other, and the second conductive layer is electrically connected to the third conductive layer, whereby the first conductive layer is electrically connected to the third conductive layer.

10. The organic electroluminescent display device according to claim 9, wherein the organic electroluminescent display device has wiring provided at a layer higher than the inorganic insulating film, and the second opening of the photosensitive resin film is covered by the wiring.

11. The organic electroluminescent display device according to claim 9, wherein at least part of a higher-layer side of a wall surface of the second opening of the photosensitive resin film is covered by the inorganic insulating film.

12. The organic electroluminescent display device according to claim 9, wherein the insulating film has a third opening, and at least part of the third opening of the insulating film is covered by the electrode.

13. The organic electroluminescent display device according to claim 9, wherein a fourth opening is formed in the anode, and the fourth opening of the anode corresponds to the boundary of a pixel and is covered by the partition.

14. The organic electroluminescent display device according to claim 9, wherein the insulating film comprises a silicon nitride film.

15. The organic electroluminescent display device according to claim 9, wherein the insulating substrate is a first resin substrate.

16. The organic electroluminescent display device according to claim 15, wherein the organic electroluminescent display device has a second resin substrate affixed to the first resin substrate by way of a photocurable adhesive.

17. The organic electroluminescent display device according to claim 1, wherein the organic electroluminescent display device further comprises another photosensitive resin film provided on the insulating film and another insulating film provided on the above other photosensitive resin film,
   the second conductive layer is formed on the above other insulating film,
   the insulating film, the photosensitive resin film, the above other insulating film, and the above other photosensitive resin film are provided with a third contact hole in the terminal area in the frame region, and a side face of the third contact hole is covered by the second conductive layer, and
   the void of the third contact hole, the first conductive layer, and the second conductive layer overlap each other, and the first conductive layer is electrically connected to the second conductive layer.

18. The organic electroluminescent display device according to claim 1, wherein the organic electroluminescent display device further comprises another photosensitive resin film provided on the insulating film and another insulating film provided on the above other photosensitive resin film,
   the second conductive layer is formed on the above other insulating film,
   another conductive layer is formed between the insulating film and the above other photosensitive resin film,
   the insulating film and the photosensitive resin film are provided with a third contact hole in the terminal area in the frame region, and a side face of the third contact hole is covered by the above other conductive layer,
   the above other insulating film and the above other photosensitive resin film are provided with a fourth contact hole, and a side face of the fourth contact hole is covered by the above other conductive layer, and
   the void of each of the third and fourth contact holes, the first conductive layer, the above other conductive layer, and the second conductive layer overlap each other, and the first conductive layer is electrically connected to the second conductive layer.

19. The organic electroluminescent display device according to claim 9, wherein the side face of the first contact hole is covered by the insulating film, and the side face of the second contact hole is covered by the above other insulating film.

20. An organic electroluminescent display device, comprising: an insulating substrate; a photosensitive resin film and an electrode provided on the insulating substrate in this order; and an insulating film provided between the photosensitive resin film and the electrode, wherein the photosensitive resin film is covered by at least one of the electrode and the insulating film, the insulating film overlaps an outer edge portion of the electrode and includes a first opening on the electrode, the organic electroluminescent display device comprises, as the electrode, pixel electrodes that are provided spaced apart from each other, and the insulating film is selectively provided at gaps between the pixel electrodes the insulating film comprising an inorganic insulating film, the organic electroluminescent display device further comprising a gate wiring provided under the photosensitive resin film, an interlayer insulating film provided on the gate wiring, a first conductive layer provided on the interlayer insulating film, and a second conductive layer provided on the insulating film, the insulating film and the photosensitive resin film provided with a first contact hole in a terminal area in a frame region, and wherein a side face of the first contact hole is covered by the second conductive layer, wherein a void of the first contact hole, the first conductive layer, and the second conductive layer overlap each other, and the first conductive layer being electrically connected to the second conductive layer, and wherein the gate wiring is electrically connected to the first conductive layer through a second contact hole in the interlayer insulating film, whereby the gate wiring is electrically connected to the second conductive layer.

* * * * *